(12) United States Patent
Hirikiri

(10) Patent No.: US 11,791,151 B2
(45) Date of Patent: Oct. 17, 2023

(54) STRUCTURE PRODUCTION WET ETCH METHOD AND STRUCTURE PRODUCTION APPARATUS

(71) Applicant: SUMITOMO CHEMICAL COMPANY, LIMITED, Tokyo (JP)

(72) Inventor: Fumimasa Hirikiri, Hitachi (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 0 days.

(21) Appl. No.: 17/668,024

(22) Filed: Feb. 9, 2022

(65) Prior Publication Data
US 2022/0172943 A1 Jun. 2, 2022

Related U.S. Application Data

(63) Continuation of application No. 17/286,198, filed as application No. PCT/JP2019/040820 on Oct. 17, 2019, now Pat. No. 11,289,322.

(30) Foreign Application Priority Data

Oct. 18, 2018 (JP) .................... 2018-196971
Jul. 29, 2019 (JP) .................... 2019-138913

(51) Int. Cl.
*H01L 21/02* (2006.01)
*H01L 21/306* (2006.01)
(Continued)

(52) U.S. Cl.
CPC .. *H01L 21/02019* (2013.01); *H01L 21/30604* (2013.01); *H01L 21/67086* (2013.01); *H01S 5/0239* (2021.01)

(58) Field of Classification Search
CPC ......... H01L 21/02019; H01L 21/30604; H01L 21/67086; H01L 21/0242; H01L 21/02458;
(Continued)

(56) References Cited

U.S. PATENT DOCUMENTS 7,985,637 B2 7/2011 Okamoto
2006/0154391 A1 7/2006 Tran et al.
(Continued)

FOREIGN PATENT DOCUMENTS

JP 2003-068703 A 3/2003
JP 2003-100699 A 4/2003
(Continued)

OTHER PUBLICATIONS

Faraz et al., "Atomic Layer Etching: What CanWe Learn from Atomic Layer Deposition?" ECS Journal of Solid State Science and Technology, vol. 4, No. 6, 2015, pp. N5023-N5032.
(Continued)

*Primary Examiner* — John P. Dulka
(74) *Attorney, Agent, or Firm* — Foley & Lardner LLP

(57) ABSTRACT

A process of preparing a wafer having a diameter of two inches or more, at least a surface of the wafer being formed from a group III nitride crystal, including preparing an alkaline or acidic etching liquid containing a peroxodisulfate ion as an oxidizing agent that accepts an electron, accommodating the wafer such that the surface of the wafer is immersed in the etching liquid such that the surface of the wafer is parallel with a surface of the etching liquid; and radiating light from the surface side of the etching liquid onto the surface of the wafer without agitating the etching liquid. First and second etching areas disposed at an interval from each other are defined on the surface of the wafer. In the process of radiating the light onto the surface of the
(Continued)

wafer, the light is radiated perpendicularly onto surfaces of the first and second etching areas.

5 Claims, 24 Drawing Sheets

(51) Int. Cl.
*H01L 21/67* (2006.01)
*H01S 5/0239* (2021.01)

(58) Field of Classification Search
CPC .......... H01L 21/0254; H01L 21/02579; H01L 21/0262; H01L 21/02639; H01L 21/02642; H01L 21/67069; H01L 21/67109; H01L 21/67225; H01L 21/67248; H01L 29/4236; H01L 29/78; H01L 33/0075; H01L 21/30621; H01L 21/30635; H01L 21/3081; H01L 21/67075; H01L 21/67103; H01L 21/67213; H01L 29/2003; H01S 5/0239; C30B 25/18; C30B 29/38; C30B 33/08

See application file for complete search history.

(56) References Cited

U.S. PATENT DOCUMENTS

| | | | |
|---|---|---|---|
| 2009/0061576 A1* | 3/2009 | Okamoto | H01L 29/66462 257/E21.403 |
| 2009/0315055 A1 | 12/2009 | Tamboli et al. | |
| 2014/0167059 A1 | 6/2014 | Hsu et al. | |
| 2019/0330484 A1 | 10/2019 | Kojima | |

FOREIGN PATENT DOCUMENTS

| | | |
|---|---|---|
| JP | 2003-158113 A | 5/2003 |
| JP | 2003-163198 A | 6/2003 |
| JP | 2004-079799 A | 3/2004 |
| JP | 2006-140426 A | 6/2006 |
| JP | 2007-305748 A | 11/2007 |
| JP | 2008-527717 A | 7/2008 |
| JP | 2010-113171 A | 5/2010 |
| JP | 2011-520296 A | 7/2011 |
| JP | 2015-532009 A | 11/2015 |
| JP | 2016-119359 A | 6/2016 |
| WO | WO-2006/051641 A1 | 5/2006 |
| WO | WO-2007/105281 A1 | 9/2007 |
| WO | WO-2018/131333 A1 | 7/2018 |

OTHER PUBLICATIONS

Murata et al., "Photo-electrochemical etching of free-standing GaN wafer surfaces grown by hydride vapor phase epitaxy," Electrochimica Acta, vol. 171, 2015, pp. 89-95.

Samukawa, Seiji, "Ultimate Top-down Etching Processes for Future Nanoscale Devices: Advanced Neutral-Beam Etching," Japanese Journal of Applied Physics, vol. 45, No. 4A, 2006, pp. 2395-2407.

International Searching Authority, "International Search Report," issued in connection with International Patent Application No. PCT/JP2019/040820, dated Nov. 12, 2019.

International Searching Authority, "Written Opinion," issued in connection with International Patent Application No. PCT/JP2019/040820, dated Nov. 12, 2019.

International Preliminary Report on Patentability and Written Opinion issued in connection with International Patent Application No. PCT/JP2019/040820, dated Apr. 14, 2021.

Japanese Patent Office, "Decision to Grant a Patent," issued in connection with Japanese Patent Application No. 2019-213157, dated Dec. 8, 2020.

Al-Heuseen et al., "Stress Relaxation in Porous GaN Prepared by UV Assisted Electrochemical Etching," IOP Conf. Series: Materials Science and Engineering, vol. 305, 2018, pp. 1-8.

* cited by examiner

100

$V_{etch}$=3V, 4μm-etch $V_{etch}$=2V, 4μm-etch $V_{etch}$=1V, 4μm-etch $V_{etch}$=3V, 2μm-etch $V_{etch}$=2V, 2μm-etch $V_{etch}$=1V, 2μm-etch $V_{etch}$=0V, 2μm-etch

STRUCTURE PRODUCTION WET ETCH METHOD AND STRUCTURE PRODUCTION APPARATUS

CROSS-REFERENCE TO RELATED APPLICATIONS

The present application is a Continuation of U.S. patent application Ser. No. 17/286,198, filed on Apr. 16, 2021, which claims priority under 37 U.S.C. § 371 to International Patent Application No. PCT/JP2019/050452, filed Dec. 24, 2019, which claims priority to and the benefit of Japanese Patent Application No. 2018-242924, filed on Dec. 26, 2018. The contents of these applications are hereby incorporated by reference in their entireties.

TECHNICAL FIELD

The present invention relates to a structure production method and structure production apparatus.

DESCRIPTION OF RELATED ART

Group III nitrides such as gallium nitride (GaN) are used as a material for producing semiconductor devices such as light-emitting elements and transistors, and are also attracting attention as a material for micro-electro-mechanical systems (MEMS).

Etching that involves anodic oxidation (also referred to as "photo-electrochemical (PEC) etching" below) is being proposed as a technique to etch group III nitrides such as GaN (see, for example, non-Patent Document 1). PEC etching is preferable because it is a type of wet etching that causes less damage compared to ordinary dry etching and also because the device used in the etching is more simple compared to special dry etching techniques that are designed to cause less damage, such as neutral-beam etching (see, for example, non-Patent Document 2) and atomic layer etching (see, for example, non-Patent Document 3). Much is still unknown, however, about what ways group III nitrides such as GaN can be processed using PEC etching.

There have been no studies conducted on problems related to when a technique for producing a structure by carrying out PEC etching on a group III nitride is implemented on a mass-production scale. For example, there have been no studies conducted on a technique for enhancing etching in-plane uniformity in PEC etching performed on a wafer having a large diameter (e.g. a diameter of two inches or more). To cite another example, there have been no studies conducted on a technique for performing PEC etching while limiting variations in etching conditions in terms of time.

Non-patent Document 1: J. Murata et al., "Photo-electrochemical etching of free-standing GaN wafer surfaces grown by hydride vapor phase epitaxy", Electrochimica Acta 171 (2015) 89-95.

Non-Patent Document 2: S. Samukawa, JJAP, 45(2006) 2395.

Non-Patent Document 3: T. Faraz, ECS J. Solid Stat. Scie. & Technol., 4, N5023 (2015)).

One objective of the present invention is to provide a technique that makes it possible to enhance etching in-plane uniformity in PEC etching performed on a wafer, at least the surface of which is formed from a group III nitride crystal and which has a large diameter of, for example, two inches or more.

SUMMARY OF THE INVENTION

An aspect of the present invention provides a structure production method including
a process of preparing a wafer having a diameter of two inches or more, at least a surface of the wafer being formed from a group III nitride crystal,
a process of preparing an alkaline or acidic etching liquid in a container, the etching liquid containing a peroxodisulfate ion as an oxidizing agent that accepts an electron,
a process of accommodating the wafer in the container in a condition in which the surface of the wafer is immersed in the etching liquid in a manner such that the surface of the wafer is parallel with a surface of the etching liquid, and
a process of radiating light from the surface side of the etching liquid onto the surface of the wafer without agitating the etching liquid,
wherein
a first etching area and a second etching area are defined on the surface of the wafer, the first and second etching areas being disposed at an interval from each other, the first and second etching areas being areas where the group III nitride crystal is to be etched due to the surface of the wafer being irradiated with the light in a condition in which the surface is immersed in the etching liquid, and
in the process of radiating the light onto the surface of the wafer, the light is radiated perpendicularly onto each of a surface of the first etching area and a surface of the second etching area.

Another aspect of the present invention provides a structure production apparatus including
a container configured to accommodate a wafer and an alkaline or acidic etching liquid, the wafer having a diameter of two inches or more, at least a surface of the wafer being formed from a group III nitride crystal, the etching liquid containing a peroxodisulfate ion as an oxidizing agent that accepts an electron, and
a light irradiation device configured to radiate light from a surface side of the etching liquid onto the surface of the wafer,
wherein
the container accommodates the wafer inside the container in a condition in which the surface of the wafer is immersed in the etching liquid in a manner such that the surface of the wafer is parallel with the surface of the etching liquid, and retains the etching liquid in a manner such that the light is radiated onto the surface of the wafer in a condition in which the etching liquid is not agitated, and
the light irradiation device radiates the light perpendicularly onto a surface of each of a first etching area and a second etching area, the first and second etching areas being defined on the surface of the wafer, the first and second etching areas being disposed at an interval from each other, the first and second etching areas being areas where the group III nitride crystal is to be etched due to the surface of the wafer being irradiated with the light in a condition in which the surface is immersed in the etching liquid.

Provided is a technique that makes it possible to enhance etching in-plane uniformity in PEC etching performed on a wafer at least the surface of which is formed from a group III nitride crystal and which has a large diameter of, for example, two inches or more.

DETAILED DESCRIPTION OF THE INVENTION

A gallium nitride (GaN) material 100 according to an embodiment of the present invention will be described. Also will be described etching that involves anodic oxidation (also referred to as "photo-electrochemical (PEC) etching" below) and that is to be performed on the GaN material 100. PEC etching can be used as a method for processing the GaN material 100 and also as a method for evaluating a characteristic of the GaN material 100.

First Embodiment

Figure 1A:
FIGS. 1A through 1G are schematic sectional diagrams illustrating a method for producing a GaN material (substrate) according to a first embodiment of the present invention.

A first embodiment will be described first. The first embodiment illustrates a GaN substrate 10 (also referred to as "substrate 10" below) as an example of the GaN material 100. FIGS. 1A through 1G are schematic sectional diagrams illustrating the process of producing the substrate 10 using a void-assisted separation (VAS) method. First, an underlying substrate 1 is prepared, as illustrated in FIG. 1A. A sapphire substrate is illustrated as an example of the underlying substrate 1.

Figure 1B:

Next, an underlying layer 2 is formed on the underlying substrate 1, as illustrated in FIG. 1B. The underlying layer 2 may be constituted by, for example, a stack including a buffer layer constituted by low temperature-grown GaN and a single crystal layer of GaN. The buffer layer and the single crystal layer may be formed by, for example, metalorganic vapor phase epitaxy (MOVPE). Trimethyl gallium (TMG) may be used as an example of gallium (Ga) raw material and ammonia ($NH_3$) may be used as an example of nitrogen (N) raw material. The thicknesses of the buffer layer and the single crystal layer may respectively be, for example, 20 nm and 0.5 μm.

Figure 1C:
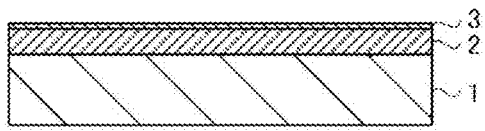

Next, a metal layer 3 is formed on the underlying layer 2, as illustrated in FIG. 1C. The metal layer 3 may be formed by, for example, vapor deposition of titanium (Ti) in an amount of a thickness of 20 nm.

Figure 1D:
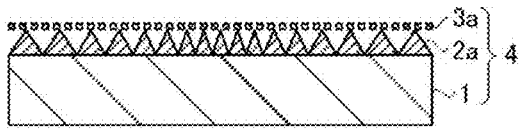

Next, heat treatment is carried out to nitride the metal layer 3 so as to form a nanomask 3a and to form voids in the underlying layer 2 so as to form a void-including layer 2a, as illustrated in FIG. 1D. The heat treatment may be carried out in the following way, for example. The underlying substrate 1 on which the underlying layer 2 and the metal layer 3 have been formed is put in an electric furnace and placed on a susceptor having a heater. The underlying substrate 1 is then heated in an atmosphere containing hydrogen gas ($H_2$ gas) or hydride gas. Specifically, heat treatment may be carried out, for example, for 20 minutes in an $H_2$ gas flow containing 20% of $NH_3$ gas as nitrided gas and at a prescribed temperature, for example, a temperature between 850° C. and 1,100° C. (inclusive).

Nitridation of the metal layer 3 due to such heat treatment results in the formation of a nanomask 3a, the surface of which has highly densely formed fine pores. Part of the underlying layer 2 is etched through the fine pores of the nanomask 3a, resulting in the formation of voids in the underlying layer 2 and thus in the formation of the void-including layer 2a. In this way, a substrate 4 in which voids are formed ("void-formed substrate 4" below) is produced that includes the void-including layer 2a and the nanomask 3a formed on the underlying substrate 1.

Preferably, the heat treatment is carried out in the following way. The heat treatment is carried out such that the "void formation rate (volume porosity)" indicative of the proportion in volume of the voids in the void-including layer 2a is uniform on the underlying substrate 1 in the circumferential direction. Specifically, the susceptor on which the underlying substrate 1 is placed may be rotated, for example, so as to carry out heat treatment uniformly in the circumferential direction. It is also possible to, for example, adjust the degree to which the heater heats the face of the underlying substrate 1, thereby making the temperature distribution in the epitaxial substrate uniform in the circumferential direction. Furthermore, the heat treatment is carried out such that the void formation rate in the void-including layer 2a increases steadily from the center of the underlying substrate 1 toward the outer circumference thereof in the radial direction. Specifically, the degree to which the heater heats the face of the underlying substrate 1 may be adjusted, for example, so that the temperature of the underlying substrate 1 increases monotonically from the center of the underlying substrate 1 toward the outer circumference thereof in the radial direction.

Figure 1E:
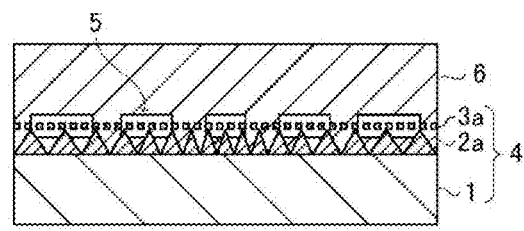
Figure 2:
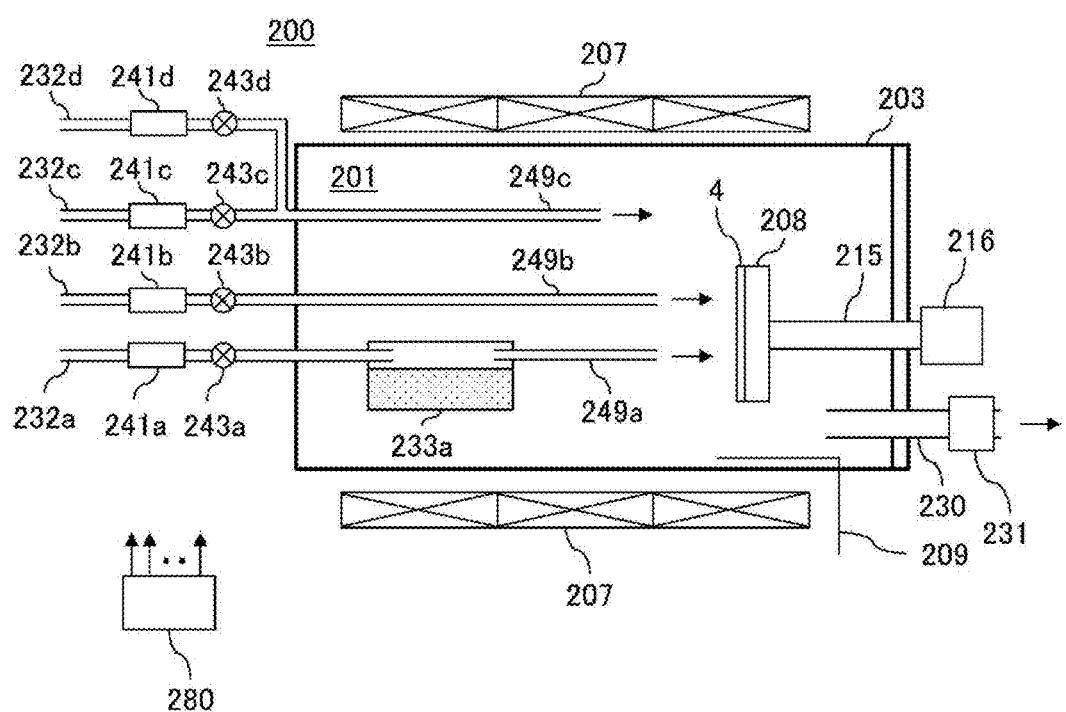
FIG. 2 is a schematic structural diagram illustrating an example of an HVPE device.

Next, a crystal 6 is grown on the nanomask 3a of the void-formed substrate 4, as illustrated in FIG. 1E. The crystal 6 is grown by a gas phase method, specifically by a hydride vapor phase epitaxy (HVPE) method. In this regard, an HYPE device 200 will be now described. FIG. 2 is a schematic structural diagram illustrating an example of the HVPE device 200.

The HVPE device 200 is formed from a heat-resistant material, such as quartz, and includes a hermetic container 203, the interior of which is provided with a film formation chamber 201. A susceptor 208 serving to hold the void-formed substrate 4 subject to treatment is provided inside the film formation chamber 201. The susceptor 208 is connected to a rotary shaft 215 of a rotary mechanism 216 and is configured to be rotatable. Gas supply tubes 232a through 232c serving to supply hydrochloric acid (HCl) gas, $NH_3$ gas, and nitrogen gas ($N_2$ gas) into the film formation chamber 201 are connected to one end of the hermetic container 203. A gas supply tube 232d serving to supply hydrogen ($H_2$) gas is connected to the gas supply tube 232c. Flow rate control devices 241a through 241d and valves 243a through 243d are provided respectively on the gas supply tubes 232a through 232d in that order from an upstream side. A gas generation device 233a that accommodates a Ga melt as raw material is provided downstream of the gas supply tube 232a. A nozzle 249a is connected to the gas generation device 233a. The nozzle 249a serves to supply gallium chloride (GaCl) gas produced by reaction between HCl gas and the Ga melt toward the void-formed substrate 4 held on the susceptor 208. Nozzles 249b and 249c are connected respectively to the downstream side of the gas supply tubes 232b and 232c. The nozzles 249b and 249c serve to supply the various gases supplied from the gas supply tubes 232b and 232c toward the void-formed substrate 4 held on the susceptor 208. A gas discharge tube 230 serving to discharge the gas inside the film formation chamber 201 is provided on the other end of the hermetic container 203. A pump 231 is provided on the gas discharge tube 230. Zone heaters 207 serving to heat the interior of the gas generation device 233a and the void-formed substrate 4 held on the susceptor 208 to desired temperatures are provided around the outer periphery of the hermetic container 203, and a temperature sensor 209 serving to measure the temperature inside the film formation chamber 201 is provided in the hermetic container 203. The members included in the HVPE device 200 are connected to a controller 280 constituted by a computer and are configured such that the processing procedures and processing conditions described later are controlled by a program that is executed on the controller 280.

The crystal 6 epitaxial processing may, for example, be implemented by the processing procedures below using the HVPE device 200. First, Ga is accommodated in the gas generation device 233a as raw material. The void-formed substrate 4 is placed and held on the susceptor 208. Then, a gas mixture containing $H_2$ gas and $N_2$ gas is supplied into the film formation chamber 201 while the film formation chamber 201 is being heated and gas is being discharged therefrom. In a state where the film formation temperature and the film formation pressure inside the film formation chamber 201 have reached the desired temperature and pressure and the atmosphere inside the film formation chamber 201 has become the desired atmosphere, gas supply from the gas supply tubes 232a and 232b is carried out such that GaCl gas and NH$_3$ gas are supplied to the void-formed substrate 4 as film formation gases.

The processing conditions for the crystal 6 epitaxial processing may be as follows, for example.

Growth temperature Tg: 980° C.-1,100° C., preferably 1,050° C.-1,100° C.

Pressure inside film formation chamber 201: 90-105 kPa, preferably 90-95 kPa

GaCl gas partial pressure: 1.5-15 kPa

NH$_3$ gas partial pressure/GaCl gas partial pressure: 4-20

N$_2$ gas partial pressure/H$_2$ gas partial pressure: 1-20

In the epitaxial processing, the GaN crystal that started to grow from the void-including layer 2a appear on the surface through the fine pores of the nanomask 3a, resulting in the formation of initial nuclei on the nanomask 3a. The growth of the initial nuclei in the thickness direction (vertical direction) as well as the in-plane direction (horizontal direction) and bonding of the same in the plane results in the formation of the crystal 6 constituted by a continuous film formed from a GaN single crystal. In areas where no initial nuclei are formed, voids 5 are formed between the nanomask 3a and the crystal 6 according to the presence of the voids in the void-including layer 2a. Since the void formation rate in the void-including layer 2a is controlled in the aforementioned way, the voids 5 are formed uniformly in the circumferential direction and become larger from the center toward the outside in the radial direction.

In this epitaxial processing, the crystal 6 is grown on the void-formed substrate 4, so the distribution of initial nucleus generation density can be made more uniform compared to the epitaxially lateral overgrowth (ELO) method employing a stripe mask or other such methods in which the distribution of initial nucleus generation density is made non-uniform to create dislocation concentration areas in which local dislocation density is extremely high (for example, 1×10$^7$/cm$^2$ or more). Accordingly, in-plane maximum dislocation density can be limited to a low value (for example, lower than 1×10$^7$/cm$^2$).

Moreover, in the epitaxial processing, GaN crystal growing from the void-including layer 2a appears on the surface through the fine pores of the nanomask 3a more readily toward the center in the radial direction where the void formation rate is lower, thus initial nuclei tend to form earlier toward the center. In other words, GaN crystal growing from the void-including layer 2a appears on the surface through the fine pores of the nanomask 3a less readily toward the outside in the radial direction where the void formation rate is higher, thus initial nuclei tend to form later toward the outside. Accordingly, the growth and boding of the initial nuclei can be made to progress gradually from the center toward the outside in the radial direction, so it is easier to grow the initial nuclei into a larger size. Furthermore, since such growth and bonding of the initial nuclei can be made to progress uniformly in the circumferential direction. As a result, crystal quality such as the in-plane uniformity of the crystal 6 can be enhanced.

Preferably, the crystal 6 grown has a thickness that enables at least one independent substrate 10 to be obtained from the crystal 6, for example, a thickness of 0.2 mm or more. There are no particular limitations on the upper limit of the thickness of the crystal 6 grown.

Figure 1F:
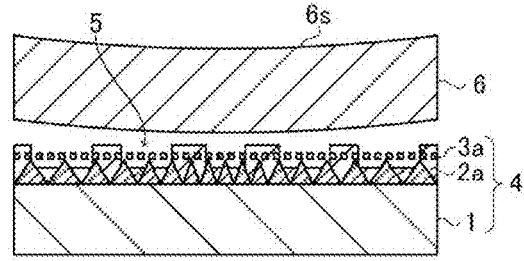

Next, the crystal 6 is peeled off from the void-formed substrate 4, as illustrated in FIG. 1F. This peeling is achieved during growth of the crystal 6 or in the process of cooling the interior of the film formation chamber 201 after completion of the growth of the crystal 6 as a result of the crystal 6 peeling off spontaneously from the void-formed substrate 4; here, the voids 5 formed between the crystal 6 and the nanomask 3a serve as the boundary of peeling.

Force, which is the result of mutual attraction of the initial nuclei bonding together during growth of the crystal 6, occurs in the crystal 6, so the crystal 6 contains tensile stress thereinside. Due to this tensile stress, the crystal 6 having peeled off warps in the manner of the growth-side surface thereof being depressed. Accordingly, the c face of the GaN single crystal constituting the crystal 6 that has peeled off curves in the form of a depressed spherical surface relative to an imaginary plane that is perpendicular to a direction normal to the center of a principal face 6s of the crystal 6. "Spherical surface" as referred to herein means a curved surface that approximates a spherical surface. "Approximates a spherical surface" as referred to herein means approximating the spherical surface of a true circle or an ellipse with an error falling within a prescribed error range.

Since the voids 5 are formed uniformly in the circumferential direction and so as to become larger from the center toward the outside in the radial direction, the crystal 6 can peel off uniformly from the outer circumference toward the center of the void-formed substrate 4 in the circumferential direction. Accordingly, natural peeling that is in conformity with the warping shape of the crystal 6 can be achieved, and therefore, the generation of unwanted stress that result from peeling can be limited. So, in this production method, as described above, crystal growth is carried out employing a VAS method while controlling the void formation rate in the aforementioned way; thus, a crystal 6 with enhanced crystal quality such as in-plane uniformity can be obtained.

After completion of the growth of the crystal 6 having a prescribed thickness, supply of the various gases used for the epitaxial processing is stopped and the atmosphere inside the film formation chamber 201 is substituted with N$_2$ gas to recover the atmospheric pressure. The void-formed substrate 4 and the crystal 6 are drawn out of the film formation chamber 201 after the temperature inside the film formation chamber 201 has been lowered to a temperature at which such draw-out work is possible.

Figure 1G:
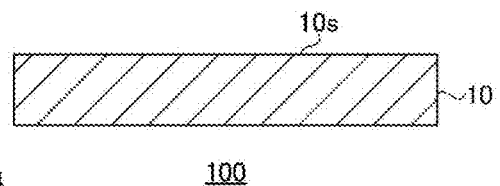

Next, the crystal 6 is machined (for example, cut with a wire saw) and rubbed, as appropriate, to obtain one or more substrates 10 from the crystal 6, as illustrated in FIG. 1G. The crystal face with a low index closest to the principal face 10s of the substrate 10 illustrated in FIG. 1G as an example is the c face.

The substrate 10 is produced in the aforementioned way. In addition to having a maximum dislocation density limited to be lower than 1×10$^7$/cm$^2$ (i.e. having no areas where the dislocation density reaches or exceeds 1×10$^7$/cm$^2$), the substrate 10 has high in-plane uniformity. The following describes an example of a specific condition that represents a "limited" dislocation density of the substrate 10. In the principal face 10s of the substrate 10, measurement is carried out using the cathodoluminescence (CL) method by scanning a 500 μm-diameter observation area within a 3 mm-square measurement area. The measurement is carried out on more or less ten such observation areas. At this time, the maximum dislocation density is lower than 1×10$^7$/cm$^2$, and in a preferred example, 5×10$^6$/cm$^2$ or lower. Preferably, an average dislocation density is 3×10$^6$/cm$^2$ or lower, for example. There are no particular limitations on a minimum dislocation density. The ratio of a maximum dislocation density to a minimum dislocation density may increase in conformity with a decrease in a minimum dislocation density, and as a rough standard, may be 100:1 or less, or 10:1 or less, for example.

The inventors of the present invention arrived at the finding that the substrate 10 constituting the GaN material 100 according to the first embodiment is a suitable material to be processed using PEC etching to form a recess with superior internal flatness (i.e. flatness of the internal faces of the recess). The PEC etching and the internal flatness of the formed recess will be described in detail later. The principal face 10s may be used as an example of a face in which such a recess is to be formed using PEC etching (also referred to as an "etching face" below).

Impurities may be added to the substrate 10. If impurities are to be added, a gas supply tube and the like for supplying gas that contains such impurities may be additionally provided in the HVPE device 200 illustrated in FIG. 2. Examples of such impurities include those serving to impart electroconductivity to the substrate 10, and may be n-type impurities, for example. Usable examples of n-type impurities include silicon (Si) and germanium (Ge). If Si is to be added, for example, then dichlorosilane ($SiH_2Cl_2$) may be used as Si raw material, for example. Impurities may also be those serving to impart semi-insulating properties to the substrate 10, for example.

Second Embodiment

Figure 3:
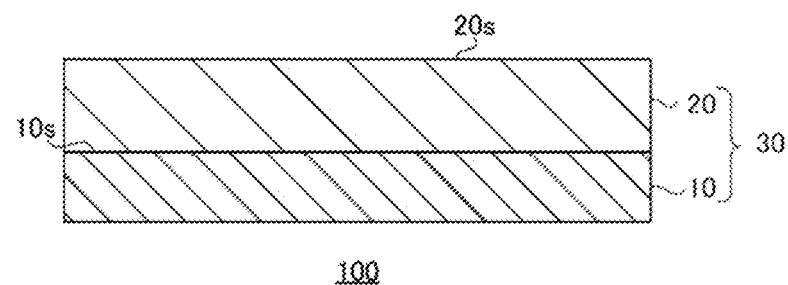
FIG. 3 is a schematic sectional diagram illustrating a GaN material (epitaxial substrate) according to a second embodiment.

Next, a second embodiment will be described. In the second embodiment, a first experimental example will also be described together. In the second embodiment, as illustrated in FIG. 3, a stack 30 (also referred to as an "epitaxial substrate 30" below), which includes a substrate 10 and a GaN layer 20 that is epitaxially grown (also referred to as an "epitaxial layer" below) on the substrate 10, is illustrated as an example of the GaN material 100. For the substrate 10, the substrate 10 described in the first embodiment may be used preferably.

The second embodiment features an example case where n-type impurities are added to both the substrate 10 and the epitaxial layer 20. Although there are no particular limitations on the constitution of the substrate 10 and the epitaxial layer 20, the following illustrates a possible example. In the substrate 10, Si may be added as an example of n-type impurities at a concentration of between $1\times10^{18}/cm^3$ and $1\times10^{19}/cm^3$ (inclusive). In the epitaxial layer 20, Si, for example, may be added at a concentration of between $3\times10^{15}/cm^3$ and $5\times10^{16}/cm^3$ (inclusive). When the epitaxial substrate 30 is to be used as a material for a semiconductor device, the substrate 10 would presumably be used as a contact layer for contact with an electrode and the epitaxial layer 20 would presumably be used as a drift layer, and it is preferred that the concentration of the n-type impurities added to the epitaxial layer 20 be lower than that of the substrate 10 from the view point of an increase in pressure-withstanding performance. Although not particularly limited, the thickness of the substrate 10 may be 400 for example. The thickness of the epitaxial layer 20 may be between 10 μm and 30 μm (inclusive), for example. The epitaxial layer 20 may be constituted by a stack of multiple GaN layers having differing n-type impurity concentrations.

The epitaxial layer 20 may be grown on the principal face 10s of the substrate 10 by MOVPE, for example. TMG may be used as an example of Ga raw material, $NH_3$ may be used as an example of N raw material, and monosilane ($SiH_4$) may be used as an example of Si raw material. The epitaxial layer 20 grows incorporating the crystallinity of the substrate 10, so similarly to the substrate 10, has its maximum dislocation density limited to be lower than $1\times10^7/cm^2$ while also having high in-plane uniformity.

The inventors of the present invention arrived at the finding that the epitaxial substrate 30 constituting the GaN material 100 according to the second embodiment is a suitable material to be processed using PEC etching to form a recess with superior internal flatness, as will be described in detail in the first experimental example below.

Figure 4:
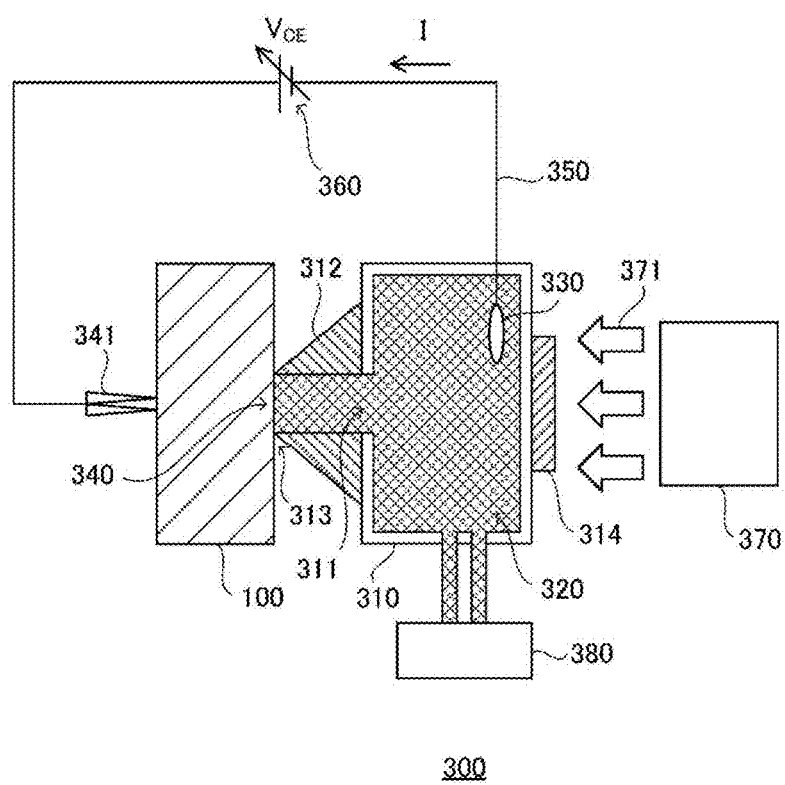
FIG. 4 is a schematic structural diagram illustrating an example of an electrochemical cell in a first experimental example.

Now, PEC etching and the internal flatness of the recess formed using PEC etching will be described along the first experimental example. FIG. 4 is a schematic structural diagram illustrating an example of an electrochemical cell 300 used in PEC etching. A container 310 stores an electrolyte solution 320. As an example of the electrolyte solution 320, a 0.01 M sodium hydroxide (NaOH) solution to which 1% of Triton (registered trademark) X-100 (by Sigma Chemical) has been added as a surfactant may be used.

A platinum (Pt) coil may be used as an example of a cathode electrode 330. The cathode electrode 330 is disposed in the electrolyte solution 320. The GaN material 100 is used as an anode electrode 340. The container 310 has an opening 311, and a sealing ring 312 is disposed so as to surround the opening 311 and be interposed between the container 310 and the GaN material 100. The GaN material 100 is disposed so as to close an opening 313 of the sealing ring 312 located on the opposite side from the container 310. Accordingly, the GaN material 100 contacts the electrolyte solution 320 filling the hole of the sealing ring 312. An ohmic contact probe 341 is attached to the GaN material 100 (anode electrode 340) so as not to contact the electrolyte solution 320.

The cathode electrode 330 and the ohmic contact probe 341 attached to the anode electrode 340 are connected to each other by a wire 350. A voltage source 360 is inserted partway through the wire 350. The voltage source 360 applies a prescribed etching voltage between the cathode electrode 330 and the anode electrode 340 at a prescribed timing.

A light source 370 is disposed on the outside of the container 310. The light source 370 emits ultraviolet (UV) light 371 having a prescribed irradiation intensity at a prescribed timing. Usable examples of the light source 370 include mercury xenon (Hg—Xe) lamps (for example, LIGHTNINGCURE (registered trademark) L9566-03 (by Hamamatsu Photonics K.K.)). A window 314 allowing the UV light 371 to pass through is provided on the container 310. The UV light 371 emitted from the light source 370 passes through the window 314, the electrolyte solution 320, the opening 311 of the container 310, and the opening 313 of the sealing ring 312 and irradiates the GaN material 100 (anode electrode 340). A pump 380 is attached to the container 310. The pump 380 agitates the electrolyte solution 320 in the container 310 at a prescribed timing.

As the anode electrode 340 is irradiated with the UV light 371, the following reaction progresses in the anode electrode 340 and the cathode electrode 330. In the anode electrode 340, holes resulting from the UV light 371 irradiation resolve the GaN into $Ga^{3+}$ and $N_2$ (chem. 1), and moreover, $Ga^{3+}$ is oxidized by the $OH^-$ group (chem. 2), resulting in the generation of gallium oxide ($Ga_2O_3$). As a result of the generated $Ga_2O_3$ being dissolved by the NaOH solution (electrolyte solution 320), the anode electrode 340, i.e. the GaN material 100, is etched. PEC etching is carried out in this way.

(Anode Reaction)

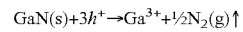  [Chemical Formula 1]

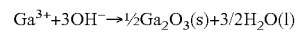  [Chemical Formula 2]

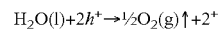  [Chemical Formula 3]

(Cathode Reaction)

$$2H_2O(l)+2e^- \rightarrow 2OH^- + H_2(g)\uparrow \quad \text{[Chemical Formula 4]}$$

In the first experimental example, specifically, the epitaxial substrate 30 was used as the GaN material 100 constituting the anode electrode 340. For more detailed description, the epitaxial layer 20 was irradiated with the UV light 371 while the epitaxial layer 20 side of the epitaxial substrate 30 was contacting the electrolyte solution 320, thereby causing anodic oxidation at the epitaxial layer 20 to etch the same. In other words, the principal face 20s of the epitaxial layer 20 was used as an etching face.

In the first experimental example, a GaN substrate having a Si concentration of 1 to $2\times10^{18}/cm^3$ was used as the substrate 10. The epitaxial layer 20 was formed by growing a GaN layer having a Si concentration of $2\times10^{18}/cm^3$ and a thickness of 2 µm and a GaN layer having a Si concentration of $9\times10^{15}/cm^3$ and a thickness of 13 µm on the substrate 10 by MOVPE. The overall size of the epitaxial substrate 30 was set to be a diameter of two inches (5.08 cm) and the size of the area to be etched by the electrolyte solution 320 coming into contact with the epitaxial layer 20, i.e. the size of the opening 313 of the hole of the sealing ring 312, was set to a diameter of 3.5 mm.

The irradiation intensity at the etching face was set to be 9 mW/cm². UV light irradiation and application of the etching voltage were repeated intermittently by repeating a set consisting of: carrying out UV light irradiation and application of the etching voltage simultaneously for 13 seconds; and then stopping the same for 9 seconds. In other words, pulsed anodic oxidation was carried out. The etching voltage was changed from 0 V to 1 V, 2 V, and 3 V to confirm changes resulting therefrom in the flatness of the bottom face of the recess formed using PEC etching. Results of the first experimental example will be described below with reference to FIGS. 5 through 13.

In commercially available devices designed to carry out PEC etching on various materials, it is common to set the etching voltage to a high voltage exceeding 3 V. A characteristic of this experimental example lies in that a low etching voltage range of 3 V or lower is adopted.

Figure 5:
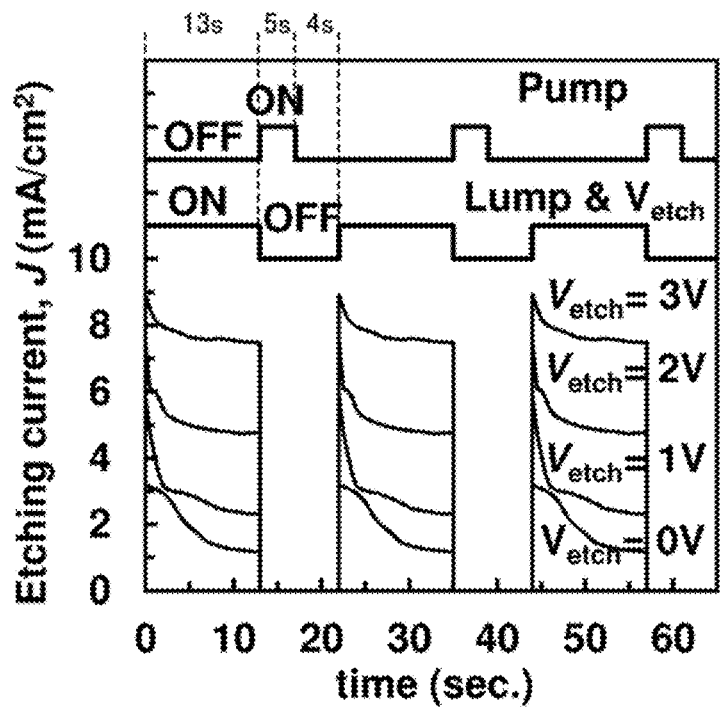
FIG. 5 is a timing chart illustrating a sequence of PEC etching in the first experimental example.

FIG. 5 is a timing chart illustrating a sequence of PEC etching. As mentioned above, UV light irradiation and application of the etching voltage were repeated intermittently by repeating a set consisting of: carrying out UV light irradiation ("Lump" in the drawings) and application of the etching voltage ("$V_{etch}$" in the drawings) simultaneously for 13 seconds; and then stopping the same for 9 seconds. The pump 380 is used to agitate the electrolyte solution 320 ("Pump" in the drawings) within the period in which UV light irradiation and the application of the etching voltage are stopped, more specifically, in the first 5 seconds of this period.

The lower part of FIG. 5 illustrates the etching currents corresponding to cases where the etching voltages of 0 V, 1 V, 2 V, and 3 V were used. For all etching voltages, an etching current flows during the UV light irradiation period and does not flow during the UV light stoppage period. During the UV light irradiation period, an etching current flows as a result of the OH-group reaching the anode electrode 340 according to the aforementioned anode reaction, even if the etching voltage is 0 V. An increase in the etching voltage results in an increase in a drive force of attracting the OH⁻ group toward the anode electrode 340, leading to an increase in the etching current.

Figure 6:
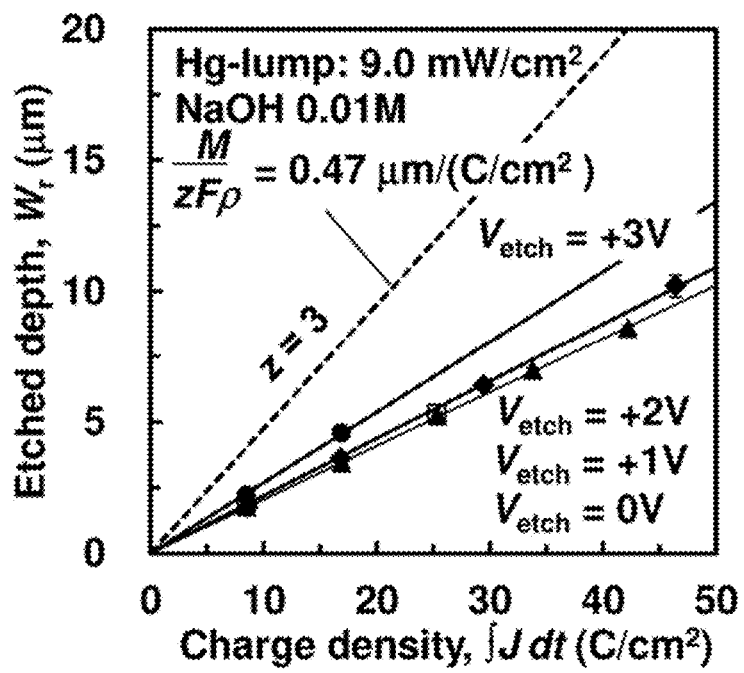
FIG. 6 is a graph illustrating a relationship between an amount of charge per unit area consumed by anodic oxidation and etched depth in the first experimental example.

FIG. 6 is a graph illustrating a relationship between an amount of charge per unit area consumed by anodic oxidation and etched depth (etch depth, etching depth). The result corresponding to the 0 V-etching voltage is illustrated with a square plot, and likewise, 1 V-etching voltage: triangular plot, 2 V-etching voltage: rhombic plot, and 3 V-etching voltage: circular plot. The same plotting is used in FIG. 7 that will be described later.

Etched depth was measured using a process profiler (Sloan, Dektak³ ST). It can be seen that the etched depth changes linearly in relation to the consumed amount of charge. The etched depth $W_r$ is expressed as

[Formula 1]

$$W_r = M/zF\rho \int Jdt \quad (1)$$

according to the Faraday's law. Here, "M" expresses the molecular weight of GaN, "z" expresses the required valence for anodic oxidation per 1 mol of GaN, "F" expresses a Faraday constant, "ρ" expresses the density of GaN, and "J" expresses etching current density. According to expression (1), the hole necessary for anodic oxidation of 1 mol of GaN is z=5.3-6.8 mol. For the generation of $Ga_2O_3$ (chem. 1 and chem. 2) alone, z=3 mol. Thus, this result indicates that in the anode electrode 340, oxygen gas is generated in addition to the generation of $Ga_2O_3$ and the hole is consumed.

Figure 7:
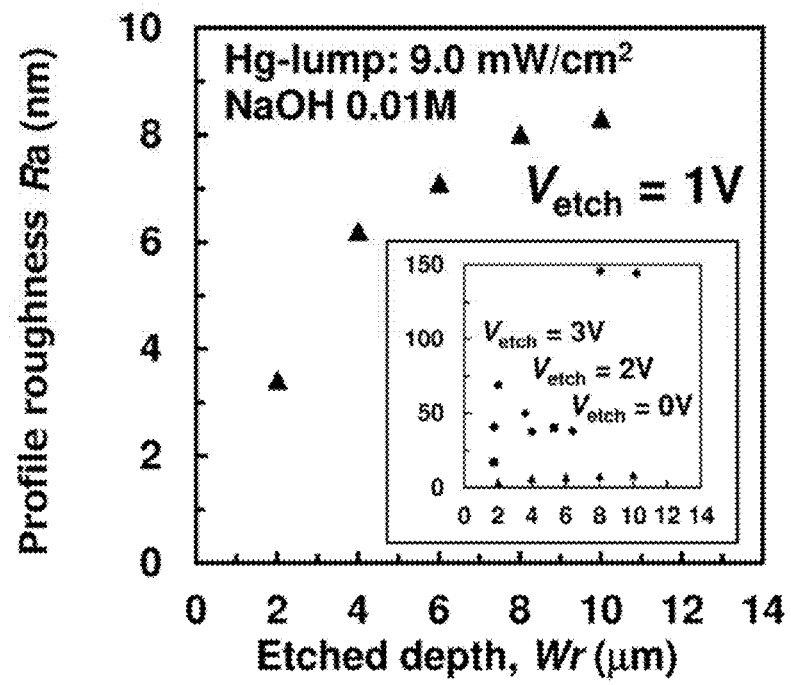
FIG. 7 is a graph illustrating a relationship between etched depth and profile roughness Ra of a bottom face of a formed recess in the first experimental example.

FIG. 7 is a graph illustrating a relationship between etched depth and calculated average profile roughness Ra (may be referred to simply as "profile roughness Ra" in this specification) of a bottom face of a formed recess in the first experimental example. The profile roughness Ra was measured with a contact-type process profiler (Sloan, Dektak³ ST). In the measurement with the contact-type process profiler, the profile roughness Ra was calculated by using, within the evaluation length of 500 µm, 100 µm as a reference length. In other words, the measurement length for obtaining the profile roughness Ra was set to be 100 µm. In FIG. 7, the results obtained with the etching voltage of 1 V are illustrated in enlarged fashion as representative results, and together therewith, the results for the etching voltages of 0 V, 2 V, and 3 V are illustrated in reduced fashion in the lower right part.

It can be seen that in the range in which the etched depths are between 0 µm and 10 µm (inclusive), the profile roughness Ra for the etching voltage of 1 V is remarkably small for all depths. For example, for the etched depth of 10 µm, while the profile roughness Ra for the etching voltage of 2 V is about 150 nm, the profile roughness Ra for the etching voltage of 1 V is as extremely small as 10 nm or less, specifically about 8 nm. In other words, it can be seen that the flatness of the bottom face of the recess formed with the etching voltage of 1 V is remarkably superior. It should be noted that an increase in the depth of a recess tends to result in a decrease in the flatness of the bottom face.

Figure 8:
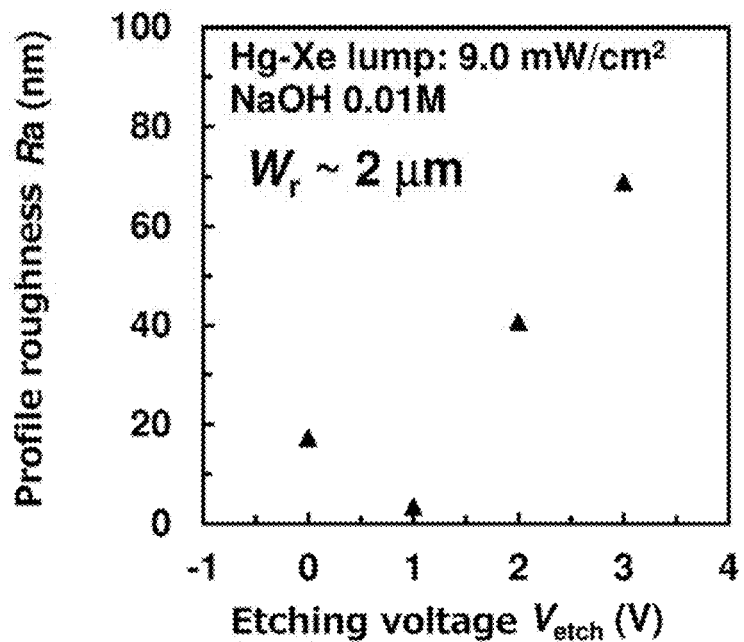
FIG. 8 is a graph illustrating a relationship between an etching voltage and profile roughness Ra in the first experimental example in a case where the etched depth is 2 µm.
Figure 9:
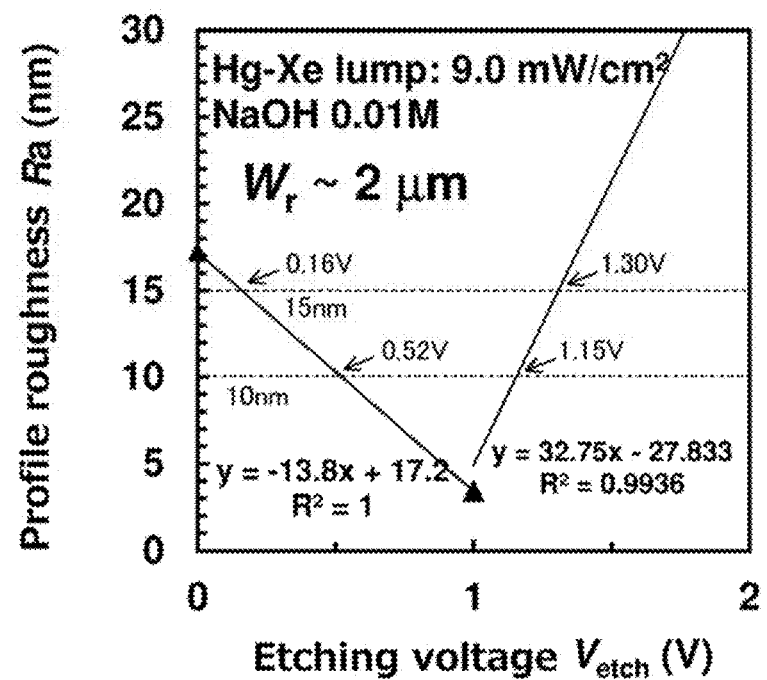
FIG. 9 is a graph in which etching voltage 1 V and the vicinity thereof in FIG. 8 are enlarged.

FIG. 8 is a graph illustrating a relationship between an etching voltage and profile roughness Ra in a case where the etched depth is 2 µm (a graph in which the results for the etched depth of 2 µm in FIG. 7 are plotted anew). FIG. 9 is a graph in which the etching voltage of 1 V and the vicinity thereof in FIG. 8 are enlarged.

The profile roughness Ra is 17 nm, 3.5 nm, 40 nm, and 70 nm for the etching voltages of 0 V, 1 V, 2 V, and 3 V, respectively. For the etching voltage of 1 V, a very flat bottom face with a profile roughness Ra of no more than 5 nm is obtained. In view of this result, an etching voltage for which the profile roughness Ra will be no more than 15 nm, for example, can be estimated to be a voltage falling within the range of 0.16 V to 1.30 V (inclusive), whereas an etching voltage for which the profile roughness Ra will be no more than 10 nm, for example, can be estimated to be a voltage falling within the range of 0.52 V to 1.15 V (inclusive).

Figure 10A:
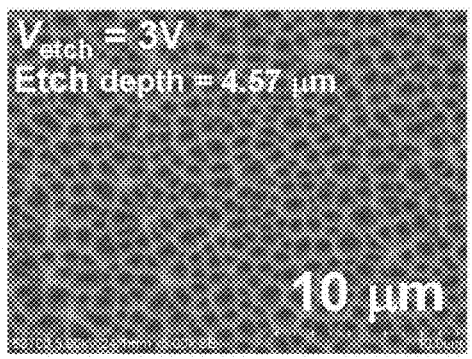
FIGS. 10A through 10C are SEM images of bottom faces of recesses formed in the first experimental example in cases where etching voltages are set to 3 V, 2 V, and 1 V.
Figure 10B:
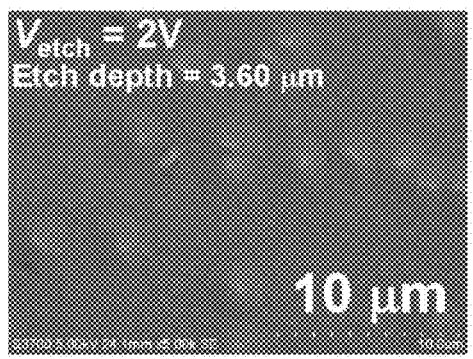
Figure 10C:
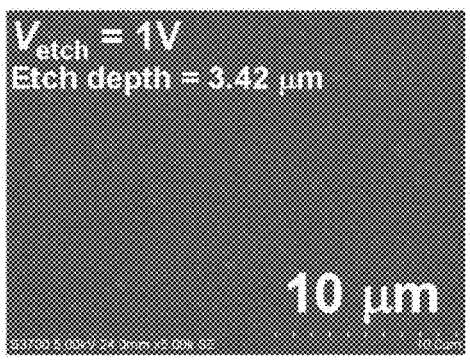
Figure 10D:
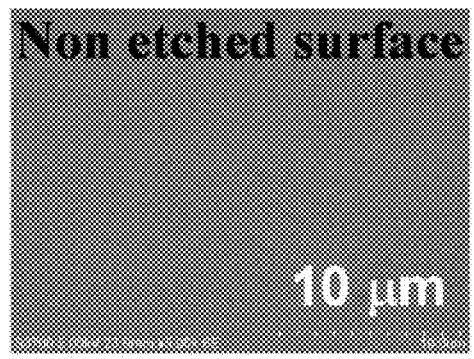
FIG. 10D is a SEM image of a surface in the first experimental example in a case where no etching is carried out.
Figure 11A:
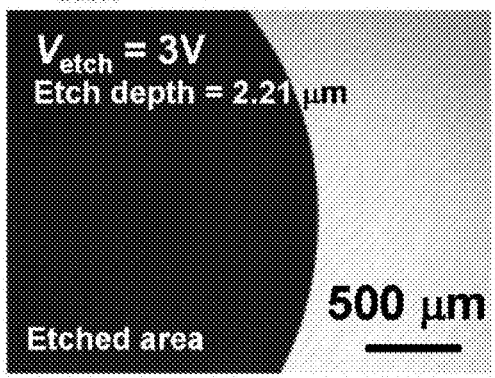
FIGS. 11A through 11D are optical microscopic images of bottom faces of recesses formed in the first experimental example in cases where etching voltages are set to 3 V, 2 V, 1 V, and 0 V.
Figure 11B:
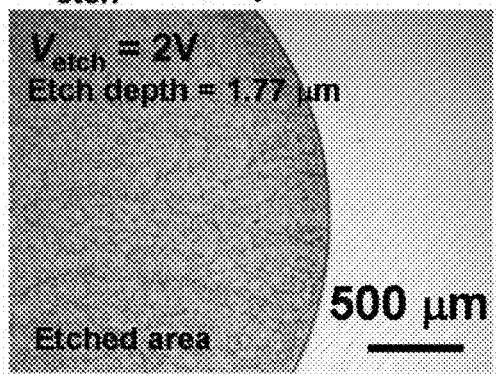
Figure 11C:
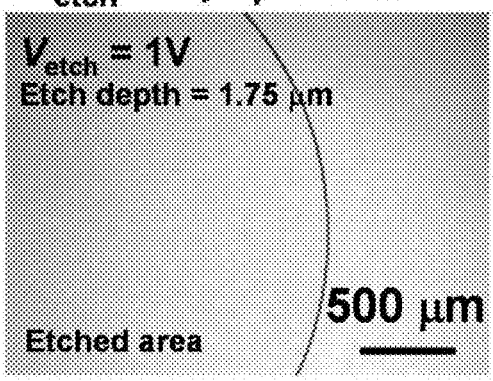
Figure 11D:
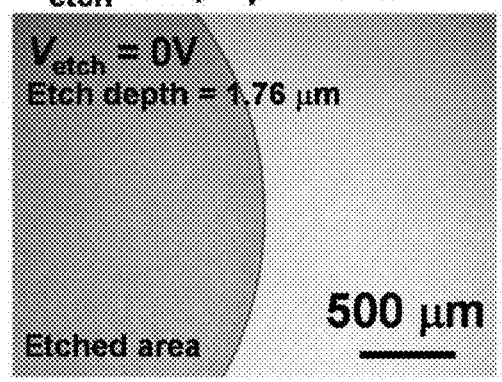
Figure 12A:
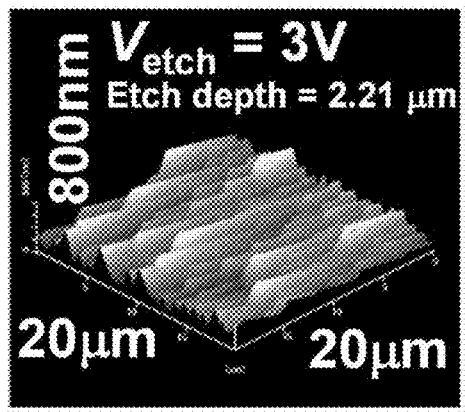
FIGS. 12A through 12D are AFM images of the bottom faces of the recesses formed in the first experimental example in the cases where the etching voltages are set to 3 V, 2 V, 1 V, and 0 V.
Figure 12B:
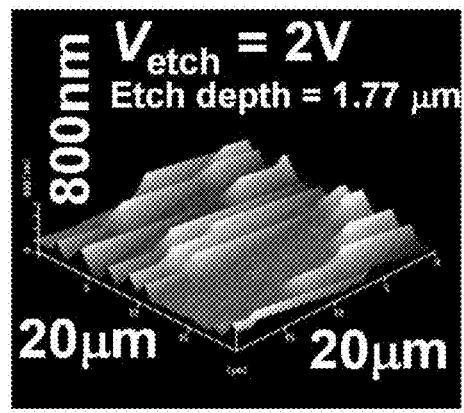
Figure 12C:
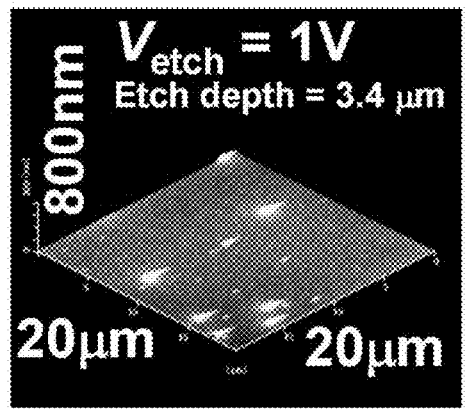
Figure 12D:
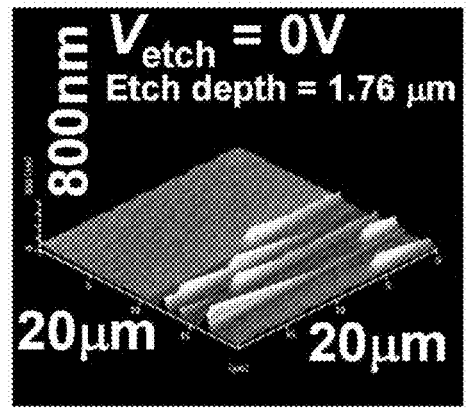

FIGS. 10A through 10C are scanning electron microscopic (SEM) images of bottom faces of recesses formed in cases where the etching voltages are set to 3 V, 2 V, and 1 V. FIG. 10D is a SEM image obtained in a case where no etching is carried out. It can be seen that the bottom face of the recess has superior flatness for the etching voltage of 1 V.

FIGS. 11A through 11D are optical microscopic images of bottom faces of recesses formed in cases where the etching voltages are set to 3 V, 2 V, 1 V, and 0 V. The circular area illustrated in the left part of each image illustrates the etched area, i.e. the recess. It can be seen that for the etching voltage of 1 V, the bottom face of the recess has superior flatness over a wide area of, for example, 500 μm square or more or, for example, 1 mm square or more.

FIGS. 12A through 12D are atomic force microscopic (AFM) images of the bottom faces of the recesses formed in the cases where the etching voltages are set to 3 V, 2 V, 1 V, and 0 V. It can be seen that the bottom face of the recess has superior flatness for the etching voltage of 1 V. For the etching voltage of 1 V, the calculated average surface roughness Ra for a 5 μm-square measurement area (area subject to evaluation) in the bottom face of the recess, as measured using AFM, is 2.6 nm. Meanwhile, for the etching voltage of 0 V, nonuniformity is observed in terms of the presence of both areas with relatively superior flatness and areas with relatively inferior flatness. It is inferred that the reason for this nonuniformity is that since no etching voltage is applied, the ease with which the OH⁻ group is supplied, i.e. the ease with which $Ga_2O_3$ is generated, differs from one area to another, resulting in the presence of areas that are etched more readily and areas that are etched less readily.

Figure 13:
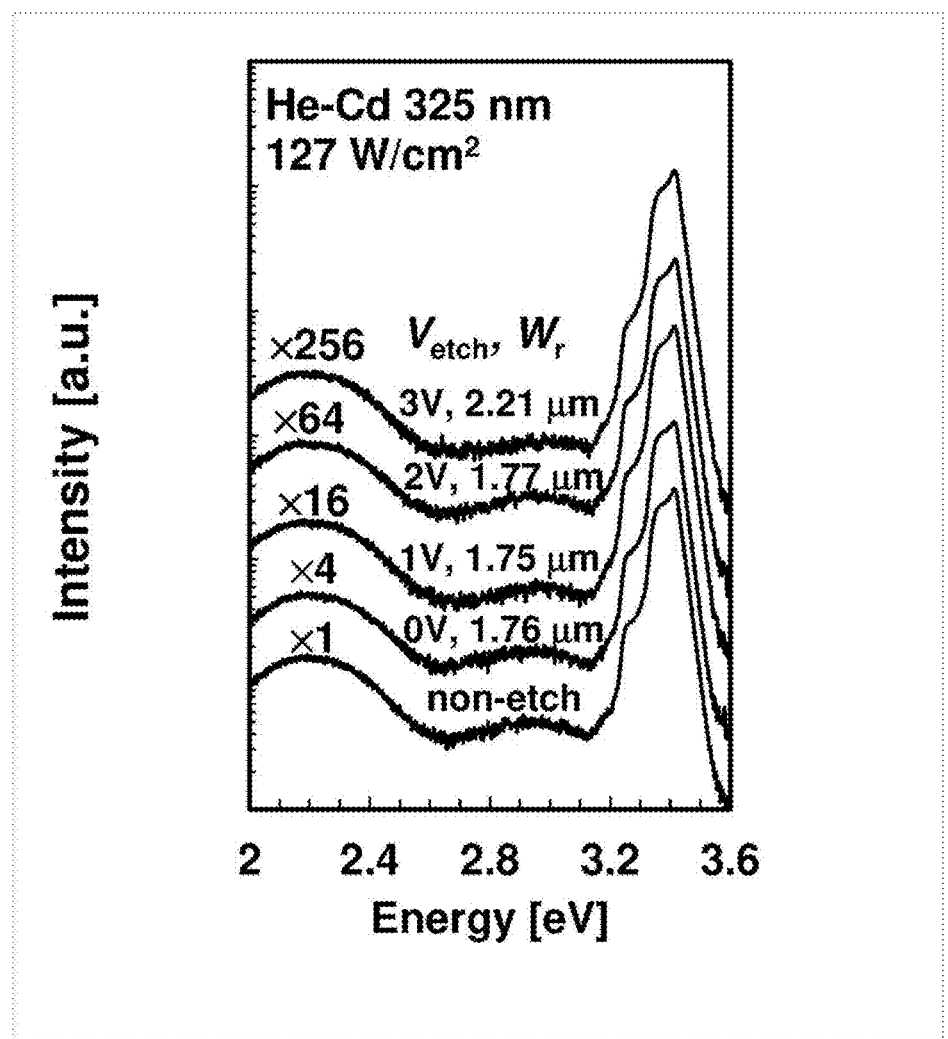
FIG. 13 illustrates PL emission spectra in the first experimental example in the cases where no etching is carried out and where the etching voltages are set to 0 V, 1 V, 2 V, and 3 V.

FIG. 13 is a graph illustrating how the photoluminescence (PL) characteristics of a GaN material change according to PEC etching and illustrates PL emission spectra in the cases where no etching is carried out and where the etching voltages are set to 0 V, 1 V, 2 V, and 3 V. The peak intensity of a PL emission spectrum at a band edge of GaN (about 3.4 eV) will be referred to as "band-edge peak intensity" here. The band-edge peak intensities for all etching voltages have an intensity that is 90% or more in relation to the band-edge peak intensity for when no etching was carried out. In other words, when any of those etching voltages are used, the rate of change (reduction) in band-edge peak intensity due to anodic oxidation is less than 10%. Thus, as can be seen, the PEC etching has demonstrated itself as being a method with which GaN material can be processed with almost no damage to the GaN crystal.

Results obtained in the first experimental example can be summarized as follows. When a recess is formed in the GaN material 100 using PEC etching while changing the etching voltage from 0 V to 1 V, 2 V, and 3 V, the flatness of the bottom face of the recess is superior for the etching voltage of 1 V above all. It is inferred that if the etching voltage is excessively high, for example 2 V or 3 V, the etching is intense, and this leads to a decrease in the flatness of the bottom face of the recess. Meanwhile, it is inferred that if the etching voltage is excessively low, 0 V, then areas that are etched more readily and areas that are etched less readily occur, and this also leads to a decrease in the flatness of the bottom face of the recess.

It is inferred that if the etching voltage is about 1 V, the etching is appropriate, and this leads to an increase in the flatness of the bottom face of the recess. To give a specific example, for the purpose of providing a rough standard for obtaining a profile roughness Ra of about 15 nm or less for the bottom face of a recess to be formed, it is preferred that the etching voltage be a voltage falling within the range of 0.16 V to 1.30 V (inclusive). To give another example, for the purpose of providing a rough standard for obtaining a profile roughness Ra of about 10 nm or less for the bottom face of a recess to be formed, it is preferred that the etching voltage be a voltage falling within the range of 0.52 V to 1.15 V (inclusive).

As described above, in the first experimental example, PEC etching that results in superior flatness could be carried out with an etching voltage of about 1 V. An etching voltage of about 1 V is significantly lower than etching voltages that are usually used for PEC etching, e.g. an etching voltage exceeding 3 V. It is considered that in order to make PEC etching with such a low etching voltage possible, it is preferred that, primarily, the dislocation density of the GaN material 100 in the etching face be adequately low (for example, the dislocation density be, at most, smaller than $1 \times 10^7/cm^2$, i.e. there be no areas having a dislocation density of $1 \times 10^7/cm^2$ or more); this is because in areas where the dislocation density is excessively high (for example, $1 \times 10^7/cm^2$ or more), the holes generated due to UV light irradiation are trapped, which inhibits anodic oxidation. In addition, in order to achieve etching resulting in superior flatness with such a low etching voltage, it is preferred that the in-plane uniformity of the GaN material 100 in the etching face be high so that nonuniformity in terms of the ease with which anodic oxidation occurs is limited.

In view of the above discussion, the profile roughness Ra of a bottom face of a recess formed using PEC etching can be used as an index for evaluating the characteristics (lowness of dislocation density and in-plane uniformity) of the GaN material 100. The GaN material 100 according to the first and second embodiments, i.e. the substrate 10 and the epitaxial substrate 30, is characterized by being a GaN material in which a recess with superior internal flatness can be formed using PEC etching. Specifically, the GaN material 100 according to the first and second embodiments constitutes a GaN material having a low dislocation density and high in-plane uniformity to a degree such that, when assuming a case where a recess with the depth of 2 μm is to be formed using PEC etching (etching voltage=1 V) while carrying out UV light irradiation, then the bottom face of the recess will be formed into a flat face having a profile roughness Ra of preferably 15 nm or less, more preferably 10 nm or less, yet more preferably 5 nm or less.

The surface of the GaN material 100 having undergone no etching ("non-etched surface" below) is flat to a degree such that the profile roughness Ra thereof is, for example, 0.5 nm. In other words, in a member obtained by forming a recess in the GaN material 100 using PEC etching (also referred to as a "GaN member" below), the non-etched surface consisting of an upper face on the outside of the recess is flat to a degree such that the profile roughness Ra thereof is, for example, 0.5 nm. The profile roughness Ra being preferably 15 nm or less, more preferably 10 nm or less, yet more preferably 5 nm or less as described above implies that the profile roughness Ra of the bottom face of the recess of the GaN member (GaN material 100) is preferably 30 times or less, more preferably 20 times or less, yet more preferably 10 times or less than the profile roughness Ra of the surface (non-etched surface) on the outside of the recess. Note that the bottom face of a recess, the etched depth of which is shallower than 2 can be said to be more flat than the bottom face of a recess having a 2-μm etched depth. Thus, the aforementioned condition is applicable to the formation of not only a recess having a 2 μm-etched depth but also to a recess having an etched depth of less than or equal to 2 μm.

For a bottom face of a recess formed using PEC etching as described above, damage to the GaN crystal caused by the etching is little. Thus, for the GaN member (GaN material 100), the band-edge peak intensity of the PL emission spectrum for the bottom face of a recess has an intensity that is 90% or more in relation to the band-edge peak intensity of the PL emission spectrum for the surface on the outside of the recess (non-etched surface).

For the evaluation method described hereabove, the formation of a structure is assumed in which the "recess" is one that has a bottom face, i.e. the GaN material 100 is not penetrated through, but when actually carrying out processing using PEC etching, a structure may be formed where the GaN material 100 is penetrated through to form the "recess".

The etching voltage conditions revealed in the first experimental example are considered to be valid as a rough standard for improving the internal flatness of a recess for not only the PEC etching designed for the GaN material 100 according to the first and second embodiments, but also PEC etching that is performed on an area of a GaN material having an adequately low dislocation density (for example, less than $1 \times 10^7/cm^2$). That is to say, in cases where a recess is formed in an area of a GaN material having a dislocation density of, for example, less than $1 \times 10^7/cm^2$ using PEC etching through the application of etching voltage while carrying out UV light irradiation, the etching voltage is preferably within the range of 0.16 V to 1.30 V (inclusive), more preferably 0.52 V to 1.15 V (inclusive). Such a standard is especially useful when forming a deep recess that has a depth of, for example, 1 μm or more or, for example, 2 μm or more, where the flatness of the bottom face of the recess is prone to degradation. Meanwhile, such a standard is also useful when forming a shallow recess (having a depth of, for example, less than 1 μm), and the use of such a standard enables the formation of a bottom face of a recess having further superior flatness. This is because a decrease in etched depth results in an increase in the flatness of a bottom face of a recess.

For the purpose of increasing flatness, it is preferred that such PEC etching be carried out in the manner of an intermittent repetition of UV light irradiation and application of etching voltage. Moreover, to make it even more preferable, the electrolyte solution used for PEC etching is agitated during the period in which UV light irradiation and application of etching voltage are stopped.

In the first experimental example, flatness of the bottom face of a recess formed using PEC etching has been subject to evaluation; however, a bottom face being formed flat means etching conditions are appropriate and also implies that side faces are formed flat as well. In other words, carrying out PEC etching according to the conditions described above achieves an increase in the internal flatness of the recess formed.

For etching conditions to achieve superior flatness, an etching rate for PEC etching may be, for example, 24.9 nm/min. An etching rate and desired etched depth may be used to estimate an etching duration. Note that if flatness can be disregarded, a maximum etching rate for PEC etching may be raised to, for example, 175.5 nm/min.

In the first experimental example, the irradiation intensity of UV light at the etching face is 9 mW/cm$^2$. The irradiation intensity of 50 mW/cm$^2$ or 20 mW/cm$^2$ for mask aligners, for example, is a value commonly and widely employed for UV light irradiation intensity. The first experimental example is carried out under a condition that facilitates implementation, where the irradiation intensity at the etching face is, for example, no more than 50 mW/cm$^2$ or no more than 20 mW/cm$^2$.

In the first experimental example, a NaOH solution having a concentration of 0.01 M is used as the electrolyte solution; however, the concentration of the electrolyte solution may be adjusted as appropriate. For example, if the concentration is made lower than 0.01 M (for example, about 0.003 M), the etching flatness can be further increased despite a decrease in the etching rate. Alternatively, the concentration may be made higher than 0.01 M to such an extent that appropriate etching flatness can be maintained (for example, 0.02 M or lower).

Third Embodiment

Figure 14A:
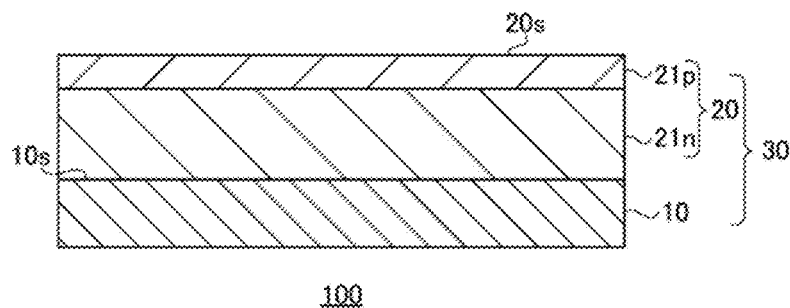
FIGS. 14A through 14C are schematic sectional diagrams illustrating part of a method for producing a semiconductor device employing a GaN material (epitaxial substrate) according to a third embodiment.

Next, a third embodiment will be described. The third embodiment features an epitaxial substrate 30 including a GaN substrate 10 and an epitaxial layer 20 as an example of a GaN material 100, as illustrated in FIG. 14A. The constitution of the epitaxial layer 20 according to the third embodiment differs from that of the epitaxial layer 20 according to the second embodiment in including a GaN layer 21n to which n-type impurities have been added (also referred to as an "epitaxial layer 21n" below) and a GaN layer 21p to which p-type impurities have been added (also referred to as an "epitaxial layer 21p" below). For the substrate 10, the substrate 10 described in the first embodiment may be used preferably.

Although there are no particular limitations on the constitution of the substrate 10 and the epitaxial layer 20 (epitaxial layers 21n and 21p), the following illustrates a possible example. For the substrate 10 and the epitaxial layer 21n, a constitution equivalent to that of the substrate 10 and the epitaxial layer 20 described in the second embodiment may be adopted as an example. For the p-type impurities, magnesium (Mg) may be used as an example. The epitaxial layer 21p may be constituted by, for example, a stack including: a GaN layer, which has a thickness of between 300 nm and 600 nm (inclusive), and to which Mg has been added at a concentration of between $2 \times 10^{17}/cm^3$ and $5 \times 10^{18}/cm^3$ (inclusive); and a GaN layer, which has a thickness of between 10 nm and 50 nm (inclusive), and to which Mg has been added at a concentration of between $1 \times 10^{20}/cm^3$ and $3 \times 10^{20}/cm^3$ (inclusive).

The epitaxial layer 20 (epitaxial layers 21n and 21p) may be grown on the principal face 10s of the substrate 10 by MOVPE, for example. Growth of the epitaxial layer 21n is equivalent to the growth of the epitaxial layer 20 described in the second embodiment. The epitaxial layer 21p is grown using TMG as an example of Ga raw material, NH$_3$ as an example of N raw material, and Bis-cyclopentadienyl magnesium (CP$_2$Mg) as an example of Mg raw material. The epitaxial layers 21n and 21p grow incorporating the crystallinity of the substrate 10, so similarly to the substrate 10, have the maximum dislocation density thereof limited to be lower than $1 \times 10^7/cm^2$ while also having high in-plane uniformity. The epitaxial substrate 30 constituting the GaN material 100 according to the third embodiment is a suitable material to be processed using PEC etching to form a recess with superior internal flatness, similarly to the GaN material 100 according to the first and second embodiments.

Figure 14B:
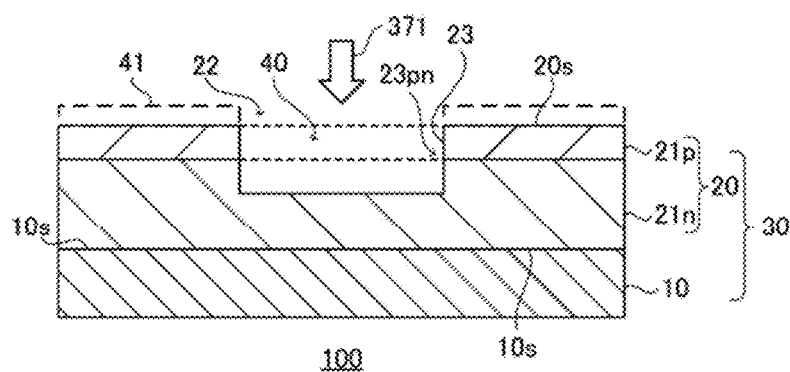

FIG. 14B illustrates PEC etching designed for the epitaxial substrate 30. A principal face 20s of the epitaxial layer 20 is used as an etching face. The epitaxial substrate 30 is disposed in the electrochemical cell 300 in such a way that an area 22 to be etched in the principal face 20s contacts the electrolyte solution 320. Then, PEC etching is carried out by applying etching voltage onto the area 22 while irradiating the same with UV light 371. In this example, a recess 40 is formed by penetrating through the epitaxial layer 21p and penetrating partway through the thickness of the epitaxial layer 21n. A pn junction 23pn constituted by the epitaxial layer 21p and the epitaxial layer 21n is exposed on a side face 23 of the recess 40. By setting the etching voltage to about 1 V as described above, a pn junction 23pn can be formed on a side face 23 having superior flatness. An area in the principal face 20s, which is located on the outside of the area 22 and is not subject to etching, may be covered with a mask 41 constituted by a hardmask or the like so as to be prevented from being etched. For the purpose of limiting unwanted etching (side etching) on the side face of the recess 40, the mask 41 may be constituted by a light-blocking mask and the linearity of the UV light 371 may be enhanced.

In cases where the epitaxial layer 20 includes an epitaxial layer 21p to which p-type impurities have been added as in the third embodiment, it is preferred that activation annealing for activating the p-type impurities in the epitaxial layer 21p be carried out after PEC etching for the following reason. When the epitaxial layer 21p is a p-type conductive layer, the epitaxial layer 21p itself has a hole, so PEC etching progresses more readily even without the UV light 371. As a result, a difference occurs between the epitaxial layer 21n and the epitaxial layer 21p in terms of the ease with which etching progresses. Furthermore, since side etching occurs more readily in the epitaxial layer 21p, the flatness of the side face 23 of the recess 40 is prone to degradation. For this reason, it is preferred that PEC etching be carried out before the epitaxial layer 21p is made into a p-type conductive layer, i.e. before subjecting the epitaxial layer 21p to activation annealing, from the viewpoint of improving flatness. In other words, it is preferred that activation annealing be carried out after PEC etching and that the epitaxial layer 21p when subjected to PEC etching has not undergone activation annealing.

Figure 14C:
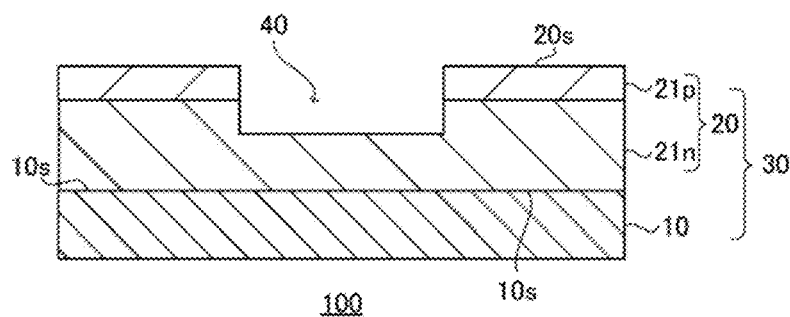

FIG. 14C illustrates activation annealing. Activation annealing is carried out to activate the n-type impurities in the epitaxial layer 21n, thereby making the epitaxial layer 21n into an n-type conductive layer, and to activate the p-type impurities in the epitaxial layer 21p, thereby making the epitaxial layer 21p into a p-type conductive layer. A technique known in the art may be used, as appropriate, to carry out the activation annealing.

Fourth Embodiment

Next, a fourth embodiment will be described. The fourth embodiment will be described along a second experimental example. The fourth embodiment features, as an example of a GaN material 100, an epitaxial substrate 30 that includes a GaN substrate 10 and an epitaxial layer 20 including an epitaxial layer 21n to which n-type impurities have been added and an epitaxial layer 21p to which p-type impurities have been added (see FIG. 14A). For the substrate 10, the substrate 10 described in the first embodiment may be used preferably.

The preferable etching conditions discussed in the first experimental example were applied in the second experimental example to carry out PEC etching to form a cylindrical protrusion in the GaN material 100. In other words, PEC etching was carried out to remove GaN on the outside of the cylindrical protrusion, the remnant serving as the cylindrical protrusion.

The epitaxial layer 21n was formed by growing a GaN layer having a Si concentration of $2\times10^{18}/cm^3$ and a thickness of 2 µm and a GaN layer having a Si concentration of $2\times10^{16}/cm^3$ and a thickness of 10 µm on the substrate 10 by MOVPE. The epitaxial layer 21p was formed by growing a GaN layer having a Mg concentration of $5\times10^{18}/cm^3$ and a thickness of 500 nm and a GaN layer having a Mg concentration of $2\times10^{20}/cm^3$ and a thickness of 20 nm on the epitaxial layer 21n by MOVPE. A circular mask having a diameter of 90 µm was formed on the epitaxial layer 21p using a Ti layer having a thickness of 50 nm. This mask was used in carrying out PEC etching on the GaN material 100 to a depth of 20 µm or more so as to form the cylindrical protrusion.

In this experimental example, PEC etching was carried out after carrying out activation annealing on the epitaxial layer 21p. This was done so to confirm the degree to which side etching occurs in a condition in which the epitaxial layer 21p is prone to being side etched. This activation annealing was carried out in the manner of heating that was carried out in a $N_2$ gas at 850° C. for 30 minutes.

Figure 15A:
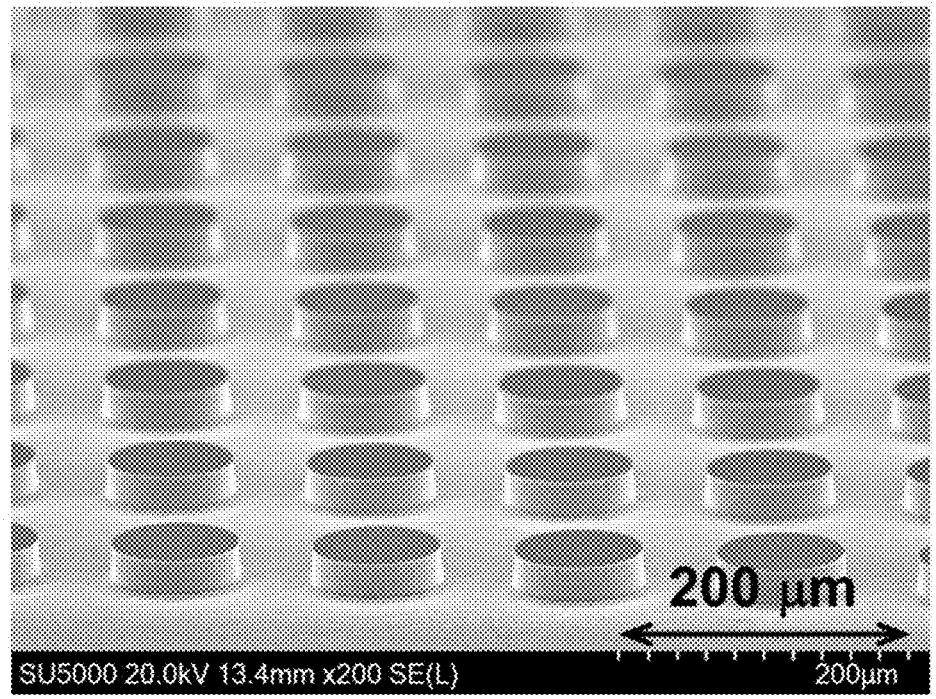
FIGS. 15A and 15B are SEM images in which cylindrical protrusions formed in a second experimental example (fourth embodiment) are viewed in an overhead view and a side view.
Figure 15B:
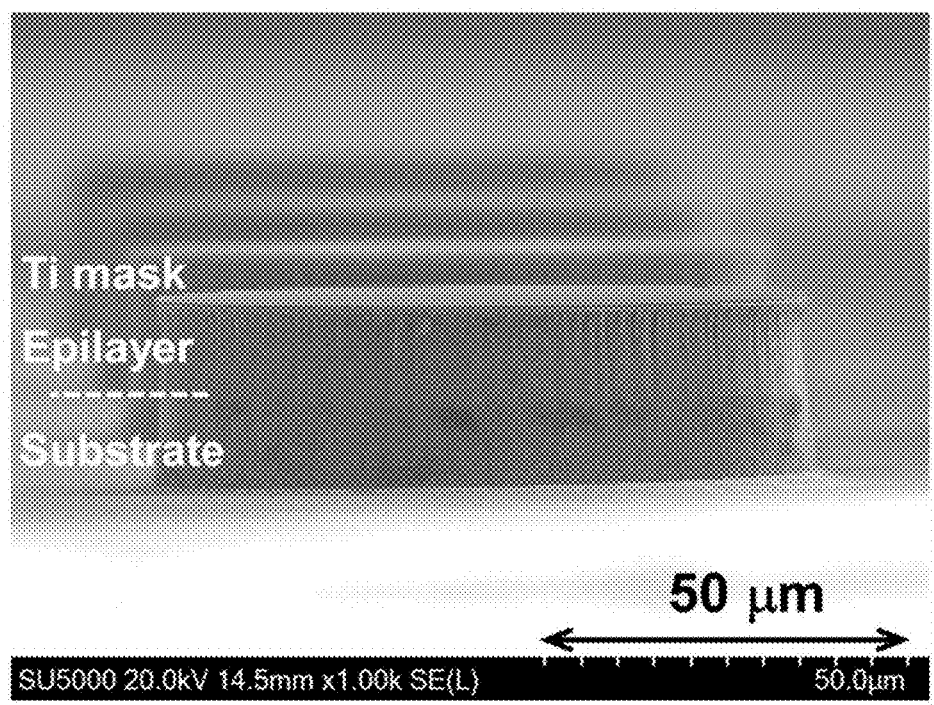
Figure 16:
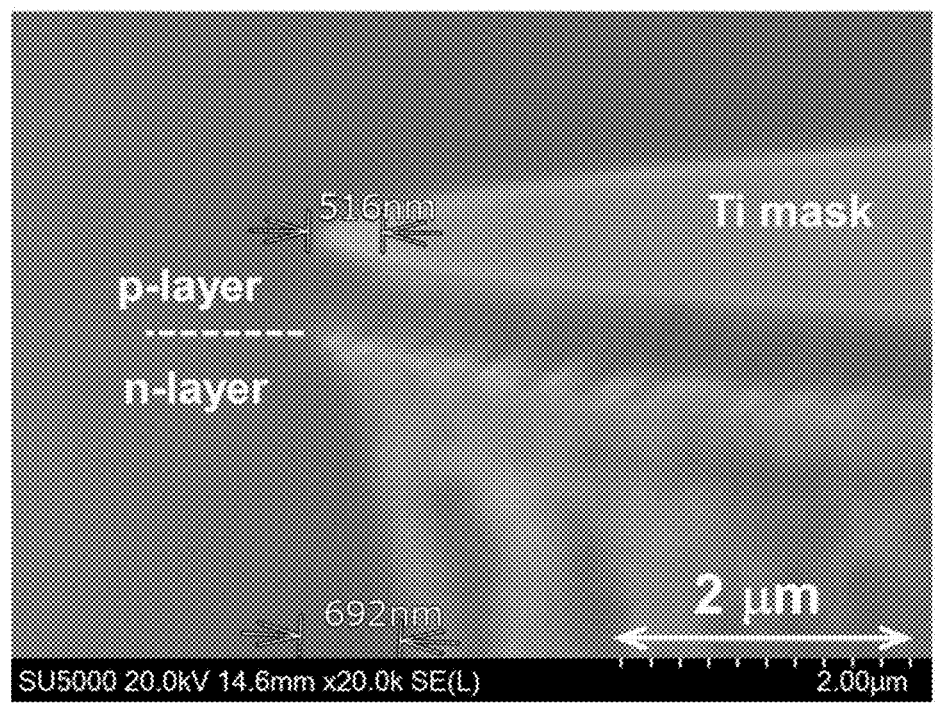
FIG. 16 is a SEM image in which a mask, a pn junction, and the vicinity thereof in the cylindrical protrusion formed in the second experimental example (fourth embodiment) are illustrated in enlarged fashion.

FIG. 15A is a SEM image illustrating an overhead view of the cylindrical protrusion. FIG. 15B is a SEM image illustrating a side view of the cylindrical protrusion. FIG. 16 is a SEM image in which the mask, the pn junction, and the vicinity thereof are illustrated in enlarged fashion. These SEM images show that the PEC etching according to this embodiment enables accurate production of a structure having a desired shape that accords with the mask.

Although etching was carried out to a depth of 20 µm or more, there is almost no reduction in the 50 nm-thickness Ti mask. In view of this, the etching selection ratio is estimated to be at least 400 (=20 µm/50 nm). Moreover, the side etching width in the epitaxial layer 21p directly under the Ti mask is estimated to be 516 nm, i.e. the width is limited to be no more than 1 µm. A metallic material as an example of a material that blocks UV light may be used preferably as a mask material for PEC etching, a more specific preferred example thereof to be used including Ti, Chromium (Cr), etc. The use of a mask material that limits PEC etching results in a reduction in the mask thickness, and the mask thickness may be 200 nm or less, for example.

The side face of each cylindrical protrusion is roughly perpendicular to the upper face of the cylindrical protrusion and assume the shape of a smooth curved face on the side face of the cylinder. The side faces of the cylindrical protrusions are homogeneous in the circumferential direction. The bottom face on the outside of the cylindrical protrusions, i.e. the bottom face formed using PEC etching, is very flat.

When observed more closely, in the side face, there are formed stripe-like fine protrusions and recesses that extend in the thickness (height) direction of the cylindrical protrusion, i.e. the direction in which PEC etching progresses. Such stripe-like protrusions and recesses are also homogeneous in the circumferential direction, and no anisotropy is observed in particular.

Figure 23:
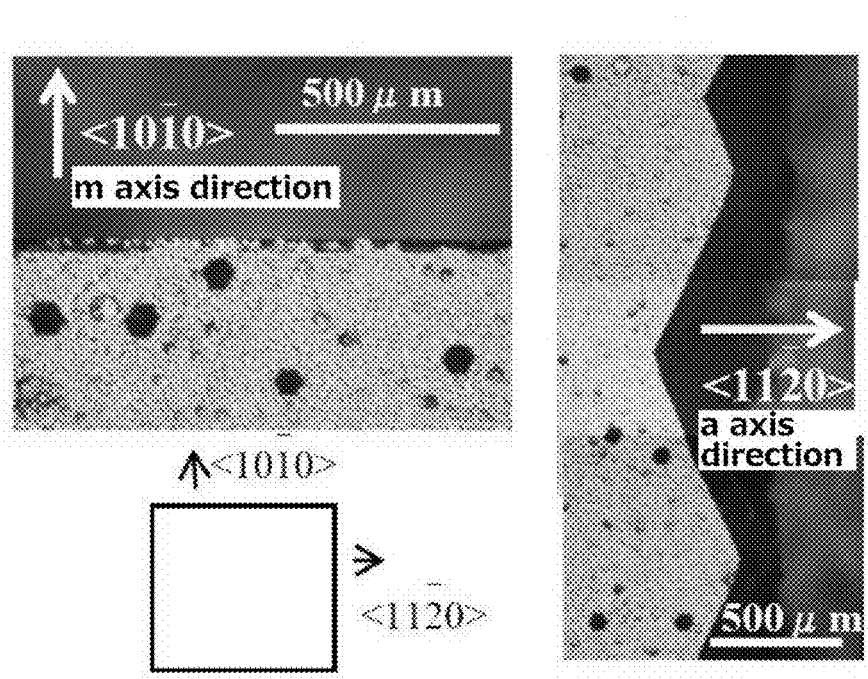
FIG. 23 is an optical microscopic photograph illustrating the result of an experiment in which a rectangular GaN material, the side faces of which are constituted by an a face and an m face perpendicular to the a face, is etched with hot phosphoric acid sulfuric acid.

The side face is a face that is roughly perpendicular to the c face of the GaN crystal. The inventors of the present invention have arrived at the finding that when a face that is perpendicular to the c face of a GaN crystal is etched with hot phosphoric acid sulfuric acid, which consist of the mixture phosphoric acid and sulfuric acid, the a face is etched more readily while the m face is etched less readily, and therefore the m face is prone to being exposed. FIG. 23 is an optical microscopic photograph illustrating the result of an experiment in which a rectangular GaN material, the side faces of which are constituted by an a face and an m face perpendicular to the a face, is etched with hot phosphoric acid sulfuric acid. The right part in FIG. 23 illustrates etching results for the a face and the upper left part of FIG. 23 illustrates etching results for the m face. As can be seen in the figure, assuming that the side face of the cylindrical protrusion is a face that is formed by etching with hot phosphoric acid sulfuric acid, the portion of the side face that is perpendicular to the a axis direction is formed from a face in which a plurality of m faces are connected to one another in zigzag fashion so that the face is perpendicular to the a axis direction on average, and the portion of the side face perpendicular to the m axis direction is formed flat from a single m face. In other words, when viewed in the circumferential direction, the constitution of a portion of such a side face that is perpendicular to the a axis direction and the constitution of a portion thereof that is perpendicular to the m axis direction demonstrate different anisotropies, and in the circumferential direction, overall, such a side face constitutes a coarse (angular) face in which the m faces connect to one another in zigzag fashion. The side face of the cylindrical protrusion according to this experimental example has limited anisotropy in the circumferential direction and is less coarse (smoother) compared to a side face that is formed by etching with hot phosphoric acid sulfuric acid. It should be noted that such characteristics are also achieved for the side face of a protrusion having other shapes than a cylindrical shape, such as a prismatic columnar shape.

As can be seen from FIG. 16, the side etching width is smaller at the pn junction, and a shape is formed such that the pn junction protrudes outward. This reflects the fact that the hole lifetime is shorter and PEC etching progresses with more difficulty at the pn junction. This experimental example illustrates an example case where PEC etching was is carried out after the epitaxial layer 21p has undergone activation annealing. By carrying out PEC etching before subjecting the epitaxial layer 21p to activation annealing, it is possible to reduce the side etching width in the epitaxial layer 21p, and protrusion of the pn junction can therefore be limited.

Fifth Embodiment

Next, a fifth embodiment will be described. The fifth embodiment will be described along a third experimental example. The fifth embodiment features an epitaxial substrate 30, which includes a GaN substrate 10 and an epitaxial layer 20 to which n-type impurities have been added, as an example of a GaN material 100 (see FIG. 3). For the substrate 10, the substrate 10 described in the first embodiment may be used preferably. The preferable etching conditions discussed in the first experimental example were applied in the third experimental example to carry out PEC etching to form a cylindrical recess in the GaN material 100.

The epitaxial layer 20 was formed by growing a GaN layer having a Si concentration of $2\times10^{18}/cm^3$ and a thickness of 2 µm and a GaN layer having a Si concentration of $1.5\times10^{16}/cm^3$ and a thickness of 5.8 µm on the substrate 10 by MOVPE. A mask having circular apertures with diameters of 1 µm, 5 µm, 10 µm, and 20 µm were formed on the epitaxial layer 20 using a Ti layer having a thickness of 50 nm. This mask was used in carrying out PEC etching on the GaN material 100 to a depth of 7.7 µm so as to form a cylindrical recess.

Figure 17:
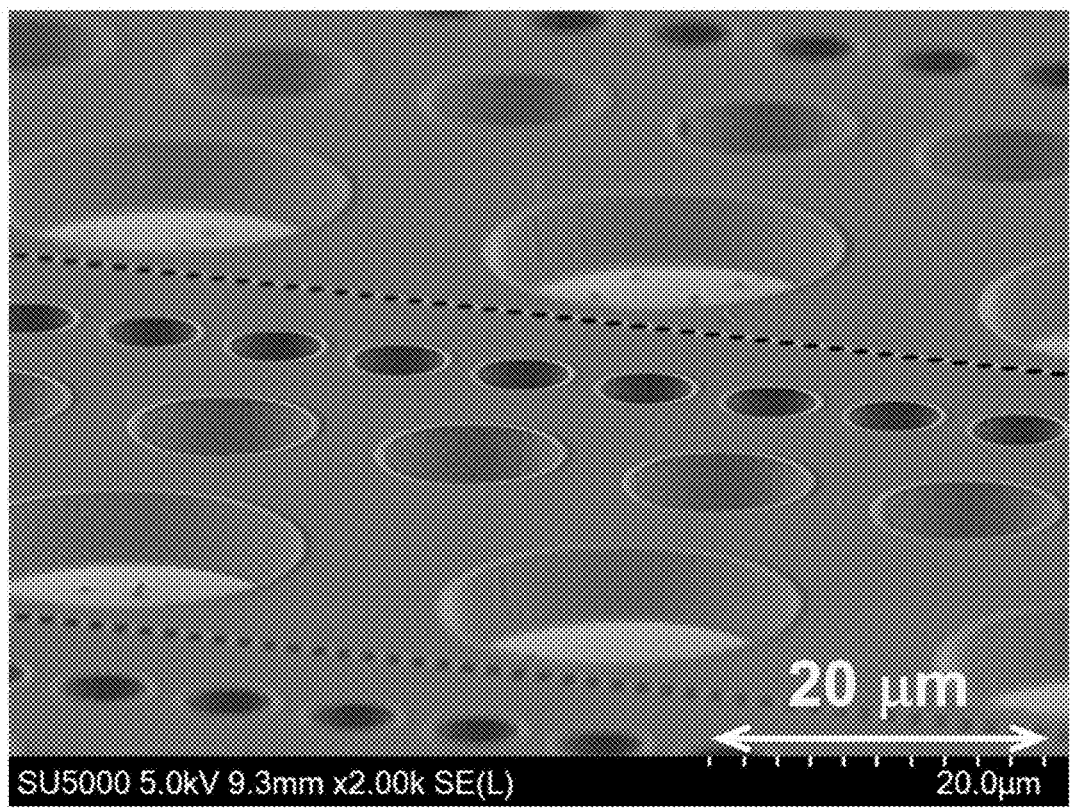
FIG. 17 is a SEM image in which cylindrical recesses formed in a third experimental example (fifth embodiment) are viewed in an overhead view.

FIG. 17 is a SEM image illustrating an overhead view of the cylindrical recess. In the side face and the bottom face of the recess formed using PEC etching, characteristics similar to those of the protrusion described in the second experimental example are observed. That is, the side face of each recess is roughly perpendicular to the upper face on the outside of the recess and assumes the shape of a smooth curved face on the side face of the cylinder. The side faces of the recesses are homogeneous in the circumferential direction. The bottom face of each recess is formed very flat. When observed more closely, in the side faces, stripe-like fine protrusions and recesses that extend in the thickness (depth) direction of the recesses are formed homogeneously in the circumferential direction. The side faces have limited anisotropy in the circumferential direction and are less coarse (smoother) compared to a side face that is formed by etching with hot phosphoric acid sulfuric acid.

In the SEM image in FIG. 17, small bumps distributed discretely can be observed in the bottom faces of the 20 µm-diameter recesses. The areas between the bumps are constituted by faces that are more flat than the bumps. The bottom faces of the recesses are faces that follow the c face more or less. The inventors of the present invention have confirmed that dark spots are observed in the center of the bumps in SEM cathodoluminescence images. In view of this, it is considered that the bumps correspond to dislocations and since the hole lifetime is shorter and PEC etching progresses with more difficulty at the dislocations, the bumps were formed. It should be noted that a bottom face on the outside of a protrusion in the case where a protrusion is formed as in the second experimental example is a bottom face that is formed using PEC etching, so may have similar characteristics.

As described above, the PEC etching according to this embodiment is a processing method that causes almost no damage to a GaN crystal (see FIG. 13), so damage to a side face and a bottom face formed using the PEC etching according to this embodiment is limited. Thus, in SEM cathodoluminescence images, compared to the dark spots resulting from dislocations and observed in the bottom face, areas on the outside of the dislocations in the bottom faces are observed as being lighter and the side faces are observed as being lighter compared to the dark spots.

The band-edge peak intensities of the PL emission spectra for the side face and bottom face formed using the PEC etching according to this embodiment have intensities that are 90% or more in relation to the band-edge peak intensity of the PL emission spectrum for a surface (an upper face on the outside of a recess when a recess is formed, or an upper face of a protrusion when a protrusion is formed) that is protected by a mask and not etched.

Sixth Embodiment

Next, a sixth embodiment will be described. The sixth embodiment will be described along a fourth experimental example. The sixth embodiment features an epitaxial substrate 30, which includes a GaN substrate 10 and an epitaxial layer 20 to which n-type impurities have been added, as an example of a GaN material 100 (see FIG. 3). For the substrate 10, the substrate 10 described in the first embodiment may be used preferably. The preferable etching conditions discussed in the first experimental example were applied in the fourth experimental example to carry out PEC etching to form a groove-like recess (trench) in the GaN material 100.

The constitution of the epitaxial layer 20 is equivalent to that described in the third experimental example (fifth embodiment). A mask having linear apertures with widths of 1.4 µm, 2.8 µm, and 5.6 µm were formed on the epitaxial layer 20 using a Ti layer having a thickness of 50 nm. Two experiments were conducted using the mask: an experiment in which the GaN material 100 was subject to PEC etching to a target depth of 7.7 µm to form a trench; and an experiment in which the GaN material 100 was subject to PEC etching to a target depth of 33 µm to form a trench.

Figure 18A:
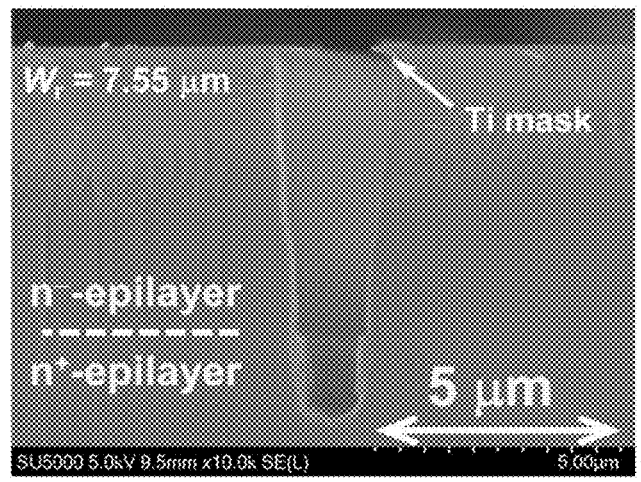
FIGS. 18A through 18C are SEM images illustrating cross-sections of trenches (target depth: 7.7 µm) formed in a fourth experimental example (sixth embodiment), where the cross-sections are taken along a direction perpendicular to the length direction of the trenches.
Figure 18B:
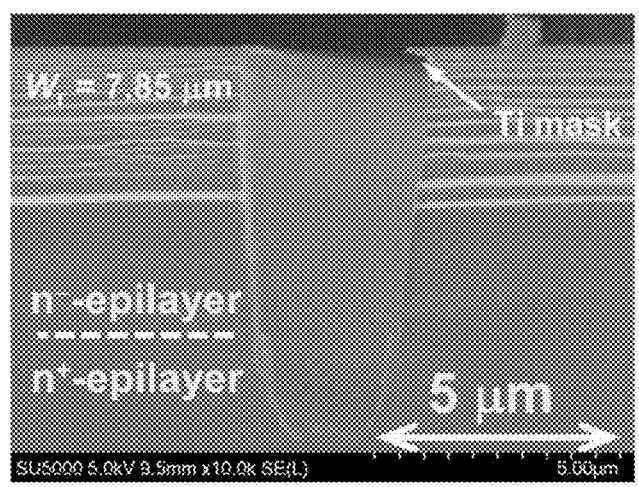
Figure 18C:
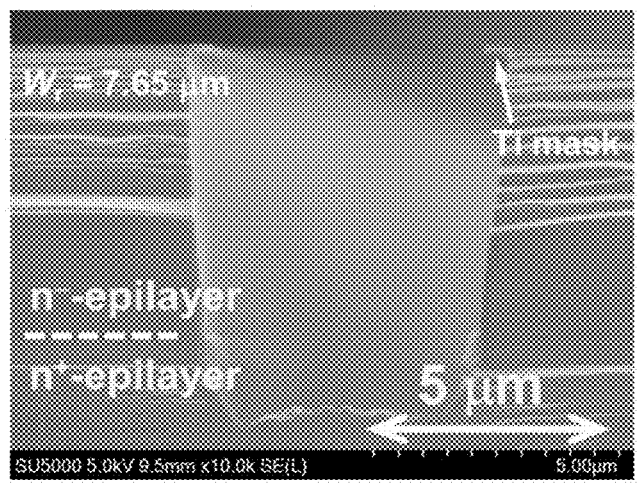

FIGS. 18A through 18C are SEM images illustrating cross-sections of trenches (target depth: 7.7 µm), where the cross-sections are taken along a direction perpendicular to the length direction of the trenches. The length direction of the trench, i.e. the length direction of the mask aperture, is parallel to the m axis, and the cross-section is a cleavage surface of them face. FIG. 18A is a SEM image of a trench having a mask aperture width of 1.4 µm, FIG. 18B is a SEM image of a trench having a mask aperture width of 2.8 µm, and FIG. 18C is a SEM image of a trench having a mask aperture width of 5.6 µm.

The actual measured values of the depths of the trenches having the mask aperture widths of 1.4 µm, 2.8 µm, and 5.6 µm are 7.55 µm, 7.85 µm, and 7.65 µm, respectively, and are all roughly equal to the target depth 7.7 µm. These results show that in this experimental example, a constant etching rate can be maintained during etching if the target depth of a trench is about 8 µm, for example, and that etched depth can be controlled on the basis of etching duration with ease.

Figure 19A:
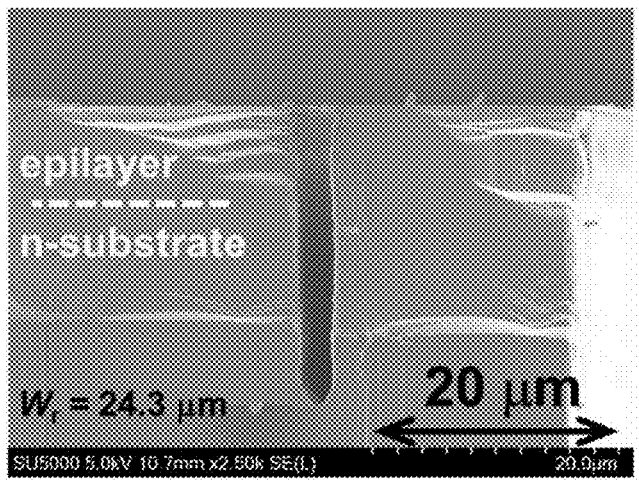
FIGS. 19A through 19C are SEM images illustrating cross-sections of trenches (target depth: 33 µm) formed in the fourth experimental example (sixth embodiment), where the cross-sections are taken along a direction perpendicular to the length direction of the trenches.
Figure 19B:
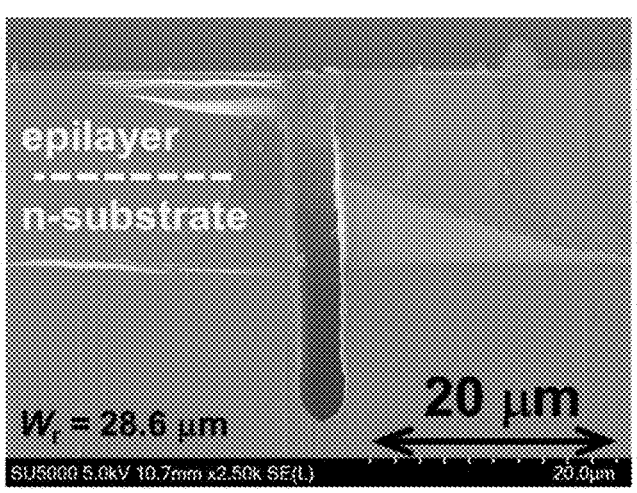
Figure 19C:
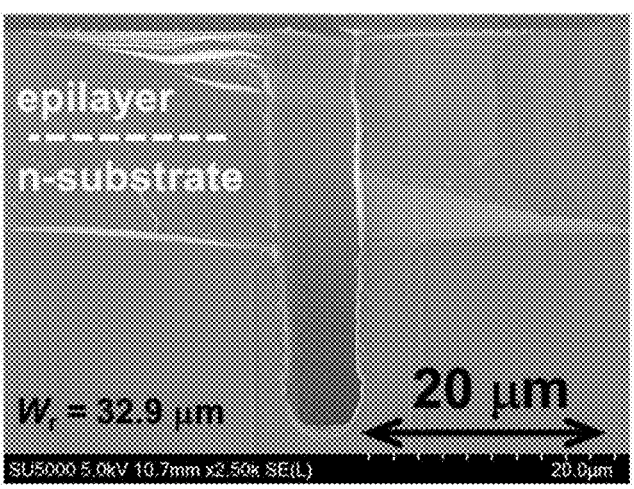

FIGS. 19A through 19C are SEM images illustrating cross-sections of trenches (target depth: 33 µm), where the cross-sections are taken along a direction perpendicular to the length direction of the trenches. Similarly to FIGS. 18A to 18C, the cross-sections are each a cleavage surface of them face. FIG. 19A is a SEM image of a trench having a mask aperture width of 1.4 µm, FIG. 19B is a SEM image of a trench having a mask aperture width of 2.8 µm, and FIG. 19C is a SEM image of a trench having a mask aperture width of 5.6 µm.

The depth of the trench having the mask aperture width of 5.6 µm is 32.9 µm and is roughly equal to the target depth 33 µm. Meanwhile, the depths of the trenches having the mask aperture widths of 2.8 µm and 1.4 µm are 28.6 µm and 24.3 µm, respectively, and are shallower than the target depth 33 µm. The tendency of the trench depth being shallower than the target depth is more prominent as the mask aperture width is narrower. The reason therefor is considered to be that when the target depth of the trench is as deep as, for example, 30 the influence of the arrival of UV light at the vicinity of the trench bottom being impeded due to the reduction in the mask aperture width becomes greater, leading to a reduction in the etching rate. In this regard, an improvement in UV light collimation is considered to limit such a reduction in the etching rate.

As can be seen in the SEM image in FIG. 18A and the like, the edge of the trench aperture recedes laterally directly under the mask, or in other words, the mask protrudes in eave-like fashion on the edge of the trench aperture, i.e. side etching is has occurred.

Figure 20:
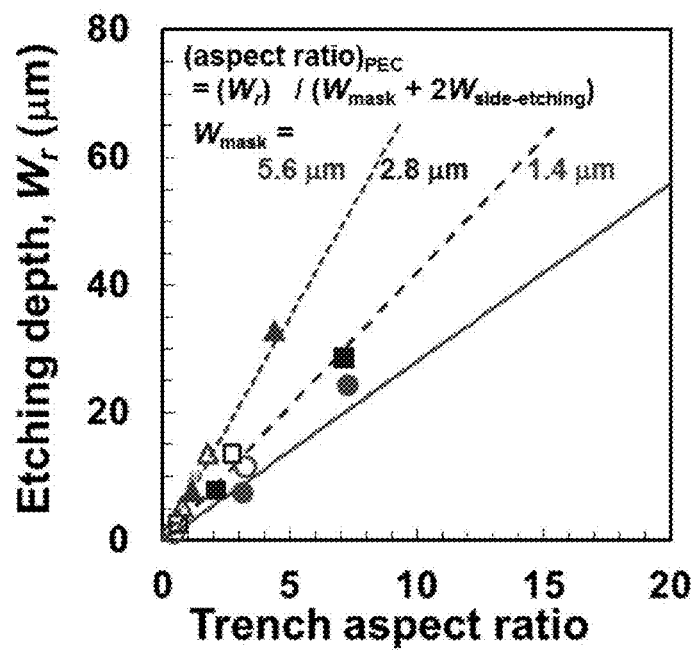
FIG. 20 is a graph illustrating a relationship between etched depth and an aspect ratio of a trench formed in the fourth experimental example (sixth embodiment)

FIG. 20 a graph illustrating a relationship between etched depth and an aspect ratio of a trench formed in the fourth experimental example. An aspect ratio of a recess (e.g. trench) is defined as the ratio of an etched depth (depth of the recess) $W_r$ to a width W of the upper end of the recess ($=W_r/W$). The width W of the upper end of the recess is expressed as the sum of the mask aperture width $W_{mask}$ and a value obtained by doubling the side etching width $W_{side\text{-}etching}$ on one side directly under the mask ($=W_{mask}+2W_{side\text{-}etching}$).

FIG. 20 also illustrates results for other recesses that were formed using PEC etching while setting the mask aperture width to an equivalent value. The results for the trenches in the fourth experimental example (FIGS. 18A through 19C) are indicated with blacked-out plots and the results for the other recesses are indicated with outlined plots. The circular plots indicate the actual measured values representing the relationships between the aspect ratios and the etched depths for the mask aperture width of 1.4 µm. The square plots indicate the actual measured values representing the relationships between the aspect ratios and the etched depths for the mask aperture width of 2.8 µm. The triangular plots indicate the actual measured values representing the relationships between the aspect ratios and the etched depths for the mask aperture width of 5.6 µm. The relationships between the aspect ratios and the etched depths $W_r$ for the case where the mask aperture width $W_{mask}$ was set to 1.4 µm, 2.8 µm, and 5.6 µm and the side etching width $W_{side\text{-}etching}$ on one side was assumed to be 0.7 µm are indicated by the solid line, broken line, and dotted line, respectively.

For the trench with the target depth of 7.7 µm in the fourth experimental example: the depth and the aspect ratio for the mask aperture width of 1.4 µm are 7.55 µm and 3.1, respectively; the depth and the aspect ratio for the mask aperture width of 2.8 µm are 7.85 µm and 2.1, respectively; and the depth and the aspect ratio for the mask aperture width of 5.6 µm are 7.65 µm and 1.2, respectively. For the trench with the target depth of 33 µm in the fourth experimental example: the depth and the aspect ratio for the mask aperture width of 1.4 µm are 24.3 µm and 7.3, respectively; the depth and the aspect ratio for the mask aperture width of 2.8 µm are 28.6 µm and 7.1, respectively; and the depth and the aspect ratio for the mask aperture width of 5.6 µm are 32.9 µm and 4.4, respectively The plots of the actual measured values are more or less distributed on the lines for the case where the side etching width is assumed to be 0.7 µm. This shows that the side etching width is maintained to be constant and about 0.7 µm even when the etched depth is deepened (to be, for example, 5 µm or more or, for example, 10 µm or more), i.e. the side etching width is limited to be no more than 1 µm. It is also shown that the side etching width is maintained to be constant and about 0.7 µm even when the mask aperture width changes.

A comparison between FIGS. 18A through 18C with FIGS. 19A through 19C reveals the tendency of the inclination of the trench side face resulting from side etching increasing in conformity with a decrease in etched depth. In other words, it can be said that from the viewpoint of increasing the parallelness of side faces that face other, it is preferable to deepen the etched depth. The following gives rough estimated values for when the side etching width directly under the mask is set to be 0.7 µm as described above and the trench bottom width and the mask aperture width are assumed to be equivalent. It is preferred that: the etched depth be set to 8 µm or more so as to make the inclination of the side face relative to the side etching width no more than 5°; the etched depth be set to 10 µm or more so as to make the inclination of the side face relative to the side etching width no more than 4°; the etched depth be set to 13.5 µm or more so as to make the inclination of the side face relative to the side etching width no more than 3°; and the etched depth be set to 20 µm or more so as to make the inclination of the side face relative to the side etching width no more than 2°. The side faces may be treated with tetramethylammonium hydroxide (TMAH) and the like after PEC etching so as to make the side faces perpendicular.

In the state of the art, attempts are made to form trenches by subjecting GaN to dry etching. For trenches obtained in the state of the art, however, the aspect ratio is at most about 3 and the depth is at most about 3 µm. With dry etching, it is difficult to increase the etching selection ratio of GaN relative to the mask material, so it is not possible to form deep trenches having a depth of, for example, 5 µm or more. Since deep trenches cannot be formed in the state of the art, trenches with a high aspect ratio of, for example, 5 or more have not been obtained. Moreover, dry etching has the problem of causing significant damage to the surface of GaN subject to etching.

The inventors of the present invention have succeeded in forming a trench having a depth of 5 µm or more in the GaN material 100 by using the PEC etching according to this embodiment in the fourth experimental example. Furthermore, the inventors of the present invention have succeeded in forming a trench with a high aspect ratio of 5 or more. Specifically, a trench having a depth of 24.3 µm and an aspect ratio of 7.3 (mask aperture width=1.4 µm; see FIG. 19A) and a trench having a depth of 28.6 µm and an aspect ratio of 7.1 (mask aperture width=2.8 µm; see FIG. 19B) could be formed.

PEC etching gives rise to side etching. If the side etching width widens in conformity with the etched depth, an increase in the aspect ratio becomes difficult. In the fourth experimental example, the inventors of the present invention arrived at the undiscovered finding that using the PEC etching according to this embodiment, the side etching width can be maintained to be more or less constant even if the etched depth deepens (to, for example, 5 µm or more or, for example, 10 µm or more). Then, based on this finding that the side etching width can be maintained to be more or less constant, the inventors of the present invention arrived at the undiscovered finding that the aspect ratio can be increased proportionally to the etched depth and that it is possible to form a trench with a high aspect ratio of, for example, 5 or more (see FIG. 20). According to this finding, it is also possible to form a trench with an aspect ratio of, for example, 10 or more.

Notwithstanding the above, the inventors of the present invention also arrived at the undiscovered finding mentioned above, namely that deepening the etched depth becomes more difficult as the mask aperture width narrows (see FIGS. 19A and 19B). To give a specific example, the difficulty of deepening the etched depth increases from the mask aperture width of 5.6 µm (see FIG. 19C) to the mask aperture width of 2.8 µm (see FIG. 19B). The actual trench width that is obtained by adding up the side etching widths (1.4 µm) on both sides is 7 µm for the mask aperture width of 5.6 µm and 4.2 µm for the mask aperture width of 2.8 µm. Thus, it can be said that when the trench width is, for example, 6 µm or less or, for example, 5 µm or less, then it is difficult to form a deep trench and increase the aspect ratio. According to this experimental example, it was found that a trench with an aspect ratio of, for example, 5 or more can be formed even when the trench width is, for example, 6 µm or less or, for example, 5 µm or less.

Note that while a groove-like recess (trench) has been given as an example to describe the formation of a recess with a high aspect ratio, the shape of the flat surface of the upper end (shape of the aperture) of the recess may be changed, as appropriate, and the PEC etching according to this embodiment may be used to form a recess other than a groove-like recess (trench), for example, a cylindrical recess or a prismatic columnar recess with a high aspect ratio of, for example, 5 or more or, for example, 10 or more. The width of the upper end of the recess used to define the aspect ratio may be, for example, the width of the shortest portion.

Although there are no particular limitations on the upper limit of the aspect ratio, the upper limit of the etched depth is the thickness of the GaN material 100. A recess formed using the PEC etching according to this embodiment may encompass a structure in which the GaN material 100 is penetrated through (i.e. the recess does not have a bottom face), in which case the etched depth of the recess penetrating through the GaN material 100 will coincide with the thickness of the GaN material 100. The purpose of penetrating through the GaN material 100 may be, for example, to form a through-hole, or to divide (separate) the GaN material 100 into a plurality of segments. The aspect ratio of the through-hole is defined similarly to that of a recess having a bottom face, with the thickness of the GaN material serving as the etched depth.

In the state of the art, neither are formed protrusions (for example, ridges) with a height of 5 µm or more, nor are formed protrusions (for example, ridges) with a high aspect ratio of 5 or more. The PEC etching according to this embodiment can also be used to form a protrusion having a height of 5 µm or more and to form a protrusion with an aspect ratio of, for example, 5 or more or, for example, 10 or more (see FIG. 22B). An aspect ratio of a protrusion (e.g. ridge) is defined as the ratio of an etched depth (height of the protrusion) $W_r$ to a width W of the upper end of the protrusion (=$W_r/W$). The width W of the upper end of the protrusion is expressed as a difference between the mask width $W_{mask}$ and a value obtained by doubling the side etching width $W_{side-etching}$ on one side directly under the mask (=$W_{mask}-2W_{side-etching}$). The shape of the flat surface of the upper end of the protrusion may be selected, as appropriate. The width of the upper end of the protrusion used to define the aspect ratio may be, for example, the width of the shortest portion.

In conformity with the above discussion about trench formation, also when forming a protrusion, the side etching width directly under the mask relative to the PEC etching according to this embodiment is maintained to be constant and about 0.7 i.e. limited to be no more than 1 more or less independently of the etched depth or the mask width. Conditions for limiting the inclination of a side face relative to the side etching width are equivalent to those that have been discussed in relation to trench formation.

It should be noted that the PEC etching according to this embodiment may also be used preferably when forming a recess or a protrusion with an aspect ratio of, for example, less than 5. As described above, the PEC etching according to this embodiment is a processing method that causes almost no damage to a GaN crystal, so this PEC etching is favorable for the formation of any recesses or protrusions regardless of the aspect ratio.

Seventh Embodiment

Next, a seventh embodiment will be described. The seventh embodiment describes a technique for performing PEC etching on the entirety of the etching face of the GaN material 100 having a large diameter of, for example, two inches or more (PEC etching that can be suitably performed on an intended area within the entire etching face).

With the PEC etching (see FIG. 4 and (chem. 1) through (chem. 4)) described in the second embodiment (first experimental example), electrons generated together with holes in the anode electrode 340 (GaN material 100) due to irradiation with the UV light 371 are supplied to the cathode electrode 330 via the wire 350 and are thus consumed by cathode reaction (chem. 4). The wire 350 is attached to the anode electrode 340 (GaN material 100) via an ohmic contact probe 341 arranged so as not to contact the electrolyte solution 320 (so as not to cause short circuiting). Such PEC etching requires a sealing structure for preventing contact between the ohmic contact probe 341 and the electrolyte solution 320.

It is troublesome to form a sealing structure for the entirety of the etching face of the GaN material 100 with a large diameter, so it is preferable to omit such a sealing structure. Thus, in this embodiment, there will be considered PEC etching in which the ohmic contact probe 341, wire 350, and cathode electrode 330 are omitted. PEC etching in which the ohmic contact probe 341, wire 350, and cathode electrode 330 are omitted may be referred to as "electrodeless PEC etching" below, whereas PEC etching in which the ohmic contact probe 341, wire 350, and cathode electrode 330 are used may be referred to as "electrode-based PEC etching" below.

Figure 24A:
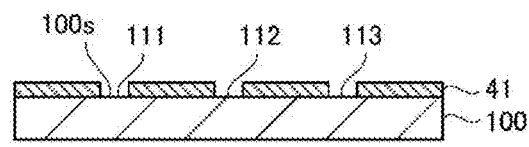
FIGS. 24A through 24D are schematic diagrams each illustrating an example of a manner in which PEC etching according to a seventh embodiment is carried out.

FIGS. 24A through 24D are schematic diagrams each illustrating an example of a manner in which electrodeless PEC etching according to the seventh embodiment is carried out. FIG. 24A will be referenced. The GaN material 100 (may be referred to as "wafer 100" below) is prepared. The wafer 100 has a large diameter (large area) of, for example, two inches or more. The structure of the wafer 100 may be selected, as appropriate. The wafer 100 may be a substrate itself, such as that illustrated in FIG. 1G, or may be a stack formed from a substrate and an epitaxially-grown layer, such as that illustrated in FIG. 3 or FIG. 14A, for example. A plurality of etching areas 111 through 113 disposed at intervals from one another are defined on a surface 100s (etching face) of the wafer 100.

The etching areas 111 through 113 are areas where the GaN material 100 is to be etched by being irradiated with UV light 431 while being immersed in (being in contact with) an etching liquid 420, as will be described later. A light-blocking mask 41 for blocking the UV light 431 is formed on the surface 100s of the wafer 100. The mask 41 has an opening for exposing the etching areas 111 through 113. The current example illustrates three etching areas 111 through 113, but the number of etching areas may be modified according to need, as appropriate. The shape and size of each of the etching areas 111 and the like, the respective positions of the etching areas 111 and the like on the surface 100s, etc. may be modified according to need, as appropriate.

Figure 24B:
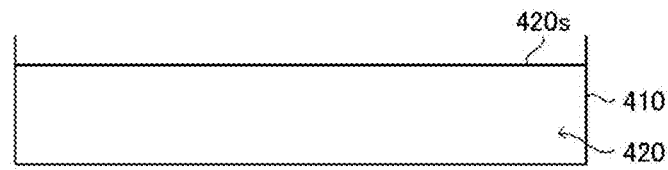

FIG. 24B will be referenced. The etching liquid 420 is prepared in a container 410. The etching liquid 420 contains an electrolyte solution equivalent to the electrolyte solution 320 described in the second embodiment (first experimental example) and potassium peroxodisulfate ($K_2S_2O_8$) dissolved in the electrolyte solution. The electrolyte solution may, for example, be a NaOH solution, as descried above. The etching liquid 420 used for the electrodeless PEC etching in this embodiment contains a hydroxide ion ($OH^-$) and a peroxodisulfate ion ($S_2O_8^{2-}$). Meanwhile, the etching liquid (the electrolyte solution 320) used for the electrode-based PEC etching in the second embodiment contains a hydroxide ion ($OH^-$) but does not contain a peroxodisulfate ion ($S_2O_8^{2-}$).

Figure 24C:
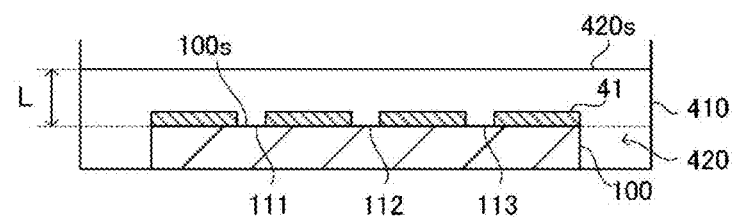

FIG. 24C will be referenced. The wafer 100 on which the mask 41 is formed is accommodated in the container 410 in a condition in which the surface 100s of the wafer 100 is immersed in the etching liquid 420 in a manner such that the surface 100s is parallel with a surface 420s of the etching liquid 420 (so as to be horizontal). With the electrodeless PEC etching of this embodiment, the entirety of the wafer 100 may be immersed in the etching liquid 420, so etching can be performed without providing a sealing structure such as that described above. The surface 100s of the wafer 100 and the surface 420s of the etching liquid 420 being "parallel" with each other means that the angle between the surface 100s of the wafer 100 and the surface 420s of the etching liquid 420 is within the range of 0°±2°.

Note that the wafer 100 and the etching liquid 420 may be accommodated in the container 410 in the order of first accommodating the etching liquid 420 in the container 410 and then accommodating the wafer 100 in the container 410, or in the order of first accommodating the wafer 100 in the container 410 and then accommodating the etching liquid 420 in the container 410. The process of preparing the etching liquid 420 in the container 410 and the process of accommodating the wafer 100 in the container 410 may be performed with either one of these orders according to need.

Figure 24D:
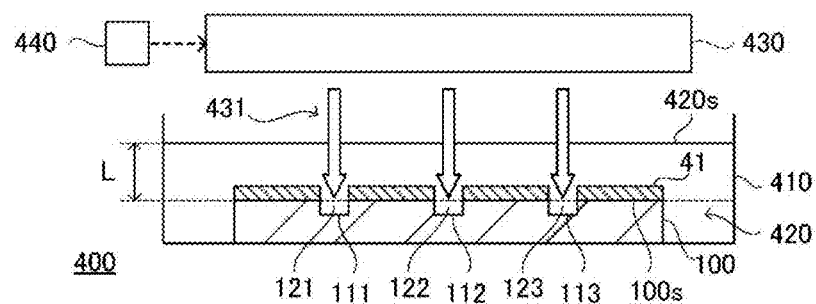

FIG. 24D will be referenced. In a condition in which the wafer 100 and the etching liquid 420 are still, the UV light 431 is radiated from a light irradiation device 430 onto the surface 100s of the wafer 100. UV light with a wavelength of shorter than 365 nm is used for the UV light 431. The UV light 431 is radiated on the respective surfaces of the etching areas 111 through 113 perpendicularly from the surface 420s side of the etching liquid 420, i.e. from the upper side. "Perpendicular" to the surfaces of the etching areas 111 through 113, i.e. to the surface 100s of the wafer 100, means that the angle of the UV light 431 with respect to the surface 100s of the wafer 100 is within the range of 90°±2°.

The concept of "radiating the UV light 431 onto the surface 100s of the wafer 100" or "irradiating the surface 100s of the wafer 100 with the UV light 431" means "radiating the UV light 431 toward the surface 100s of the wafer 100", and likewise, the concept of "radiating the UV light 431 onto the wafer 100" or "irradiating the wafer 100 with the UV light 431" means "radiating the UV light 431 toward the wafer 100". The UV light 431 radiated onto the mask 41 is equivalent to same being radiated toward the surface 100s of the wafer 100 or same being radiated toward the wafer 100.

With the electrodeless PEC etching in this embodiment, the reactions (chem. 5) through (chem. 7) below occur, and the cathode reaction (chem. 4) in the electrode-based PEC etching of the second embodiment is replaced by (chem. 7) so that the electrons generated together with the holes in the GaN material 100 are consumed. Thus, the cathode electrode 330 used in the electrode-based PEC etching of the second embodiment can be omitted, and accordingly, the wire 350 and the ohmic contact probe 341 can also be omitted. In other words, PEC etching is performed without using the cathode electrode 330 that is immersed in the etching liquid 420 while being connected to the wire 350 extending to outside the etching liquid 420 (without using the cathode electrode 330 immersed in the etching liquid 420 and the wire 330 connected to the cathode electrode 330 and extending to outside the etching liquid 420). The anode reactions (chem. 1) through (chem. 3) in the GaN material 100 are the same for both the electrodeless PEC etching and the electrode-based PEC etching. In this way, the GaN material 100 can be etched using the electrodeless PEC etching of this embodiment.

$$K_2S_2O_8 \rightarrow 2K^+ S_2O_8^{2-}$$ [Chemical Formula 5]

$$S_2O_8^{2-} + \text{heat or } h\nu \rightarrow 2SO_4^{-*}$$ [Chemical Formula 6]

$$2SO_4^{-*} + 2e^- + 2H_2O(l) \rightarrow 2SO_4^{2-} + 2HO^* + H_2(g)\uparrow$$ [Chemical Formula 7]

The etching areas 111 through 113 are located in dispersed fashion on the surface 100s of the wafer 100. An increase in the diameter of the wafer 100 results in enlargement in the overall range in which the etching areas 111 through 113 are located. Due to enlargement in the overall range in which the etching areas 111 through 113 are located, uniform etching of the etching areas 111 through 113 becomes difficult. In this embodiment, the uniformity of etching of the etching areas 111 through 113 can be enhanced in the manner described below.

The wafer 100 is accommodated in the container 410 such that the surface 100s thereof is parallel with the surface 420s of the etching liquid 420. In this way, for all of the etching areas 111 through 113, the distance (depth) from the surface 420s of the etching liquid 420, i.e. the thickness of the etching liquid 420 located above the etching areas 111 through 113, can be made uniform. As a result, it is possible to limit variation in the condition in which (at least one from among) OH⁻ and $S_2O_8^{2-}$ (or $SO_4^{-*}$) are (is) supplied to the etching areas 111 through 113 as a result of diffusion from the etching liquid 420 located above the etching areas 111 through 113; therefore, uniformity of etching in the surface 100s of the wafer 100 can be enhanced. Moreover, advantages of making the surface 100s of the wafer 100 and the surface 420s of the etching liquid 420 also include achievement of uniformity in the supply of $SO_4^{-*}$ due to absorption of the UV light 431 in (chem. 6).

A distance L from the surface 100s of the wafer 100 to the surface 420s of the etching liquid 420 may preferably be between 1 mm and 100 mm (inclusive), for example. When the distance L is too short, variation in the condition in which (at least one from among) OH⁻ and $S_2O_8^{2-}$ (or $SO_4^{-*}$) are (is) supplied to the etching areas 111 through 113 as a result of diffusion from the etching liquid 420 located above the etching areas 111 through 113 increases easily. Thus, it is preferable to set the distance L to 1 mm or more, for example. When the distance L is too long, the container 410 will be too large, and the amount of etching liquid 420 will also be too large. Thus, it is preferable to set the distance L to 100 mm or less, for example. In addition, from the perspective of supplying $SO_4^{-*}$, when the distance L is too short, absorption of the UV light 431 on the surface 100s of the wafer 100 will be predominant and there will be an excess in electrons. Meanwhile, when the distance L is too long, most of the UV light 431 will be absorbed by the reaction of (chem. 6) in the etching liquid 420 so that sufficient holes cannot be supplied to the wafer 100 and thus the anodic oxidation of the reaction of (chem. 1) cannot be performed. As such, it is preferable to adjust the distance L so that there is an amount of $SO_4^{-*}$ whereby holes can be supplied to the wafer 100 while excessive electrons can be eliminated in the etching liquid 420. Also from this perspective, it is preferable to set the distance L to between 1 mm and 100 mm (inclusive), for example. When the distance L is short, it will be difficult to control the height of the liquid surface, so the distance L is preferably 1 mm or more, more preferably 3 mm or more, even more preferably 5 mm or more. Since the mask 41 has a small thickness, such as 200 nm or less as exemplified above, the distance L from the surface 100s of the wafer 100 to the surface 420s of the etching liquid 420 can be regarded as the distance from the surface of the mask 41 to the surface 420s of the etching liquid 420.

The UV light 431 is radiated in a condition in which the wafer 100 and the etching liquid 420 are still. As a result, it is possible to limit variation in the condition in which (at least one from among) OH⁻ and $S_2O_8^{2-}$ (or $SO_4^{-*}$) are (is) supplied to the etching areas 111 through 113 due to movement of the etching liquid 420; therefore, uniformity of etching in the surface 100s of the wafer 100 can be enhanced.

The UV light 431 is radiated on the respective surfaces of the etching areas 111 through 113 perpendicularly. As a result, it is possible to perpendicularly align the depth directions of recesses 121 through 123 formed respectively in the etching areas 111 through 113; therefore, uniformity of etching in the surface 100s of the wafer 100 can be enhanced.

Now, FIGS. 18A through 18C and FIGS. 19A through 19C of the sixth embodiment (fourth experimental example) will be referenced. A comparison of the shallow trench illustrated in FIGS. 18A through 18C and the deep trench illustrated in FIGS. 19A through 19C reveals that in the deep trench illustrated in FIGS. 19A through 19C, deviation (inclination) of the depth direction from the perpendicular direction is relatively more conspicuous. Such inclination is less conspicuous in the shallow trench illustrated in FIGS. 19A through 19C. As such, to present a rough estimate, it is preferable to perform perpendicular irradiation such as that of this embodiment in cases where the depth of the recess formed is 8 μm or more, for example, or 10 μm or more, for example.

From the perspective of, for example, radiating light efficiently to a deep position in each of the recesses 121 through 123 formed, it is preferable that the UV light 431 radiated onto each of the etching areas 111 through 131 be parallel light in which the directions of all rays are aligned perpendicularly; however, it is allowable to adopt light other than parallel light (convergent light or diffused light). The concept of being "radiated perpendicularly" means that in the UV light 431 radiated onto each of the etching areas 111 through 113, the component radiated perpendicularly has the greatest intensity.

In order for etching conditions for the etching areas 111 through 113 to be uniform, it is preferred that the irradiation intensity of the UV light 431 in the etching areas 111 through 113 be uniform. Moreover, in order for etching depths for the etching areas 111 through 113 to be uniform, it is preferred that the cumulative irradiation energy of the UV light 431 in the etching areas 111 through 113 be uniform. The irradiation intensity is expressed in unit W/cm² and the irradiation energy is expressed in unit J/cm². The cumulative irradiation energy means the total amount of irradiation energy of the UV light 431 radiated up to the completion of the PEC etching in the etching areas 111 through 113 (completion of the formation of the recesses 121 through 123). The irradiation intensity and irradiation energy being "uniform" means that variation in the ratio of a maximum value to a minimum value is small, such as preferably 130% or less, more preferably 120% or less, even more preferably 110% or less.

The PEC etching method of this embodiment may be used preferably as a structure production method for forming structures on the wafer 100 by PEC etching. A PEC etching apparatus 400 constituting a structure production apparatus used for such a structure production method includes the container 410, the light irradiation device 430, and a control device 440, as illustrated in FIG. 24D. The control device 440 includes: a storage device storing, for example, data and a program for controlling the light irradiation device 430 and other such devices of the PEC etching apparatus 400 so that these devices perform prescribed operations; and a CPU for reading the program and the like from the storage device and executing same. The control device 440 may be formed from a personal computer, for example. A device that is a combination of the light irradiation device 430 and the control device 440 may be regarded as a light irradiation device.

The light irradiation device 430 includes a light source for emitting UV light and an optical device for guiding the UV light emitted from the light source to irradiate the wafer 100. If the UV light emitted from the light source is to be radiated directly onto the wafer 100, the optical device may be omitted. For the light source, there may be used a light source which emits light including UV light with a wavelength of shorter than 365 nm so as to enable PEC etching of GaN, and an ultraviolet light emitting diode (LED), ultraviolet laser, ultraviolet lamp, and the like may be used preferably therefor, for example. The optical device may include various optical members, as needed, so that the UV light 431 is radiated onto the wafer 100 under prescribed conditions. The various optical members may include: various types of lenses; various types of mirrors; an intensity distribution adjusting device for achieving a prescribed irradiation intensity distribution in an irradiation cross-section on the wafer 100 (the "irradiation cross-section" being a cross-section of light corresponding to the region that is being irradiated with the light); a cross-section shaping device for achieving a prescribed irradiation cross-section shape; a scanning device for moving the irradiation cross-section to a prescribed location on the wafer 100; a collimation optical system for obtaining parallel light; a chopper for performing intermittent light radiation on the wafer 100; a filter for adjusting the wavelength of the radiated light; etc. A digital micromirror device (DMD) may be used, for example, to regulate the irradiation cross-section shape of the UV light 431 radiated onto the wafer 100 into a prescribed pattern.

Figure 25A:
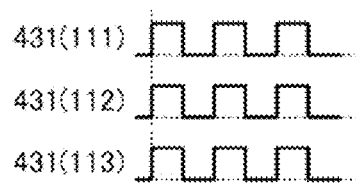
FIGS. 25A and 25B are timing charts each illustrating an example of a manner in which the PEC etching according to the seventh embodiment is carried out.
Figure 25B:
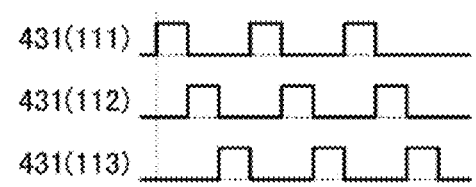

FIGS. 25A and 25B are timing charts each illustrating an example of a manner in which PEC etching according to this embodiment is carried out, and illustrate a manner in which the UV light 431 may be radiated onto the wafer 100. In a first example illustrated in FIG. 25A, the UV light 431 is radiated onto the etching areas 111 through 113 simultaneously. For performing radiation in this manner, it is preferable to radiate, for example, UV light 431 which has an irradiation cross-section of a size encompassing all the etching areas 111 through 113 and for which the irradiation intensity distribution in the irradiation cross-section is uniform. Accordingly, the irradiation intensity of the UV light 431 radiated onto the etching areas 111 through 113 can be made uniform. Also, the cumulative irradiation energy of the UV light 431 radiated onto the etching areas 111 through 113 can be made uniform accordingly. Note that FIG. 24D illustrates a plurality of arrows so as to make the components of the UV light 431 radiated on each of the etching areas 111 through 113 easy to ascertain, but this does not mean that a separate UV light 431 ray is to be radiated onto each of the etching areas 111 through 113; in this example, the UV light 431 illustrated in FIG. 24D is integrated (a single ray of) light that has an irradiation cross-section of a size encompassing all of the etching areas 111 through 113.

In this example, the UV light 431 is radiated onto the etching areas 111 through 113 simultaneously, so compared to the manner of radiation according to a second example described later, the time required to complete the formation of the recesses 121 through 123 can be shortened. Note that, if necessary, it is also possible to radiate separate UV light 431 (a plurality of rays) onto the respective etching areas 111 through 113 simultaneously.

It is preferable to radiate the UV light 431 onto the etching areas 111 through 113 intermittently. By doing so, a process in which $Ga_2O_3$ generated in a UV light 431 radiation period is dissolved in a UV light 431 non-radiation period is repeated. In other words, a process, in which $Ga_2O_3$ is formed extremely thinly and the $Ga_2O_3$ formed extremely thinly is dissolved, is repeated. Accordingly, flatness of the surface formed by etching can be increased compared to when performing a process in which $Ga_2O_3$ is formed thickly through continuous radiation of the UV light 431 and all of the thickly formed $Ga_2O_3$ is dissolved at once. Such intermittent radiation may be performed by, for example, turning the switch of the light source on and off, or by using a chopper. For the intermittent radiation, the length of the radiation period for one pulse and the length of the non-radiation period between two consecutive pulses may be set, as appropriate, through an experiment. It is possible to, by performing intermittent radiation, consume the electrons accumulated on the wafer 100 during the radiation period through nonradiative recombination, or the like, using the non-radiation period.

In the second example illustrated in FIG. 25B, the UV light 431 is radiated asynchronously onto the etching areas 111 through 113. In this manner of radiation, the irradiation cross-section of the UV light 431 may be moved over, so as to scan, the surface 100s of the wafer 100, for example. This movement is performed such that perpendicular radiation onto the surface 100s of the wafer 100 is maintained.

In this example, even a light source with a small output, i.e. a light source that is incapable of providing sufficient irradiation intensity for a wide irradiation cross-section, can be used to perform PEC etching on the wafer 100 with a large diameter by moving a narrow irradiation cross-section with which sufficient irradiation intensity can be achieved.

As described in the first example, it is preferable to perform intermittent radiation in the second example as well. Note that in the second example, since a non-radiation period is interposed due to movement of the light, irradiation of the etching areas 111 through 113 is intermittent.

Next, a first variation of the seventh embodiment will be described. In this variation, described will be a case in which two or more wafers 100 are PEC etched using a single container 410. Herebelow, a specific example will be described in which PEC etching is performed on two wafers 100, but PEC etching for three or more wafers 100 can be performed on the basis of the same concept.

Figure 26:
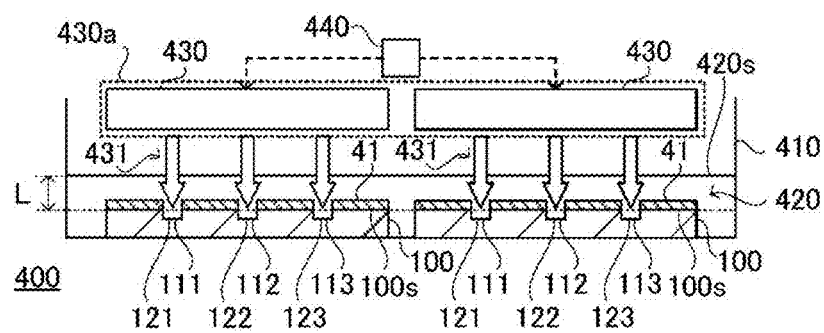
FIG. 26 is a schematic diagram illustrating an example of a manner in which PEC etching according to a first variation of the seventh embodiment is carried out.

FIG. 26 is a schematic diagram illustrating an example of a manner in which electrodeless PEC etching according to this variation is carried out. In this variation, the container 410 is configured to be capable of accommodating two or more wafers 100. Similarly to the process described with reference to FIG. 24A, two, first and second, wafers 100 are prepared.

Similarly to the process described with reference to FIG. 24C, the first and second wafers 100 are accommodated in the container 410. Specifically, the first and second wafers 100 are accommodated in the container 410 in a condition in which surfaces 100s of the first and second wafers 100 are immersed in the etching liquid 420 in a manner such that the surfaces 100s of the first and second wafers 100 are both parallel with the surface of the etching liquid 420 and the distance from the surface 100s of the first wafer 100 to the surface 420s of the etching liquid 420 and the distance from the surface 100s of the second wafer 100 to the surface 420s of the etching liquid 420 are the same distance L.

Similarly to the process described with reference to FIG. 24D, in a condition in which the first and second wafers 100 and the etching liquid 420 are still, the UV light 431 is radiated from light irradiation devices 430 perpendicularly onto surfaces of etching areas 111 through 113 of both the first and second wafers 100. Note that although FIG. 26 illustrates a configuration in which a separate light irradiation device 430 is provided for each of the first and second wafers 100, it is also possible to adopt a configuration in which a single light irradiation device 430 (light irradiation device 430a illustrated in FIG. 26) is provided for the two wafers 100.

As described in the seventh embodiment, in this variation, uniformity of etching in the surfaces 100s of the first and second wafer 100 can be enhanced. Moreover, in this variation, the PEC etching is performed while making the distance from the surface 100s of the first wafer 100 to the surface 420s of the etching liquid 420 and the distance from the surface 100s of the second wafer 100 to the surface 420s of the etching liquid 420 the same distance L. In this way, the thickness of the etching liquid 420 located above the etching areas 111 through 113 of both wafers 100 can be made uniform. As a result, it is possible to limit variation in the condition in which (at least one from among) OH⁻ and $S_2O_8^{2-}$ (or $SO_4^{-*}$) are (is) supplied between the etching areas 111 and the like of the first wafer 100 and the etching areas 111 and the like of the second wafer 100; therefore, uniformity of etching between both wafers 100 can be enhanced.

From the perspective of enhancing uniformity of etching, it is more preferred that the irradiation intensity and/or cumulative irradiation energy of the UV light 431 radiated onto the etching areas 111 through 113 be the same between both wafers 100. In order to make the irradiation intensity and/or cumulative irradiation energy the same between both wafers 100, a single light irradiation device 430 (430a) may be provided for both wafers 100 and UV light 431, which has an irradiation cross-section of a size encompassing all etching areas 111 through 113 in both wafers 100 and has a uniform irradiation intensity distribution in the irradiation cross-section, may be radiated, for example. In such an example, the UV light 431 illustrated in FIG. 26, i.e. the UV light 431 radiated onto both wafers 100 from a single light irradiation device 430a, is integrated (a single ray of) light that has an irradiation cross-section of a size encompassing all the etching areas 111 through 113 of both wafers 100 (the plurality of arrows in FIG. 26 illustrate components of the integrated (single ray of) UV light 431 that are radiated onto the respective etching areas 111 through 113 of both wafers 100).

Figure 27:
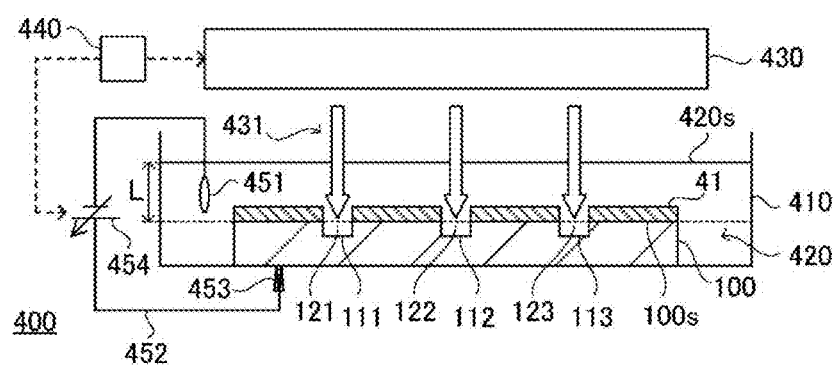
FIG. 27 is a schematic diagram illustrating an example of a manner in which PEC etching according to a second variation of the seventh embodiment is carried out.

Next, a second variation of the seventh embodiment will be described. The feature described in the seventh embodiment may be applied to electrode-based PEC etching. FIG. 27 is a schematic diagram illustrating an example of a manner in which electrode-based PEC etching according to this variation is carried out. The PEC etching apparatus 400 of this variation is configured such that the PEC etching apparatus 400 according to the seventh embodiment is further equipped with a cathode electrode 451, a wire 452, an ohmic contact probe 453, and a voltage source 454. The etching liquid 420 of this variation does not have $K_2S_2O_8$ added, and contains OH⁻ but does not contain $S_2O_8^{2-}$.

Similarly to the second embodiment (first experimental example), the cathode electrode 451 is immersed in the etching liquid 420 and is electrically connected to the ohmic contact probe 453 via the wire 452. The ohmic contact probe 453 is electrically connected to the wafer (anode electrode) 100 without contacting (while being electrically insulated from) the etching liquid 420. While being sealed from the etching liquid 420, the ohmic contact probe 453 is connected to the rear surface of the wafer 100 from the side of the bottom face of the container 410, for example. A structure enabling such connection is formed on the bottom face of the container 410. The voltage source 454 applies an etching voltage under the conditions described in the second embodiment (first experimental example) by being controlled by the control device 440. As a result, it is possible to control the etching conditions based on the etching voltage.

In this variation as well, the wafer 100 is accommodated in the container 410 in a manner such that the surface 100s of the wafer 100 is parallel with the surface 420 of the etching liquid 420, and the UV light 431 is radiated onto the etching areas 111 through 113 perpendicularly in a condition in which the wafer 100 and the etching liquid 420 are still. Accordingly, similarly to the seventh embodiment, uniformity of etching in the surface 100s of the wafer 100 can be enhanced.

Eighth Embodiment

Next, an eighth embodiment will be described. Due to PEC etching, nitrogen gas ($N_2$ gas) occurs as indicated in (chem. 1), oxygen gas ($O_2$ gas) occurs as indicated in (chem. 3), and hydrogen gas ($H_2$ gas) occurs as indicated in (chem. 4) or (chem. 7). Thus, a bubble 130 containing at least one from among $N_2$ gas, $O_2$ gas, and $H_2$ gas occurs in the etching liquid 420. When the UV light 431 is radiated onto the etching areas 111 and the like of the wafer 100 in a condition in which an excessive amount of bubbles 130 have adhered thereon, it is difficult to properly radiate the light onto the etching areas 111 and the like due to, for example, the light being diffused by the bubbles 130.

Moreover, the etching liquid 420 used for PEC etching degrades due to various types of reactions accompanying the PEC etching. If the etching liquid 420 degrades excessively, the PEC etching cannot proceed properly.

The eighth embodiment describes a manner of PEC etching in which bubbles 130 adhering to the wafer 100 are removed. The eighth embodiment also describes a manner of PEC etching in which the etching liquid 420 is replenished.

Figure 28:
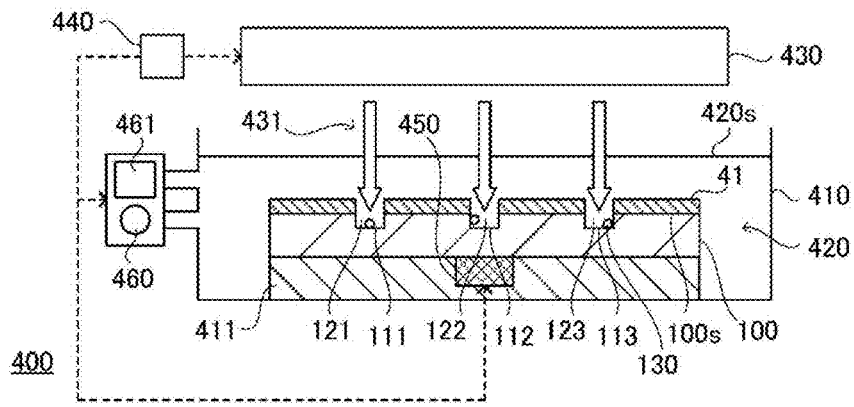
FIG. 28 is schematic diagram illustrating an example of a manner in which PEC etching according to an eighth embodiment is carried out.

FIG. 28 is a schematic diagram illustrating an example of a manner in which PEC etching according to the eighth embodiment is carried out. The following example employs electrodeless PEC etching, but also when employing electrode-based PEC etching, the same concept can be used to remove the bubble 130 and replenish the etching liquid 420. The PEC etching apparatus 400 of this embodiment is configured such that the PEC etching apparatus 400 according to the seventh embodiment is further equipped with a support 411, a vibration generator 450, a pump 460, and a tank 461.

The vibration generator 450 imparts vibration to a bubble 130 to remove (detach) the bubble 130 adhering to the wafer 100 from the wafer 100. An ultrasound generator may be used as the vibration generator 450, for example. This embodiment illustrates a configuration in which the support 411 for the wafer 100 is provided on the bottom face of the container 410 and a vibration member (e.g. ultrasonic vibrator) of the vibration generator 450 is provided in the support 411. The vibration generator 450 vibrates the rear surface of the wafer 100 and vibration is imparted to the bubble 130 via the wafer 100. The manner of installing the vibration generator 450 is not limited to the aforementioned, and the vibration generator 450 may be attached to an outer surface of the container 410, for example. When installed in this manner, the vibration generator 450 vibrates the etching liquid 420 via the container 410 and vibration is imparted to the bubble 130 via the etching liquid 420. Alternatively, the vibration generator 450 may be installed by being embedded in the container 410 itself. The vibration generator 450 is an example of a bubble removal device. The vibration generator 450 performs a prescribed operation by being controlled by the control device 440. A device that is a combination of the vibration generator 450 and the control device 440 may be regarded as a vibration generator.

A flow path for sending the etching liquid 420 from the container 410 toward the pump 460 side and a flow path for sending the etching liquid 420 from the pump 460 side into the container 410 are connected to the container 410 in this embodiment. The pump 460 enables supply and discharge of the etching liquid 420. A new etching liquid 420 accommodated in the tank 461 is supplied into the container 410 by the pump 460. In this way, the etching liquid 420 is replenished in the container 410. The old etching liquid 420 discharged from the container 410 as the new etching liquid 420 is supplied may be discarded (recovered). However, as long as there is no significant impact on the etching result (if the concentrations of the various components are not changed significantly), the etching liquid 420 in the container 410 may be increased in accordance with the supply of the new etching liquid 420. The pump 460 and the tank 461 are examples of an etching liquid replenishment device. The pump 460 performs a prescribed operation by being controlled by the control device 440. A device that is a combination of the pump 460 and the control device 440 may be regarded as a pump.

Figure 29:
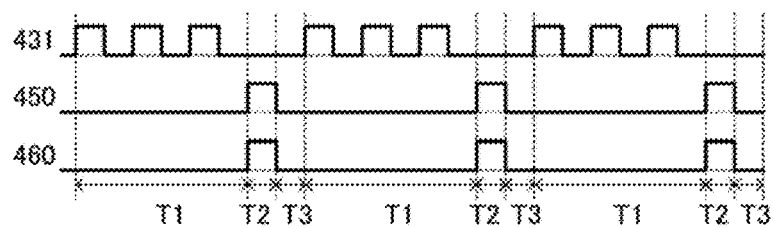
FIG. 29 is a timing chart illustrating an example of a manner in which the PEC etching according to the eighth embodiment is carried out.

FIG. 29 is a timing chart illustrating an example of a manner in which PEC etching according to the eighth embodiment is carried out, and illustrates a manner in which the UV light 431 may be radiated onto the wafer 100 and a manner in which the vibration generator 450 and the pump 460 may operate.

Prior to radiation of the UV light 431 onto the wafer 100, similarly to the seventh embodiment, the wafer 100 is prepared, the etching liquid 420 is prepared in the container 410, and the wafer 100 is accommodated in the container 410. Accordingly, the wafer 100 is disposed while the surface 100s of the wafer 100 is in contact with the etching liquid 420.

Then, in a period T1, a process of radiating the UV light 431 onto the surface 100s of the wafer 100 (referred to as "irradiation process" below) is performed. This example illustrates a case where in the irradiation process, light is radiated onto the plurality of etching areas 111 and the like simultaneously. In other words, in the irradiation process, the UV light 431 is radiated onto the wafer 100 similarly to the manner described with reference to FIG. 25A in the seventh embodiment. Note, however, that the irradiation process may be performed in a manner such that light is radiated onto the plurality of etching areas 111 and the like asynchronously as described with reference to FIG. 25B.

After the irradiation process, in a period T2, a process of removing a bubble 130 adhering to the wafer 100 from the wafer 100 by operating the vibration generator 450 (referred to as "bubble removal process" below) is carried out. Moreover, in the period T2, a process of replenishing the etching liquid 420 in the container 410 by operating the pump 460 (referred to as "replenishment process" below) is carried out.

By radiating the UV light 431 from the upper side in the irradiation process, the recesses 121 and the like open on the upper side are formed. Accordingly, removal of the bubble 130 from inside the recesses 121 and the like by floating the bubble 130 is facilitated.

As described above, in the irradiation process, the UV light 431 is radiated in a condition in which the wafer 100 and the etching liquid 420 are still. In the bubble removal process, the etching liquid 420 undergoes movement due to removal of the bubble 130. In the replenishment process, the etching liquid 420 also undergoes movement due to replenishment of the etching liquid 420. Thus, it is preferable to carry out the bubble removal process and the replenishment process in a different period from the irradiation process. In other words, it is preferred that the UV light 431 not be radiated on the surface 100s of the wafer 100 in the period T2 in which the bubble removal process and/or the replenishment process is/are performed.

After the bubble removal process and the replenishment process, in a period T3, a process of waiting for the etching liquid 420 to become still (also referred to as "stillness awaiting process" below) is carried out. In other words, preparation for performing another irradiation process in a condition in which the etching liquid 420 has become still is carried out. The stillness awaiting process may be carried out by, for example, the control device 440 measuring time so as to confirm whether the period T3 determined in advance has elapsed after the end of the period T2. The length of the period T3 required for the etching liquid 420 to become still may be determined through an experiment, for example.

A process constituted by a set including the irradiation process, the bubble removal process plus the replenishment process, and the stillness awaiting process is repeated a plurality of times. The recesses 121 and the like are deeper as the number of this repetition is larger. When the recesses 121 and the like reach a prescribed depth (i.e. when the formation of the recesses 121 and the like is complete), the PEC etching is terminated.

In this embodiment, the irradiation process and the bubble removal process (or the replenishment process) are repeated a plurality of times alternately, and the stillness awaiting process is placed between the bubble removal process (or the replenishment process) and the irradiation process performed immediately after the bubble removal process (or the replenishment process). It can be said that the period in which the bubble 130 is removed from the wafer 100 in the bubble removal process (or the period in which the etching liquid 420 is replenished in the replenishment process) and the period in which the UV light 431 is radiated onto the surface 100s of the wafer 100 in the irradiation process performed immediately after the bubble removal process (or the replenishment process) are non-continuous.

In the irradiation process (during the period T1), the UV light 431 is radiated intermittently. When such intermittent radiation is performed, the degree to which bubbles 130 adhere to the wafer 100 (the coverage rate of the bubbles 100 covering the wafer 100) increases as the number of times of light radiation increases. The timing at which the period T2 is started, i.e. the length of the period Ti, is set so that the bubble removal process (period T2) starts before the adhesion of the bubbles 130 becomes excessive. The timing at which the period T2 is started and the length of the period T2 required for the bubble(s) 130 to be removed adequately may be determined through an experiment, for example.

It is possible to adopt a manner in which, for every single pulse of the intermittent radiation, the bubble 130 is removed and the period for the etching liquid 420 to become still is waited; however, with this manner, the non-radiation period between two consecutive pulses cannot be made to be shorter than or equal to the period for removing the bubble 130 and waiting until the etching liquid 420 becomes still. In this embodiment, compared to this manner, a plurality of pulses are radiated (the intermittent radiation is performed) up to a point before adhesion of the bubbles 130 becomes excessive within a single irradiation process, so the non-radiation period between two consecutive pulses can be shortened and hence PEC etching can be performed time-efficiently.

It is not always necessary to carry out both the bubble removal process and the replenishment process together in the period T2. For example, within the repetitions, the bubble removal process may be performed without the replenishment process in a certain period T2, then in a different period T2, both the bubble removal process and the replenishment process may be performed. The length of the stillness awaiting process (period T3) may be varied between when the process is performed immediately after a period T2 in which the bubble removal process is performed without the replenishment process and when the process is performed immediately after a period T2 in which both the bubble removal process and the replenishment process are performed, for example. If the time required for the etching liquid 420 to become still is longer for the replenishment process than the bubble removal process, the stillness awaiting process (period T3) performed immediately after the period T2 in which the replenishment process is performed may be made longer than the stillness awaiting process (period T3) performed immediately after the period T2 in which the replenishment process is not performed, for example.

Both the bubble removal process and the replenishment process are processes that induce movement of the etching liquid 420. Thus, if both the bubble removal process and the replenishment process are to be performed, from the perspective of shortening the length of the stillness awaiting process (period T3), it is preferred that the bubble removal process and the replenishment process be performed simultaneously (i.e. the period for removing the bubble 130 from the wafer 100 and the period for replenishing the etching liquid 420 in the container 410 overlap each other in terms of time).

As described above, according to this embodiment, through removal of bubbles 130, it is possible to limit the occurrence of a case where proper light radiation is difficult due to adhesion of a bubble 130 on the wafer 100. Moreover, through replenishment of the etching liquid 420, it is possible to limit the occurrence of a case where the PEC etching cannot proceed properly due to degradation of the etching liquid 420. In this way, according to this embodiment, PEC etching can be performed while limiting variations in etching conditions in terms of time.

The flow of the etching liquid 420 generated by the pump 460 may have the action of removing the bubble 130 in the replenishment process. Use of the vibration generator 450 makes the removal of the bubble 130 more reliable. The surfactant added to the etching liquid 420 demonstrates an effect to make the bubble 130 less adherable to the wafer 100.

Note that in the second embodiment (first experimental example), when the pump 380 agitates the electrolyte solution 320 in the container 310 (the first five seconds of the period in which the UV light radiation and the etching voltage application are stopped (illustrated in FIG. 5)), the electrolyte solution (etching liquid) 320 is replenished. Moreover, the agitation by the pump 380 in the second embodiment (first experimental example) may have the action of removing a bubble. Further, in the second embodiment (first experimental example), the period extending from completion of the agitation by the pump 380 until the start of the next UV light radiation and etching voltage application (the latter four seconds of the period in which the UV light radiation and the etching voltage application are stopped (illustrated in FIG. 5)) is a period for waiting for the electrolyte solution (etching liquid) 320 to become still.

Next, a first variation of the eighth embodiment will be described. As the PEC etching proceeds, the recesses 121 and the like formed in the etching areas 111 and the like become deeper. As the recesses 121 and the like are deeper, the bubble 130 adhering to the vicinity of the bottom of the recesses is more difficult to remove. Thus, in this variation, the bubble removal process is made longer as the recesses 121 and the like formed are deeper.

Figure 30:
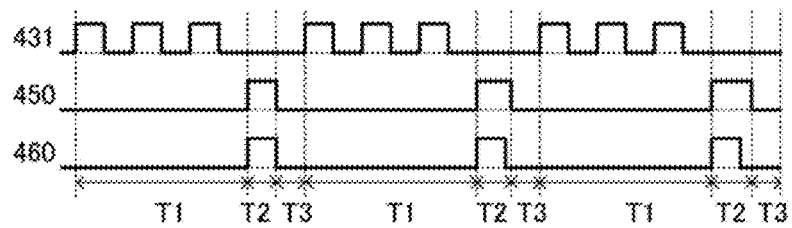
FIG. 30 is a timing chart illustrating an example of a manner in which PEC etching according to a first variation of the eighth embodiment is carried out.

FIG. 30 is a timing chart illustrating an example of a manner in which PEC etching according to this variation is carried out. A difference from the timing chart of the eighth embodiment illustrated in FIG. 29 will be described. In this variation, in the plurality of repetitions of the process constituted by a set including the irradiation process, the bubble removal process plus the replenishment process, and the stillness awaiting process, the period T2 for removing the bubble 130 from the wafer 100 is made longer for a bubble removal process that is performed later. As a result, removal of the bubble 130 when the recesses 121 and the like are deeper can be performed more reliably.

Next, a second variation of the eighth embodiment will be described. As the PEC etching proceeds, the recesses 121 and the like formed in the etching areas 111 and the like become deeper. As the recesses 121 and the like are deeper, the etching liquid 420 in the vicinity of the bottom of the recesses becomes still more easily. Thus, in this variation, the stillness awaiting process is made shorter as the recesses 121 and the like formed are deeper.

Figure 31:
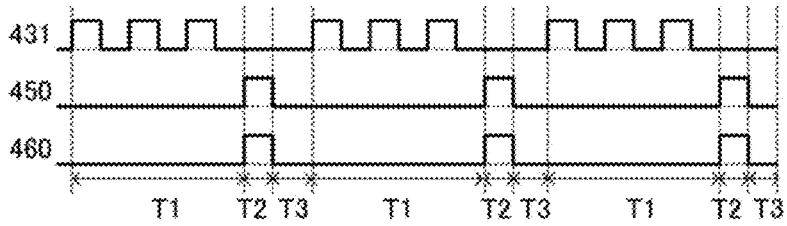
FIG. 31 is a timing chart illustrating an example of a manner in which PEC etching according to a second variation of the eighth embodiment is carried out.

FIG. 31 is a timing chart illustrating an example of a manner in which PEC etching according to this variation is carried out. A difference from the timing chart of the eighth embodiment illustrated in FIG. 29 will be described. In this variation, in the plurality of repetitions of the process constituted by a set including the irradiation process, the bubble removal process plus the replenishment process, and the stillness awaiting process, the period T3 for waiting for the etching liquid 420 to become still is made shorter for a stillness awaiting process that is performed later. As a result, the time required to complete the formation of the recesses 121 through 123 can be shortened.

Figure 32A:
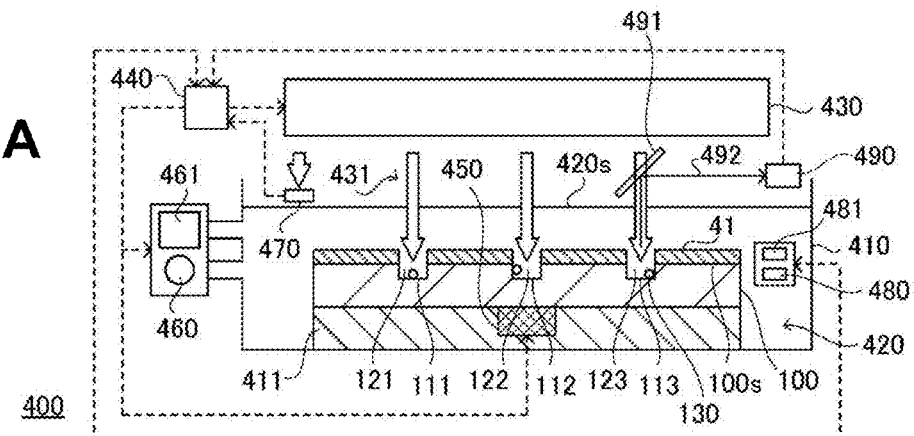
FIGS. 32A and 32B are schematic diagrams respectively illustrating examples of manners in which PEC etching according to third and fourth variations of the eighth embodiment is carried out.

Next, a third variation of the eighth embodiment will be described. FIG. 32A is a schematic diagram illustrating an example of a manner in which PEC etching according to this variation is carried out. The PEC etching apparatus 400 of this variation is configured such that the PEC etching apparatus 400 according to the eighth embodiment is further equipped with an optical sensor 470, a temperature sensor 480, a temperature adjuster 481, a bubble sensor 490, and a dichroic mirror 491.

The optical sensor 470 measures the irradiation intensity and/or irradiation energy of the UV light 431. Data corresponding to the result of measurement by the optical sensor 470 is input in the control device 440. The control device 440 controls the light irradiation device 430 such that variation in the irradiation intensity or irradiation energy of the UV light 431 radiated onto the surface 100s of the wafer 100 in the irradiation process is limited on the basis of the measurement of the irradiation intensity or irradiation energy of the UV light 431 by the optical sensor 470. In this way, according to this variation, variation in etching conditions can be limited.

The temperature sensor 480 measures the temperature of the etching liquid 420. By being controlled by the control device 440, the temperature adjuster 481 adjusts the temperature of the etching liquid 420 to a prescribed temperature. Data corresponding to the result of measurement by the temperature sensor 480 is input in the control device 440. The control device 440 controls the temperature adjuster 481 such that variation in the temperature of the etching liquid 420 in the irradiation process is limited on the basis of the measurement of the temperature of the etching liquid 420 by the temperature sensor 480. A device that is a combination of the temperature adjuster 481 and the control device 440 may be regarded as a temperature adjuster. In this way, according to this variation, variation in etching conditions can be limited.

The bubble sensor 490 measures the bubble 130 having adhered to the wafer 100. The bubble sensor 490 may be an imaging device such as a CCD camera, for example, and observes the bubble 130 using visible light 492. Data corresponding to the result of measurement by the bubble sensor 490 is input in the control device 440. The control device 440 obtains the coverage rate of the bubbles 130 adhering to the wafer 100 on the basis of the result of measurement of the bubbles 130 by the bubble sensor 490. A device that is a combination of the bubble sensor 490 and the control device 440 may be regarded as a bubble sensor.

The dichroic mirror 491 illustrated in FIG. 32A transmits the UV light 431 and reflects the visible light 492. The dichroic mirror 491 is placed on an optical path of the UV light 431 radiated onto the wafer 100 and guides the UV light 431 to the wafer 100. The dichroic mirror 491 guides, to the bubble sensor 490, the visible light 492 that runs from the inside of the recesses 121 and the like formed in the etching areas 111 and the like toward the dichroic mirror 491. As the visible light 492 used to observe the bubble 130, illumination light may be used, or if the light emitted from the light irradiation device 430 includes visible light, this visible light may be used.

In this way, in this variation, it is possible to observe the bubble 130 adhering to the inside of the recesses 121 and the like formed in the etching areas 111 and the like while radiating the UV light 431 used for the PEC etching of the etching areas 111 and the like. FIG. 32A illustrates a case where the dichroic mirror 491 is placed so as to correspond to a specific etching area (etching area 113 as a representative example) and radiation of the UV light 431 and observation of the bubble 130 are carried out for the etching area 113 by means of the dichroic mirror 491. To present another example, a dichroic mirror 491 may be placed so as to correspond to all of the etching areas 111 through 113 and radiation of the UV light 431 and observation of the bubble 130 may be carried out for the etching areas 111 through 113 by means of this dichroic mirror 491. Observation using the bubble sensor 490 makes it possible to confirm how the PEC etching is proceeding. The bubble 130 coverage rate obtained by using the bubble sensor 490 may be referenced for the purpose of determining the timing at which to start the period T2 for performing the bubble removal process.

Figure 32B:
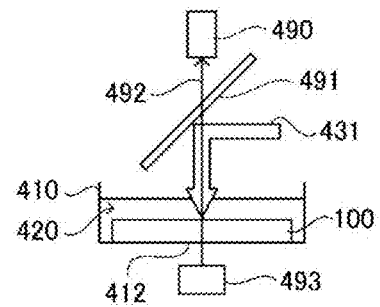

Next, a fourth variation of the eighth embodiment will be described. FIG. 32B is a schematic diagram illustrating an example of a manner in which PEC etching according to this variation is carried out. A difference from the third variation of the eighth embodiment will be described. The dichroic mirror 491 illustrated in the third variation of the eighth embodiment is configured to transmit the UV light 431 and reflect the visible light 492, whereas the dichroic mirror 491 illustrated in this variation is configured to reflect the UV light 431 and transmit the visible light 492. Accordingly, in this variation, the UV light 431 reflected by the dichroic mirror 491 is radiated onto the wafer 100, and the visible light 492 transmitted by the dichroic mirror 491 enters the bubble sensor 490.

The PEC etching apparatus 400 of this variation includes an illumination device 493 that radiates the visible light 492 onto the wafer 100. FIG. 32B illustrates the illumination device 493 that is provided for transmitted illumination. In this example, a visible light transmission window 412 is provided in the bottom of the container 410 and the visible light 492 emitted from the illumination device 493 and transmitted through the visible light transmission window 412 and the wafer 100 is radiated on the recesses 121 and the like formed in the etching areas 111 and the like. The visible light 492 radiated onto the recesses 121 and the like passes through the etching liquid 420 and the dichroic mirror 491 and enters the bubble sensor 490. The wafer 100, constituted by GaN over the entire thickness thereof, transmits the visible light 492, so transmitted illumination can be used. Note, however, that although this example employs transmitted illumination, it is also possible to employ episcopic illumination.

Figure 33:
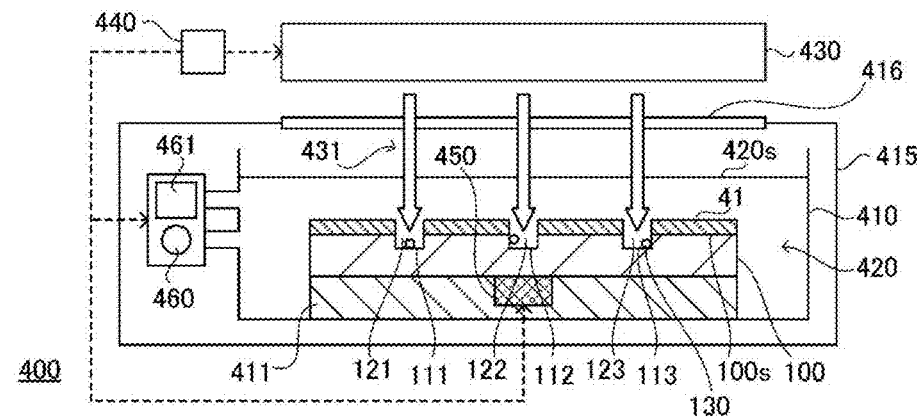
FIG. 33 is a schematic diagram illustrating an example of a manner in which PEC etching according to a fifth variation of the eighth embodiment is carried out.

Next, a fifth variation of the eighth embodiment will be described. FIG. 33 is a schematic diagram illustrating an example of a manner in which PEC etching according to this variation is carried out. The PEC etching apparatus 400 of this variation is configured such that the PEC etching apparatus 400 according to the eighth embodiment is further equipped with a pressurized container 415.

The pressurized container 415 is configured to be capable of accommodating the container 410, and the PEC etching of this variation is carried out with the wafer 100 and the etching liquid 420 being accommodated in the pressurized container 415. Thus, in this variation, the irradiation process, bubble removal process, replenishment process, and stillness awaiting process are carried out in the pressurized container 415. In the example illustrated in FIG. 33, the pressurized container 415 includes a UV light transmission window 416, and the UV light 431 emitted from the light irradiation device 430 disposed outside the pressurized container 415 is radiated onto the wafer 100 through the UV light transmission window 416. If necessary, it is possible to adopt a configuration in which the light irradiation device 430 also is disposed within the pressurized container 415.

In this example, the PEC etching is performed in the pressurized container 415 under a pressurized condition with a higher pressure than atmosphere, so enlargement of the bubble 130 can be suppressed and an increase in the bubble 130 coverage rate can be moderated. As such, it is possible to lengthen the period Ti of a single irradiation process, i.e. increase the number of times light is radiated (number of pulses) in intermittent radiation within a single irradiation process, as well as reducing the number of times the bubble removal process is performed, so PEC etching can be carried out more time-efficiently.

Ninth Embodiment

Next, a ninth embodiment will be described. The eighth embodiment illustrates a manner in which the bubble 130 is removed by imparting vibration to the bubble 130. The ninth embodiment illustrates a manner in which the bubble 130 is removed by generating a flow of the etching liquid 420. The ninth embodiment also describes a manner in which a flow of the etching liquid 420 is generated so as to replenish the etching liquid 420 as well as removing the bubble 130.

Figure 34A:
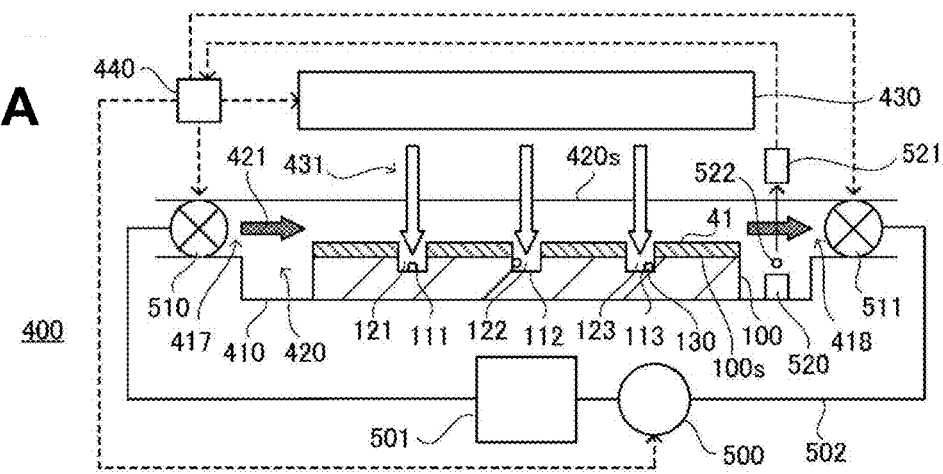
FIGS. 34A and 34B are schematic diagrams each illustrating an example of a manner in which PEC etching according to a ninth embodiment is carried out.
Figure 34B:
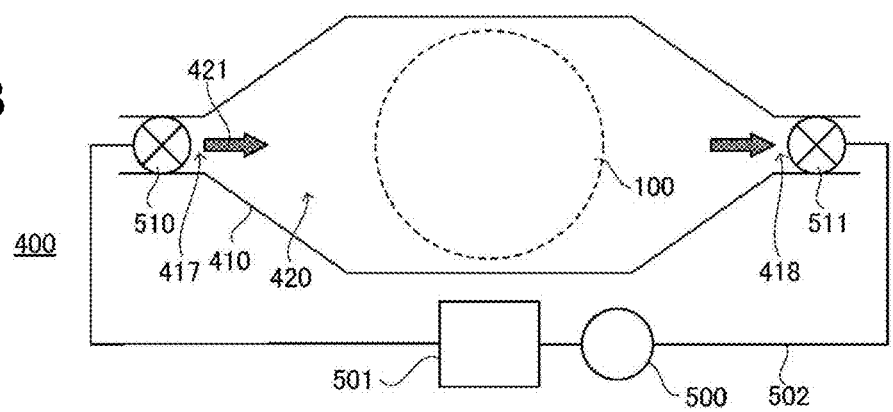

FIGS. 34A and 34B are schematic diagrams each illustrating an example of a manner in which PEC etching according to a ninth embodiment is carried out. The following example employs electrodeless PEC etching, but also when employing electrode-based PEC etching, the same concept can be used to remove bubbles 130 and replenish the etching liquid 420. The PEC etching apparatus 400 of this embodiment is configured such that the PEC etching apparatus 400 according to the seventh embodiment is further equipped with a pump 500, tank 501, external flow path 502, upstream valve 510, downstream valve 511, flow measurement bubble emission device 520, and flow sensor 521. FIG. 34A schematically illustrates a cross-sectional structure of the container 410 as viewed from a lateral side direction, and FIG. 34B schematically illustrates an upper-side structure of the container 410 as viewed from the upper side. Note that in FIG. 34B, part of the equipment composing the PEC etching apparatus 400 are omitted to simplify illustration.

In the container 410 of this embodiment, openings 417 and 418 are provided at ends of the container 410 on the upstream side and downstream side, respectively, in terms of a flow 421 of the etching liquid 420 that is generated. The external flow path 502 is provided so as to connect the downstream opening 418 and the upstream opening 417 of the container 410. The container 410 and the external flow path 502 form a flow path through which the etching liquid 420 circulates. The pump 500 is disposed on an intermediate point of the external flow path 502. The etching liquid 420 circulates as a result of the pump 500 generating the flow 421 that traverses the interior of the container 410 from the upstream opening 417 toward the downstream opening 418.

The pump 500 generates the flow 421 of the etching liquid 420 in the container 410 to remove (detach) the bubble 130 adhering to the wafer 100 from the wafer 100. The pump 500 is another example of the bubble removal device. The pump 500 performs a prescribed operation by being controlled by the control device 440. A device that is a combination of the pump 500 and the control device 440 may be regarded as a pump.

The upstream valve 510 switches between a state in which the etching liquid 420 can pass through the upstream opening 417 of the container 410 and a state in which same cannot pass therethrough. The downstream valve 511 switches between a state in which the etching liquid 420 can pass through the downstream opening 418 of the container 410 and a state in which same cannot pass therethrough. Each of the upstream valve 510 and the downstream valve 511 performs a prescribed operation by being controlled by the control device 440. A device that is a combination of the upstream valve 510 and the control device 440 may be regarded as an upstream valve, and a device that is a combination of the downstream valve 511 and the control device 440 may be regarded as a downstream valve.

The tank 501 is disposed on an intermediate point of the external flow path 502. A new etching liquid 420 accommodated in the tank 501 is supplied into the container 410 while being merged with the flow 421 by the pump 500. In this way, the etching liquid 420 is replenished in the container 410. The old etching liquid 420 discharged from the container 410 as the new etching liquid 420 is supplied may be discarded (recovered). However, as long as there is no significant impact on the etching result (if the concentrations of the various components are not changed significantly), the etching liquid 420 in the container 410 may be increased in accordance with the supply of the new etching liquid 420. The pump 500 and the tank 501 are another example of the etching liquid replenishment device.

The flow (movement) measurement bubble emission device 520 emits a bubble 522 formed from $N_2$ gas, or the like, into the etching liquid 420. The flow measurement bubble emission device 520 may be disposed, for example, downstream from the wafer 100 in the flow 421. The flow (movement) sensor 521 may be an imaging device such as a CCD camera, for example, and measures (observes) the bubble 521 in the etching liquid 420. Data corresponding to the result of measurement by the flow sensor 521 is input in the control device 440. The control device 440 uses the result of measurement by the flow sensor 521 to determine whether the etching liquid 420 is flowing (moving), i.e. whether the etching liquid 420 is still. A device that is a combination of the flow sensor 521 and the control device 440 may be regarded as a flow (movement) sensor.

Figure 35:
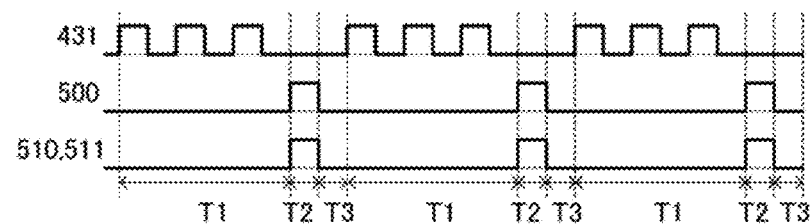
FIG. 35 is a timing chart illustrating an example of a manner in which the PEC etching according to the ninth embodiment is carried out.

FIG. 35 is a timing chart illustrating an example of a manner in which PEC etching according to the ninth embodiment is carried out, and illustrates a manner in which the UV light 431 may be radiated onto the wafer 100 and a manner in which the pump 500, the upstream valve 510, and the downstream valve 511 may operate. The irradiation process performed in the period T1 is equivalent to the eighth embodiment.

After the irradiation process, the pump 500 is operated in the period T2. At the timing when the period T2 is started, the upstream valve 510 and the downstream valve 511 are opened. Thus, the flow 421 of the etching liquid 420 is generated in the container 410 so as to carry out the bubble removal process and the replenishment process.

At the timing when the period T2 is ended, the upstream valve 510 and the downstream valve 511 are closed. Closing the upstream valve 510 and the downstream valve 511 at the timing when the period T2 is ended may be regarded as a process of attenuating the flow of the etching liquid 420. The upstream valve 510 and the downstream valve 511 are an example of a flow attenuation device that attenuates the flow of the etching liquid 420.

After the bubble removal process and the replenishment process, in the period T3, the stillness awaiting process is carried out. In the stillness awaiting process, whether the etching liquid 420 has become still is determined on the basis of the measurement by the flow sensor 521 (sensor for measuring movement of the etching liquid 420). In other words, the length of the period T3 is set as the time required to determine that the etching liquid 420 has become still on the basis of the measurement by the flow sensor 521.

Similarly to the eighth embodiment, a process constituted by a set including the irradiation process, the bubble removal process plus the replenishment process, and the stillness awaiting process is repeated a plurality of times. When the recesses 121 and the like reach a prescribed depth (i.e. when the formation of the recesses 121 and the like is complete), the PEC etching is terminated.

In this embodiment as well, similarly to the eighth embodiment, through removal of bubbles 130, it is possible to limit the occurrence of a case where proper light radiation is difficult due to adhesion of the bubble 130 on the wafer 100. Moreover, through replenishment of the etching liquid 420, it is possible to limit the occurrence of a case where the PEC etching cannot proceed properly due to degradation of the etching liquid 420.

Note that in the irradiation process (period T1), the irradiation process may be carried out while performing the measurement using the flow sensor 521 to confirm that the etching liquid 420 is still. For the purpose of attenuating more reliably the flow 421 of the etching liquid 420 generated in the bubble removal process and replenishment process, a shutter device that blocks the flow 421 may be added.

Other Embodiments

Embodiments and variations of the present invention have been described above by way of specific examples. However, the present invention is not limited to the above embodiments and variations, and can undergo, for example, changes, improvements, or combinations in various ways within the scope of the invention.

The aforementioned PEC etching can be used preferably as part of a method for producing a semiconductor device in which a GaN material is used. For example, this PEC etching can be used for a structure formation method when producing a Schottky barrier diode using the GaN material 100 according to the second embodiment (an epitaxial substrate 30 in which an epitaxial layer 20 is constituted by a GaN layer to which n-type impurities have been added).

To cite another example, this PEC etching can be used for a structure formation method when producing a superjunction (SJ) structure by forming a trench in an n-type area of an epitaxial layer 20 and regrowing (loading) a p-type epitaxial layer in the trench (see FIG. 22A); here, the conductive type may be reversed and an n-type epitaxial layer may be regrown (loaded) in a trench formed in a p-type epitaxial layer 20.

Furthermore, the aforementioned PEC etching can be used as a structure formation method when producing a pn junction diode or a transistor using the GaN material 100 according to the third embodiment (an epitaxial substrate 30 in which an epitaxial layer 20 includes a GaN layer to which n-type impurities have been added and a GaN layer to which p-type impurities have been added). For example, this PEC etching can be used for the formation of a mesa structure or the formation of a ridge structure of a laser diode.

It is also possible to carry out processing in which this PEC etching is used to remove only a p-type GaN layer constituting the surface layer of an n-p layered structure, as exemplified by the case of producing a junction barrier Schottky (JBS) diode.

The constitution of the epitaxial layer 20 can be selected, as appropriate, according to need and, for example, may include a GaN layer to which no electroconductive impurities are added or may be constituted by a layered structure of, for example, n-p-n. This PEC etching may be carried out exclusively on a specific layer of an epitaxial layer 20 having a layered structure. The GaN substrate is not limited to the substrate 10 described in the first embodiment and a GaN substrate having an area having an adequately low dislocation density (for example, lower than $1\times10^7/cm^2$) is used preferably. The electroconductivity of the substrate 10 may be selected, as appropriate.

To give an example, a metal-insulator-semiconductor field effect transistor (MISFET) of a trench gate structure may be produced in the following way. A layered structure of n-p-n (or p-n-p) is adopted for the epitaxial layer 20; a recess 40 is formed in the epitaxial layer 20 using PEC etching; and a npn junction (or pnp junction) serving as the operation part for the transistor is formed on the side face 23 of the recess 40. An insulated gate electrode is formed in the recess 40 (see FIG. 22A), in addition to which a source electrode and a drain electrode to be electrically connected to the n layers of the npn layered structure (or the p layers of the pnp layered structure) are formed. With this production method, the PEC etching can be used to form a MIS interface, at which the npn junction (or pnp junction) serving as the operation part for a semiconductor device is located, while incurring little damage and the resultant interface having superior flatness; thus, a semiconductor device having high operation performance can be produced simply.

The electrode structure when producing a semiconductor device using the GaN material 100 may differ according to the electroconductive characteristics of the substrate 10. For example, the structure of an electrode to be electrically connected to an n-type GaN layer formed on the (front) surface of the substrate 10 may be as follows. For example, when producing a light-emitting diode (LED) using an n-type conductive substrate 10, the electrode may be formed on the rear surface of the substrate 10. Meanwhile, when, for example, producing a GaN-high electron mobility transistor (HEMT) using a semi-insulating substrate 10, the electrode will be formed on the n-type GaN layer, i.e. on the surface side of the substrate 10.

Application of the aforementioned PEC etching is not limited to semiconductor devices such as diodes or transistors, and more generally, this PEC etching may be used preferably as a method for producing structures in which GaN material is used. In addition to the aforementioned manners of usage, the PEC etching may also be used, for example, when dicing wafer that is formed from a GaN material or for the formation of a component of microelectro-mechanical systems (MEMS) in which GaN is used. This PEC etching may also be used to etch the entirety of the principal face of a GaN material.

As in the case where a recess having a bottom face or a protrusion is formed, both the bottom face and the side face formed using PEC etching may sometimes be exposed on the surface of the GaN material having been etched. Alternatively, as in the case where a GaN material is penetrated through (e.g. when a through-hole is formed or the GaN material is divided into segments), only the side face formed using PEC etching may be exposed on the surface of the GaN material having been etched. Further, as in the case where an entire face is etched, only the bottom face formed using PEC etching may be exposed on the surface of the GaN material having been etched.

When etching is carried out to penetrate through the GaN material, such as when a through-hole is formed or the GaN material is divided, the GaN material having been etched has an area in which the side face formed using the PEC etching is exposed throughout the entire thickness. This side face has a property and shape that are similar to what has been described in the fourth and fifth embodiments as a trace of PEC etching. When the entire face is etched, the GaN material having been etched has an area in which the bottom face formed using PEC etching is exposed entirely. This bottom face has a property and shape that are similar to what has been described in the fourth and fifth embodiments as a trace of PEC etching.

Figure 21:
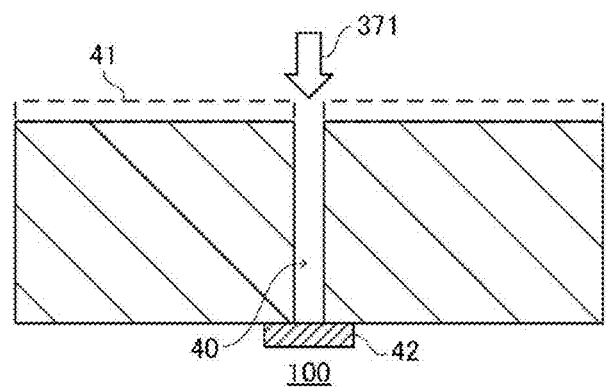
FIG. 21 is a schematic diagram illustrating an example of a situation where PEC etching is carried out to penetrate through a GaN material.

FIG. 21 is a schematic diagram illustrating an example of a situation where PEC etching is carried out to penetrate through a GaN material 100, such as when a through-hole is formed or the GaN material is divided. In a case like this, a seal member 42 may be provided on the bottom face and the side face of the GaN material 100 according to need, so that the electrolyte solution does not leak in the course of penetration.

The aforementioned embodiments illustrate examples of a case where PEC etching is carried out in the depth direction from the c face which has a large area and with which it is easy to form a plurality of structures, but illustrating such examples does not deprive the present invention of applications in which PEC etching is carried out in the depth direction from other crystal faces.

Figure 22A:
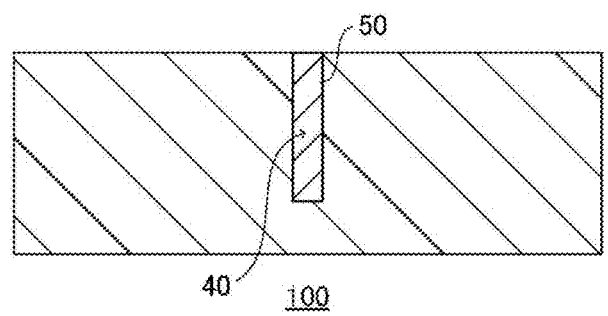
FIG. 22A is a schematic diagram illustrating an example of a situation where a filling member is loaded into a recess formed using PEC etching.
Figure 22B:
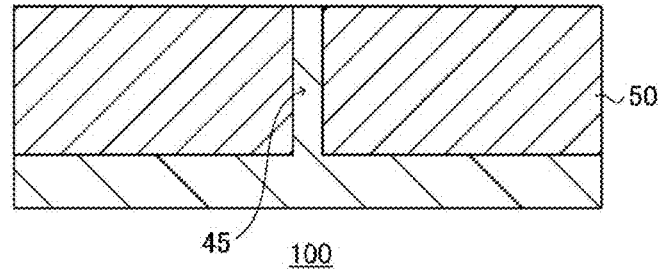
FIG. 22B is a schematic diagram illustrating an example of a situation where a filling member is loaded on the outside of a protrusion formed using PEC etching.

The structure produced using the PEC etching described above may be constituted by a combination of the GaN member having a structure formed using the PEC etching and another member. Note that the state in which a mask used in PEC etching is formed (remains) on a GaN member that has a structure formed using the PEC etching (see, for example, FIG. 18A) may be regarded as an intermediate structure used to obtain a final structure. When a certain member is loaded inside a recess formed using the aforementioned PEC etching and thus the recess is not exposed to the outer face of the structure, the structure includes the recess regardless. Likewise, even when a certain member is loaded on the outside of a protrusion formed using the aforementioned PEC etching and thus the protrusion is not exposed to the outer face of the structure, the structure includes the protrusion regardless. FIG. 22A is a schematic diagram illustrating an example of a situation where a filling member 50 is loaded into a recess 40 formed using PEC etching. FIG. 22B is a schematic diagram illustrating an example of a situation where a filling member 50 is loaded on the outside of a protrusion 45 formed using PEC etching.

The first experimental example described in the second embodiment indicates a finding that from the perspective of limiting excessive bubble generation, it is preferable to limit the (saturation) current density in the electrode-based PEC etching to no more than 3 mA/cm$^2$.

The seventh through ninth embodiments and the variations thereof describe electrodeless PEC etching. With the electrodeless PEC etching, no cathode electrode is required, so it is not necessary that the wafer 100 subject to etching be conductive over the entire thickness thereof. Accordingly, the wafer 100 may not be formed from GaN over the entire thickness thereof and it is sufficient if at least the surface (etching surface) of the wafer 100 is formed from GaN (more typically, a group III nitride). As such, the electrodeless PEC etching described in these embodiments and variations may be applied to etching of a GaN layer (more typically, a group III nitride layer) grown on a sapphire substrate, silicon carbide (SiC) substrate, silicon (Si) substrate, or other such substrates of a different species.

When forming a penetrating structure in the wafer 100 (formed from a material subject to PEC etching over the entire thickness thereof), it is more preferable to use the electrodeless PEC etching that does require a sealing structure.

The effect of enhancing etching uniformity in the PEC etching performed on the wafer 100 having a large diameter of, for example, two inches or more, as described in the seventh embodiment and the variations thereof, can be achieved not only for PEC etching of GaN but also PEC etching of other group III nitrides than GaN. This effect of enhancing etching uniformity can be achieved without being particularly limited by the dislocation density of the group III nitride layer subject to etching (even when the dislocation density is 1×10$^7$/cm$^2$ or higher, for example). In other words, the effect of enhancing etching uniformity can be achieved even when performing PEC etching on, for example, a group III nitride layer that is epitaxially grown on a substrate of a different species, e.g. sapphire substrate, and has a dislocation density of, e.g., 1×10$^8$/cm$^2$ or more.

The effect of limiting variation in etching conditions through removal of the bubble 130 or replenishment of the etching liquid 420, as described in the eighth and ninth embodiments and the variations thereof, can be achieved not only for PEC etching of GaN but also PEC etching of other group III nitrides than GaN.

Thus, the seventh through ninth embodiments and the variations thereof can be applied preferably in carrying out PEC etching on a wafer 100 at least having the surface thereof formed from a group III nitride crystal.

The group III element included in the group III nitride may be at least one from among aluminum (Al), Ga, and indium (In). UV light with a wavelength of shorter than 365 nm, for example, may be used for the UV light 431 radiated onto the wafer 100. Using PEC etching of GaN as a reference, when Al is included, UV light with a shorter wavelength may be used, and when In is included, light with a longer wavelength can be used. In other words, according to the composition of the group III nitride to be processed, appropriate light with a wavelength allowing the group III nitride to be PEC etched can be selected for use.

The concept of PEC etching in relation to the Al component or In component in the group III nitride is equivalent to the concept described with reference to (chem. 1) and (chem. 2) concerning the Ga component. That is, the PEC etching may be carried out by generating an oxide of Al or an oxide of In by UV light radiation and dissolving the oxide. As described above, the group III nitride subject to this PEC etching is not limited to GaN.

The seventh through ninth embodiments and the variations thereof illustrate manners in which a mask 41 having an opening for exposing the etching areas 111 and the like is formed on the wafer 100. By shaping (patterning) the irradiation cross-section of the UV light 431 into an irradiation cross-section with which only the etching areas 111 and the like are irradiated, theoretically it is possible to carry out maskless PEC etching. A DMD may be used for shaping the irradiation cross-section, for example. According to the requirements, the mask 41 used may be constituted by a mask that does not block light or a non-metal (non-conductive) mask.

The above description illustrates PEC etching in which an oxide of a group III element such as Ga$_2$O$_3$ is dissolved using an alkaline solution and presents a NaOH solution as an example of the alkaline solution, but the alkaline solution used in the PEC etching may also be a potassium hydroxide (KOH) solution, for example. Note that the PEC etching may also be performed by using an acidic solution to dissolve an oxide of a group III element. A phosphoric acid (H$_3$PO$_4$) solution is an example of the acidic solution that may be used for the PEC etching.

The etching liquid used for the electrodeless PEC etching may be an alkaline or acidic etching liquid that includes oxygen used for generating an oxide of the group III element included in the group III nitride to be etched and also includes an oxidizing agent that accepts electrons. Peroxodisulfate ion ($S_2O_8^{2-}$) is an example of such an oxidizing agent. Note that although the above example illustrates a manner in which $S_2O_8^{2-}$ is supplied from potassium peroxodisulfate ($K_2S_2O_8$), $S_2O_8^{2-}$ may also be supplied from other sources including sodium peroxodisulfate ($Na_2S_2O_8$) and ammonium peroxodisulfate (ammonium persulfate, $(NH_4)_2S_2O_8$).

<Preferable Aspects of the Present Invention>

Preferable aspects of the present invention will be supplementarily described hereafter.

(Supplementary Description 1)

A structure production method including a process of preparing a wafer having a diameter of two inches or more, at least a surface of the wafer being formed from a group III nitride crystal, a process of preparing an etching liquid in a container, a process of accommodating the wafer in the container in a condition in which the surface of the wafer is immersed in the etching liquid in a manner such that the surface of the wafer is parallel with a surface of the etching liquid, and a process of radiating light (with a wavelength of shorter than 365 nm) onto the surface of the wafer in a condition in which the wafer and the etching liquid are still, wherein a first etching area and a second etching area are defined on the surface of the wafer, the first and second etching areas being disposed at an interval from each other, the first and second etching areas being areas where the group III nitride crystal is to be etched due to the surface of the wafer being irradiated with the light in a condition in which the surface is immersed in the etching liquid, and in the process of radiating the light onto the surface of the wafer, the light is radiated perpendicularly onto each of a surface of the first etching area and a surface of the second etching area.

(Supplementary Description 2)

The structure production method according to Supplementary description 1, wherein in the process of radiating the light onto the surface of the wafer, parallel light forming the light is radiated onto the first etching area and the second etching area.

(Supplementary Description 3)

The structure production method according to Supplementary description 1 or 2, wherein in the process of radiating the light onto the surface of the wafer, parallel light forming the light and having an irradiation cross-section of a size encompassing the first and second etching areas on the surface of the wafer is radiated.

(Supplementary Description 4)

The structure production method according to any one of Supplementary descriptions 1 through 3, wherein in the process of radiating the light onto the surface of the wafer, the light having an identical irradiation intensity for the first etching area and the second etching area is radiated.

(Supplementary Description 5)

The structure production method according to any one of Supplementary descriptions 1 through 4, wherein in the process of radiating the light onto the surface of the wafer, the light is radiated in a manner such that cumulative irradiation energy in the first etching area and cumulative irradiation energy in the second etching area are identical.

(Supplementary Description 6)

The structure production method according to any one of Supplementary descriptions 1 through 5, wherein in the process of radiating the light onto the surface of the wafer, the light is radiated onto the first etching area and the second etching area simultaneously.

(Supplementary Description 7)

The structure production method according to Supplementary description 6, wherein in the process of radiating the light onto the surface of the wafer, the light having an irradiation cross-section of a size encompassing the first and second etching areas on the surface of the wafer is radiated, an irradiation intensity distribution in the irradiation cross-section being uniform.

(Supplementary Description 8)

The structure production method according to any one of Supplementary descriptions 1 through 5, wherein in the process of radiating the light onto the surface of the wafer, the light is radiated onto the first etching area and the second etching area asynchronously.

(Supplementary Description 9)

The structure production method according to Supplementary description 8, wherein in the process of radiating the light onto the surface of the wafer, an irradiation cross-section of the light is moved over the surface of the wafer.

(Supplementary Description 10)

The structure production method according to any one of Supplementary descriptions 1 through 9, wherein in the process of radiating the light onto the surface of the wafer, the light is radiated intermittently onto each of the first etching area and the second etching area.

(Supplementary Description 11)

The structure production method according to any one of Supplementary descriptions 1 through 10, wherein in the process of radiating the light onto the surface of the wafer, each of the first etching area and the second etching area is etched preferably to a depth of 8 μm or more, more preferably to a depth of 10 μm or more.

(Supplementary Description 12)

The structure production method according to any one of Supplementary descriptions 1 through 11, wherein a distance from the surface of the wafer to the surface of the etching liquid is preferably between 1 mm and 100 mm (inclusive), more preferably between 3 mm and 100 mm (inclusive), even more preferably between 5 mm and 100 mm (inclusive).

(Supplementary Description 13)

The structure production method according to any one of Supplementary descriptions 1 through 12, the method including a process of preparing another wafer having a diameter of two inches or more, at least a surface of the other wafer being formed from the group III nitride crystal, a process of accommodating the other wafer in the container in a condition in which a surface of the other wafer is immersed in the etching liquid in a manner such that the surface of the other wafer is parallel with the surface of the etching liquid and the distance from the surface of the wafer to the surface of the etching liquid and a distance from the surface of the other wafer to the surface of the etching liquid are identical, and a process of radiating the light onto the surface of the other wafer in a condition in which the other wafer and the etching liquid are still, wherein a third etching area and a fourth etching area are defined on the surface of the other wafer, the third and fourth etching areas being disposed at an interval from each other, the third and fourth etching areas being areas where the group III nitride crystal is to be etched due to the surface of the other wafer being irradiated with the light in a condition in which the surface is immersed in the etching liquid, and in the process of radiating the light onto the surface of the other wafer, the light is radiated perpendicularly onto each of a surface of the third etching area and a surface of the fourth etching area.
(Supplementary Description 14)

The structure production method according to Supplementary description 13, wherein in the process of radiating the light onto the surface of the wafer and in the process of radiating the light onto the surface of the other wafer, the light is radiated in a manner such that irradiation intensity or cumulative irradiation energy is identical in the first, second, third, and fourth etching areas.
(Supplementary Description 15)

The structure production method according to Supplementary description 13 or 14, wherein in the process of radiating the light onto the surface of the wafer and in the process of radiating the light onto the surface of the other wafer, the light having an irradiation cross-section of a size encompassing the first, second, third, and fourth etching areas is radiated, an irradiation intensity distribution in the irradiation cross-section being uniform.
(Supplementary Description 16)

The structure production method according to any one of Supplementary descriptions 1 through 15, wherein the method does not employ a cathode electrode immersed in the etching liquid while being connected to a wire extending to outside the etching liquid (does not employ a cathode electrode immersed in the etching liquid and a wire connected to the cathode electrode and extending to outside the etching liquid), and the etching liquid is an alkaline or acidic etching liquid containing an oxidizing agent that accepts an electron.

(The structure production method according to any one of Supplementary descriptions 1 through 15, wherein the etching liquid contains a hydroxide ion and a peroxodisulfate ion, and the group III nitride crystal forming the surface of the wafer is etched without using a cathode electrode immersed in the etching liquid.)
(Supplementary Description 17)

The structure production method according to any one of Supplementary descriptions 1 through 15, wherein the etching liquid contains a hydroxide ion, and the group III nitride crystal forming the surface of the wafer is etched using a cathode electrode immersed in the etching liquid.
(Supplementary Description 18)

The structure production method according to Supplementary description 16, wherein the group III nitride crystal forming the surface of the wafer is etched in a condition in which an etching voltage is applied between the cathode electrode and the group III nitride crystal.
(Supplementary Description 19)

The structure production method according to Supplementary description 18, wherein the group III nitride crystal forming the surface of the wafer includes GaN including an area in which dislocation density is less than $1 \times 10^7/cm^2$, and the etching voltage is preferably a voltage falling within a range of 0.16 V to 1.30 V (inclusive), more preferably a voltage falling within a range of 0.52 V to 1.15 V (inclusive).
(Supplementary Description 20)

The structure production method according to any one of Supplementary descriptions 1 through 19, wherein variation in irradiation intensity or irradiation energy of the light radiated onto the surface of the wafer in the process of radiating the light onto the surface of the wafer is limited on the basis of measurement of the irradiation intensity or irradiation energy of the light by an optical sensor.
(Supplementary Description 21)

The structure production method according to any one of Supplementary descriptions 1 through 20, wherein variation in temperature of the etching liquid in the process of radiating the light onto the surface of the wafer is limited on the basis of measurement of the temperature of the etching liquid by a temperature sensor.
(Supplementary Description 22)

The structure production method according to any one of Supplementary descriptions 1 through 21, wherein the method includes a process of removing (detaching) a bubble, which is generated due to the etching of the group III nitride crystal and which adheres to the wafer, from the wafer.
(Supplementary Description 23)

The structure production method according to Supplementary description 22, wherein in the process of removing the bubble from the wafer, the bubble is removed by imparting vibration to the bubble.
(Supplementary Description 24)

The structure production method according to Supplementary description 22 or 23, wherein in the process of removing the bubble from the wafer, the bubble is removed by generating a flow of the etching liquid.
(Supplementary Description 25)

A structure production apparatus including a container configured to accommodate a wafer and an etching liquid, the wafer having a diameter of two inches or more, at least a surface of the wafer being formed from a group III nitride crystal, and a light irradiation device configured to radiate light (with a wavelength of shorter than 365 nm) onto the surface of the wafer, wherein the container accommodates the wafer inside the container in a condition in which the surface of the wafer is immersed in the etching liquid in a manner such that the surface of the wafer is parallel with a surface of the etching liquid, and retains the wafer and the etching liquid in a condition in which the wafer and the etching liquid are still, and the light irradiation device radiates the light perpendicularly onto a surface of each of a first etching area and a second etching area, the first and second etching areas being defined on the surface of the wafer, the first and second etching areas being disposed at an interval from each other, the first and second etching areas being areas where the group III nitride crystal is to be etched due to the surface of the wafer being irradiated with the light in a condition in which the surface is immersed in the etching liquid.
(Supplementary Description 26)

The structure production apparatus according to Supplementary description 25, wherein the light irradiation device radiates the light in the form of parallel light onto the first etching area and the second etching area.
(Supplementary Description 27)

The structure production apparatus according to Supplementary description 25 or 26, wherein the light irradiation device radiates parallel light having an irradiation cross-section of a size encompassing the first and second etching areas on the surface of the wafer.
(Supplementary Description 28)

The structure production apparatus according to any one of Supplementary descriptions 25 through 27, wherein the light irradiation device radiates the light having an identical irradiation intensity for the first etching area and the second etching area.

(Supplementary Description 29)

The structure production apparatus according to any one of Supplementary descriptions 25 through 28, wherein the light irradiation device radiates the light in a manner such that cumulative irradiation energy in the first etching area and cumulative irradiation energy in the second etching area are identical.

(Supplementary Description 30)

The structure production apparatus according to any one of Supplementary descriptions 25 through 29, wherein the light irradiation device radiates the light onto the first etching area and the second etching area simultaneously.

(Supplementary Description 31)

The structure production apparatus according to Supplementary description 30, wherein the light irradiation device radiates the light having an irradiation cross-section of a size encompassing the first and second etching areas on the surface of the wafer, an irradiation intensity distribution in the irradiation cross-section being uniform.

(Supplementary Description 32)

The structure production apparatus according to any one of Supplementary descriptions 25 through 29, wherein the light irradiation device radiates the light onto the first etching area and the second etching area asynchronously.

(Supplementary Description 33)

The structure production method according to Supplementary description 32, wherein the light irradiation device moves the irradiation cross-section of the light over the surface of the wafer.

(Supplementary Description 34)

The structure production apparatus according to any one of Supplementary descriptions 25 through 33, wherein the light irradiation device radiates the light intermittently onto each of the first etching area and the second etching area.

(Supplementary Description 35)

The structure production apparatus according to any one of Supplementary descriptions 25 through 34, wherein the light irradiation device includes at least one from among an ultraviolet light emitting diode, an ultraviolet laser, and an ultraviolet lamp as a light source that emits the light.

(Supplementary Description 36)

The structure production method according to any one of Supplementary descriptions 25 through 35, wherein the container accommodates the wafer and the etching liquid in a condition in which a distance from the surface of the wafer to the surface of the etching liquid is preferably between 1 mm and 100 mm (inclusive), more preferably between 3 mm and 100 mm (inclusive), even more preferably between 5 mm and 100 mm (inclusive).

(Supplementary Description 37)

The structure production apparatus according to any one of Supplementary descriptions 25 through 36, wherein the container accommodates, together with the wafer and the etching liquid, another wafer having a diameter of two inches or more, at least a surface of the other wafer being formed from the group III nitride crystal, the container accommodates the other wafer inside the container and retains the other wafer and the etching liquid in a condition in which the other wafer and the etching liquid are still and the surface of the other wafer is immersed in the etching liquid in a manner such that the surface of the other wafer is parallel with the surface of the etching liquid and the distance from the surface of the wafer to the surface of the etching liquid and the distance from the surface of the other wafer to the surface of the etching liquid are identical, and the light irradiation device radiates the light perpendicularly onto a surface of each of a third etching area and a fourth etching area, the third and fourth etching areas being defined on the surface of the other wafer, the third and fourth etching areas being disposed at an interval from each other, the third and fourth etching areas being areas where the group III nitride crystal is to be etched due to the surface of the other wafer being irradiated with the light in a condition in which the surface is immersed in the etching liquid.

(Supplementary Description 38)

The structure production apparatus according to Supplementary description 37, wherein the light irradiation device radiates the light in a manner such that irradiation intensity or cumulative irradiation energy is identical in the first, second, third, and fourth etching areas.

(Supplementary Description 39)

The structure production apparatus according to Supplementary description 37 or 38, wherein the light irradiation device radiates the light having an irradiation cross-section of a size encompassing the first, second, third, and fourth etching areas, an irradiation intensity distribution in the irradiation cross-section being uniform.

(Supplementary Description 40)

The structure production apparatus according to any one of Supplementary descriptions 25 through 39, wherein the apparatus does not include a cathode electrode immersed in the etching liquid while being connected to a wire extending to outside the etching liquid (does not include a cathode electrode immersed in the etching liquid and a wire connected to the cathode electrode and extending to outside the etching liquid). (Preferably, the etching liquid used is an alkaline or acidic etching liquid containing an oxidizing agent that accepts an electron.)

(Supplementary Description 41)

The structure production apparatus according to any one of Supplementary descriptions 25 through 40, wherein the apparatus includes a cathode electrode immersed in the etching liquid, a wire configured to electrically connect the cathode electrode and the group III nitride crystal forming the surface of the wafer, and a voltage source configured to apply an etching voltage between the cathode electrode and the group III nitride crystal forming the surface of the wafer, and the voltage source applies, as the etching voltage, preferably a voltage falling within a range of 0.16 V to 1.30 V (inclusive), more preferably a voltage falling within a range of 0.52 V to 1.15 V (inclusive).

(Supplementary Description 42)

The structure production apparatus according to any one of Supplementary descriptions 25 through 41, wherein the apparatus includes an optical sensor, and the light irradiation device limits variation in irradiation intensity or irradiation energy of the light radiated onto the surface of the wafer on the basis of measurement of the irradiation intensity or irradiation energy of the light by the optical sensor.

(Supplementary Description 43)

The structure production apparatus according to any one of Supplementary descriptions 25 through 42, wherein the apparatus includes a temperature sensor and a temperature adjuster, and the temperature adjuster limits variation in temperature of the etching liquid on the basis of measurement of the temperature of the etching liquid by the temperature sensor.
(Supplementary Description 44)

The structure production apparatus according to any one of Supplementary descriptions 25 through 43, wherein the apparatus includes a bubble removal device configured to remove (detach) a bubble, which is generated due to the etching of the group III nitride crystal and which adheres to the wafer, from the wafer.
(Supplementary Description 45)

The structure production apparatus according to Supplementary description 44, wherein the bubble removal device removes the bubble by imparting vibration to the bubble.
(Supplementary Description 46)

The structure production method according to Supplementary description 44 or 45, wherein the bubble removal device removes the bubble by generating a flow of the etching liquid.
(Supplementary Description 47)

A structure production method including
a process of preparing a wafer having a diameter of two inches or more, at least a surface of the wafer being formed from a group III nitride crystal,
a process of preparing an alkaline or acidic etching liquid in a container, the etching liquid containing a peroxodisulfate ion as an oxidizing agent that accepts an electron,
a process of accommodating the wafer in the container in a condition in which the surface of the wafer is immersed in the etching liquid in a manner such that the surface of the wafer is parallel with a surface of the etching liquid, and
a process of radiating light from the surface side of the etching liquid onto the surface of the wafer in a condition in which the wafer and the etching liquid are still, i.e. without agitating the etching liquid,
wherein
a first etching area and a second etching area are defined on the surface of the wafer, the first and second etching areas being disposed at an interval from each other, the first and second etching areas being areas where the group III nitride crystal is to be etched due to the surface of the wafer being irradiated with the light in a condition in which the surface is immersed in the etching liquid, and
in the process of radiating the light onto the surface of the wafer, the light is radiated perpendicularly onto each of a surface of the first etching area and a surface of the second etching area. The structure production method may encompass any of the configurations set forth in Supplementary descriptions 2 through 16, for example.
(Supplementary Description 48)

The structure production method according to Supplementary description 47, wherein a sulfate ion radical generated as a result of the light being radiated on the peroxodisulfate ion is supplied to the first and second etching areas by diffusion.
(Supplementary Description 49)

The structure production method according to Supplementary description 47 or 48, wherein
in the process of radiating the light onto the surface of the wafer, the light is radiated intermittently onto each of the first etching area and the second etching area, and
within the intermittent radiation of the light,
generating, in a radiation period in which the light is radiated, an oxide of a group III element included in the group III nitride crystal, and
dissolving the entire thickness of the oxide in a non-radiation period in which the light is not radiated
are repeated alternately.
(Supplementary Description 50)

The structure production method according to Supplementary description 49, wherein in the non-radiation period, an electron accumulated on the wafer in the radiation period is consumed by nonradiative recombination.
(Supplementary Description 51)

A structure production apparatus including
a container configured to accommodate a wafer and an alkaline or acidic etching liquid, the wafer having a diameter of two inches or more, at least a surface of the wafer being formed from a group III nitride crystal, the etching liquid containing a peroxodisulfate ion as an oxidizing agent that accepts an electron, and
a light irradiation device configured to radiate light from a surface side of the etching liquid onto the surface of the wafer,
wherein
the container accommodates the wafer inside the container in a condition in which the surface of the wafer is immersed in the etching liquid in a manner such that the surface of the wafer is parallel with the surface of the etching liquid, and retains the etching liquid in a manner such that the light is radiated onto the surface of the wafer in a condition in which the wafer and the etching liquid are still, i.e. in a condition in which the etching liquid is not agitated, and
the light irradiation device radiates the light perpendicularly onto a surface of each of a first etching area and a second etching area, the first and second etching areas being defined on the surface of the wafer, the first and second etching areas being disposed at an interval from each other, the first and second etching areas being areas where the group III nitride crystal is to be etched due to the surface of the wafer being irradiated with the light in a condition in which the surface is immersed in the etching liquid. The structure production apparatus may encompass any of the configurations set forth in Supplementary descriptions 26 through 40, for example.
(Supplementary Description 52)

The structure production apparatus according to Supplementary description 51, wherein a sulfate ion radical generated as a result of the light being radiated on the peroxodisulfate ion is supplied to the first and second etching areas by diffusion.
(Supplementary Description 53)

The structure production apparatus according to Supplementary description 51 or 52, wherein the light irradiation device radiates the light intermittently onto each of the first etching area and the second etching area, and
within the intermittent radiation of the light,
generating, in a radiation period in which the light is radiated, an oxide of a group III element included in the group III nitride crystal, and
dissolving the entire thickness of the oxide in a non-radiation period in which the light is not radiated
are repeated alternately.
(Supplementary Description 54)

The structure production apparatus according to Supplementary description 53, wherein in the non-radiation period, an electron accumulated on the wafer in the radiation period is consumed by nonradiative recombination.

DESCRIPTION OF REFERENCE SYMBOLS

1: underlying substrate
2: underlying layer

2a: void-including layer
3: metal layer
3a: nanomask
4: void-formed substrate
5: void
6: crystal
10: GaN substrate
20: GaN layer (epitaxial layer)
21n: GaN layer to which n-type impurities have been added
21p: GaN layer to which p-type impurities have been added
22: area subject to etching
23: side face
23pn: pn junction
30: epitaxial substrate
40: recess
41: mask
42: seal member
45: protrusion
50: filling member
100: GaN material (wafer)
100s: surface (etching face) of wafer
111, 112, 113: etching area
121, 122, 123: recess
130: bubble
6s, 10s, 20s: principal face
200: HVPE device
300: electrochemical cell
310: container
320: electrolyte solution
330: cathode electrode
340: anode electrode
350: wire
360: voltage source
370: light source
371: UV light
380: pump
400: PEC etching apparatus (structure production apparatus)
410: container
411: support
412: visible light transmission window
416: UV light transmission window
417: upstream opening
418: downstream opening
420: etching liquid
420s: surface of etching liquid
421: flow
430: light irradiation device
431: UV light
440: control device
450: vibration generator
460: pump
461: tank
470: optical sensor
480: temperature sensor
481: temperature adjuster
490: bubble sensor
491: dichroic mirror
492: visible light
493: illumination device
500: pump
501: tank
502: external flow path
510: upstream valve
511: downstream valve
520: flow measurement bubble emission device
521: flow sensor
522: bubble

The invention claimed is:

1. A structure production method, comprising:
preparing a wafer at least whose surface is composed of group III nitride crystals and having a non-conductive mask formed on the surface;
preparing an alkaline or acidic etching liquid containing a peroxodisulfate ion as an oxidizing agent that accepts an electron; and
irradiating the surface of the wafer with light, in a state where the surface of the wafer is immersed in the etching liquid heated so as to generate sulfate ion radicals, wherein in the irradiation of the light, the surface of the wafer is intermittently irradiated with the light.

2. A structure production method, comprising:
preparing a wafer at least whose surface is composed of group III nitride crystals and having no mask formed on the surface;
preparing an alkaline or acidic etching liquid containing a peroxodisulfate ion as an oxidizing agent that accepts an electron; and
selectively irradiating an etching area on the surface of the wafer with light, in a state where the surface of the wafer is immersed in the etching liquid heated so as to generate sulfate ion radicals.

3. The structure production method according to claim 2, wherein in the irradiation of the light, an irradiation cross section of the light on the surface of the wafer is scanned.

4. A structure production apparatus, comprising:
a container that holds a wafer at least whose surface is composed of group III nitride crystals and an alkaline or acidic etching liquid containing a peroxodisulfate ion as an oxidizing agent that accepts an electron;
a temperature controller that can heat the etching liquid; and
a light irradiation device that irradiates the surface of the wafer with light, the wafer being held in the container, wherein the container holds the wafer in a state where the surface of the wafer is immersed in the etching liquid heated so as to generate sulfate ion radicals, and
the light irradiation device selectively irradiates an etching area on the surface of the wafer with the light.

5. The structure production apparatus according to claim 4, wherein the light irradiation device scans an irradiation cross section of the light on the surface of the wafer.

* * * * *